(12) United States Patent
Lanni

(10) Patent No.: US 7,450,403 B2
(45) Date of Patent: *Nov. 11, 2008

(54) SWITCHING POWER SUPPLY UTILIZING SWITCH-SELECTABLE RESISTORS TO DETERMINE OUTPUT VOLTAGE

(75) Inventor: Thomas W. Lanni, Laguna Niguel, CA (US)

(73) Assignee: Comarco Wireless Technologies, Inc., Lake Forest, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/891,187

(22) Filed: Aug. 9, 2007

(65) Prior Publication Data

US 2007/0279952 A1  Dec. 6, 2007

Related U.S. Application Data

(60) Continuation of application No. 11/403,046, filed on Apr. 12, 2006, which is a continuation of application No. 11/154,199, filed on Jun. 16, 2005, now Pat. No. 7,145,787, which is a continuation of application No. 10/927,566, filed on Aug. 26, 2004, now Pat. No. 6,922,347, which is a division of application No. 10/313,793, filed on Dec. 5, 2002, now Pat. No. 6,809, 943, which is a continuation of application No. 10/140, 513, filed on May 7, 2002, now Pat. No. 6,693,413, which is a continuation of application No. 09/694,972, filed on Oct. 24, 2000, now abandoned, which is a continuation-in-part of application No. 09/310,461, filed on May 12, 1999, now Pat. No. 6,172,884, which is a continuation-in-part of application No. 09/213, 018, filed on Dec. 16, 1998, now Pat. No. 5,949,213, which is a continuation-in-part of application No. 09/148,811, filed on Sep. 4, 1998, now Pat. No. 6,091, 611, which is a continuation of application No. 08/994, 905, filed on Dec. 19, 1997, now Pat. No. 5,838,554, which is a continuation-in-part of application No. 08/767,307, filed on Dec. 16, 1996, now abandoned, which is a continuation-in-part of application No. 08/567,369, filed on Dec. 4, 1995, now Pat. No. 5,636, 110, and a continuation-in-part of application No. 08/233,121, filed on Apr. 26, 1994, now Pat. No. 5,479, 331.

(60) Provisional application No. 60/002,488, filed on Aug. 17, 1995.

(51) Int. Cl.
H02M 3/335  (2006.01)

(52) U.S. Cl. ........................................ 363/21.01; 363/80

(58) Field of Classification Search .................. 363/17, 363/20, 21, 24, 25, 28, 79, 80, 97, 98, 132, 363/21.01
See application file for complete search history.

(56) References Cited

U.S. PATENT DOCUMENTS

D339,103 S  9/1893  Dickey
(Continued)

OTHER PUBLICATIONS

Press Release of Empire Engineering, Electronic Design and Management, Jul. 5, 1995—San Luis Obispo CA USA, pp. 1-2.
(Continued)

Primary Examiner—Adolf Berhane
(74) Attorney, Agent, or Firm—Pillsbury Winthrop Shaw Pittman LLP

(57) ABSTRACT

A switching power supply includes a source of DC voltage and a transformer having primary and secondary windings. A switching circuit is coupled between the DC voltage and the primary winding to provide alternating current to the primary winding. A rectifier circuit is coupled to the secondary winding to provide a DC output voltage. A controller circuit controls the switching circuit to modulate the alternating current provided to the primary winding. A circuit receives a first input signal having a magnitude which is determined by the DC output voltage and a second input signal having a magnitude which is determined by a selected position of a multi-position switch. An output of the circuit generates a feedback signal which is coupled to the controller circuit.

21 Claims, 41 Drawing Sheets

U.S. PATENT DOCUMENTS

| | | | |
|---|---|---|---|
| D359,474 S | 6/1895 | Palatov | |
| D375,936 S | 11/1896 | Palatov | |
| D391,227 S | 2/1898 | Dickey | |
| 3,048,805 A | 8/1962 | Berni | |
| 3,049,687 A | 8/1962 | Berni | |
| 3,111,641 A | 11/1963 | Wilentchik | |
| 3,275,855 A | 9/1966 | Wright | |
| 3,484,864 A | 12/1969 | Bernstein et al. | |
| 3,659,188 A | 4/1972 | Alexander et al. | |
| 4,021,933 A | 5/1977 | Hughes | |
| 4,083,246 A | 4/1978 | Marsh | |
| 4,116,524 A | 9/1978 | DeNigris et al. | |
| 4,220,834 A | 9/1980 | Holce et al. | |
| 4,257,089 A | 3/1981 | Ravis | |
| 4,297,623 A | 10/1981 | Dupont | |
| 4,307,441 A | 12/1981 | Bello | |
| 4,442,382 A | 4/1984 | Fleck | |
| 4,569,009 A | 2/1986 | Genuit | |
| 4,622,627 A | 11/1986 | Rodriguez et al. | |
| 4,709,160 A | 11/1987 | Kinoshita | |
| 4,713,601 A | 12/1987 | Zahm et al. | |
| 4,734,839 A | 3/1988 | Barthold | |
| 4,747,034 A | 5/1988 | Dickey | |
| 4,829,224 A | 5/1989 | Gandelman et al. | |
| 4,885,674 A | 12/1989 | Varga et al. | |
| 4,890,214 A | 12/1989 | Yamamoto | |
| 4,900,885 A | 2/1990 | Inumada | |
| 4,912,392 A | 3/1990 | Faulkner | |
| 4,924,067 A | 5/1990 | Wilhelmson | |
| 4,963,802 A | 10/1990 | Gross et al. | |
| 4,990,099 A | 2/1991 | Marin et al. | |
| 4,997,393 A | 3/1991 | Armando | |
| 5,006,695 A | 4/1991 | Elliott | |
| 5,007,863 A | 4/1991 | Xuan | |
| 5,019,954 A | 5/1991 | Bourgeault et al. | |
| 5,084,666 A | 1/1992 | Bolash | |
| 5,089,768 A | 2/1992 | Sato | |
| 5,127,844 A | 7/1992 | Léman et al. | |
| 5,146,394 A | 9/1992 | Ishii et al. | |
| 5,170,067 A | 12/1992 | Baum et al. | |
| 5,177,431 A | 1/1993 | Smith et al. | 323/349 |
| 5,177,675 A | 1/1993 | Archer | |
| 5,184,291 A | 2/1993 | Crowe et al. | |
| 5,295,058 A | 3/1994 | McGreevy | |
| 5,309,348 A | 5/1994 | Leu | |
| 5,326,283 A | 7/1994 | Chen | |
| 5,333,177 A | 7/1994 | Braitberg et al. | |
| 5,347,211 A | 9/1994 | Jakubowski | |
| 5,449,302 A | 9/1995 | Yarbrough et al. | |
| 5,453,921 A * | 9/1995 | Shutts | 363/21.18 |
| 5,479,331 A | 12/1995 | Lenni | |
| 5,510,691 A | 4/1996 | Palatov | |
| 5,570,002 A | 10/1996 | Castleman | |
| 5,592,030 A * | 1/1997 | Adahan | 307/80 |
| 5,636,110 A | 6/1997 | Lanni | |
| 5,648,712 A | 7/1997 | Hahn | |
| 5,672,951 A | 9/1997 | Shiota | |
| 5,714,805 A | 2/1998 | Lobaugh | |
| 5,733,674 A | 3/1998 | Law et al. | |
| 5,739,672 A | 4/1998 | Lane | |
| 5,739,673 A | 4/1998 | Le Van Suu | |
| 5,770,895 A | 6/1998 | Kumasaka | |
| 5,773,961 A | 6/1998 | Cameron et al. | |
| 5,838,554 A | 11/1998 | Lanni | |
| 5,847,541 A | 12/1998 | Hahn | |
| 5,861,732 A | 1/1999 | Takimoto et al. | |
| 5,886,422 A | 3/1999 | Mills | |
| 5,929,597 A | 7/1999 | Pfeifer et al. | |
| 5,949,213 A | 9/1999 | Lanni | |
| 5,977,747 A | 11/1999 | Huang | |
| 6,064,177 A | 5/2000 | Dixon | |
| 6,080,022 A | 6/2000 | Shaberman | |
| 6,091,611 A | 7/2000 | Lanni | |
| 6,172,884 B1 | 1/2001 | Lanni | |
| 6,194,875 B1 | 2/2001 | Takimoto et al. | |
| 6,382,842 B1 | 5/2002 | Arima et al. | |
| 6,670,797 B2 | 12/2003 | Johanning | |
| 6,678,178 B2 | 1/2004 | Lipcsei | |

OTHER PUBLICATIONS

Description of the "Smart Adapter System", Nesco Battery Systems, pp. 1-2.

MacWorld "On the Road", vol. 12, No. 7, Jul. 1995, pp. 141-142, 5/9/1 (item 1 from file: 15) Dialog(r) File 15:ABI/INFORM(r).

Data Sheet for Benchmarq Model BQ2002C, Fast-Charge IC, Sep. 1997, 8 pages.

Data Sheet Benchmarq Model BQ2954, Lithium Ion Fast-Charge IC, Nov. 1997, 14 pages.

"Portable Computers Fly High in the Sky with Airline Seat Power," [on-line], Nov. 18, 1996 [retrieved Feb. 13, 2001], pp. 1-2, retrieved from Internet: http://www.roadwarrior.com/xtend/news/pressreleases/pr-961118.html.

"New PowerXtenders Adapter Lets Portable Computer Users Plug Into Computer Power On Airplanes and Cars,"[on-line], Apr. 30, 1997, [retrieved Feb. 13, 2001], pp.1-3, retrieved from Internet: http://www.roadwarrior.com/xtend/news/pressreleases/pr-970420.html.

Declaration of Ejaz Afzal in Opposition to Comarco's Motion for Preliminary Injunction, dated Apr. 30, 2003, 9-pgs w/Exhibits 1-2 attached.

Declaration of Ejaz Afzal in Support of Mobility Electronics, Inc.'s Motion for Summary Judgement, dated May 6, 2003, 10-pgs w/Exhibits 1-2 attached.

Declaration of David Dickey in Support of Mobility Electronics, Inc's Motion for Summary Judgment, dated Jun. 2, 2003, 8-pgs w/Exhibits 1-13 attached.

Declaration of David Dickey in Opposition to Comarco's Motion for Preliminary Injunction, , dated Jun. 2, 2003,8-pgs w/Exhibits 1-13 attached.

IEEE Systems Readiness Technology Conference, Test Technology for the New Millenium, IEEE Catalog No. 99CH36323, Aug. 30-Sep. 2, 1999.

Instruction Manual for LNS-W Power Supply Series, Lamba Electronics Inc.

Comarco Wireless Technologies Power Products AC Adapter/Charger Program & Specification (5 pages, 5th page dated Aug. 16, 1994.

Confidential Technical/Cost Proposal re: AC Power Adapter Prepared for IBM Corporation (19 pages, 6th dated Dec. 13, 1994.

Empire Engineering Confidential Disclosure Statement re: Universal Programmable DC Power Adapter dated Jan. 17, 1995) (3 pages).

Minwa Products, "MW182", Minwa Products Catalog, 1993.

"Super Selection of Power Adapters", *Radio Shack Catalog*, p.128, Dec. 1992.

Nesco Battery Systems, SmartAdapter=Model SA6-V21/30, 6 to 21 Volt DC Universal Adjustable DC Power Adapter Owner's Manual, 1999 (17 pages).

Xtend Mico Products, Inc., 50W DC Adapter Specification, Revision 1.01, (5 pages).

Xtend Micro Products, Inc., Assembly Drawing for Xtend Cable, Output DC Adapter, Rev. C, (3 pages).

Delta Air Lines, Letter to Mr. Mark Rappaport, President, Xtend Micro Products, Inc., (1 page).

Xtend Micro Products, Inc., Invoice for 50 Watt DC Adapter to Ingram Micro, (1 page).

\* cited by examiner

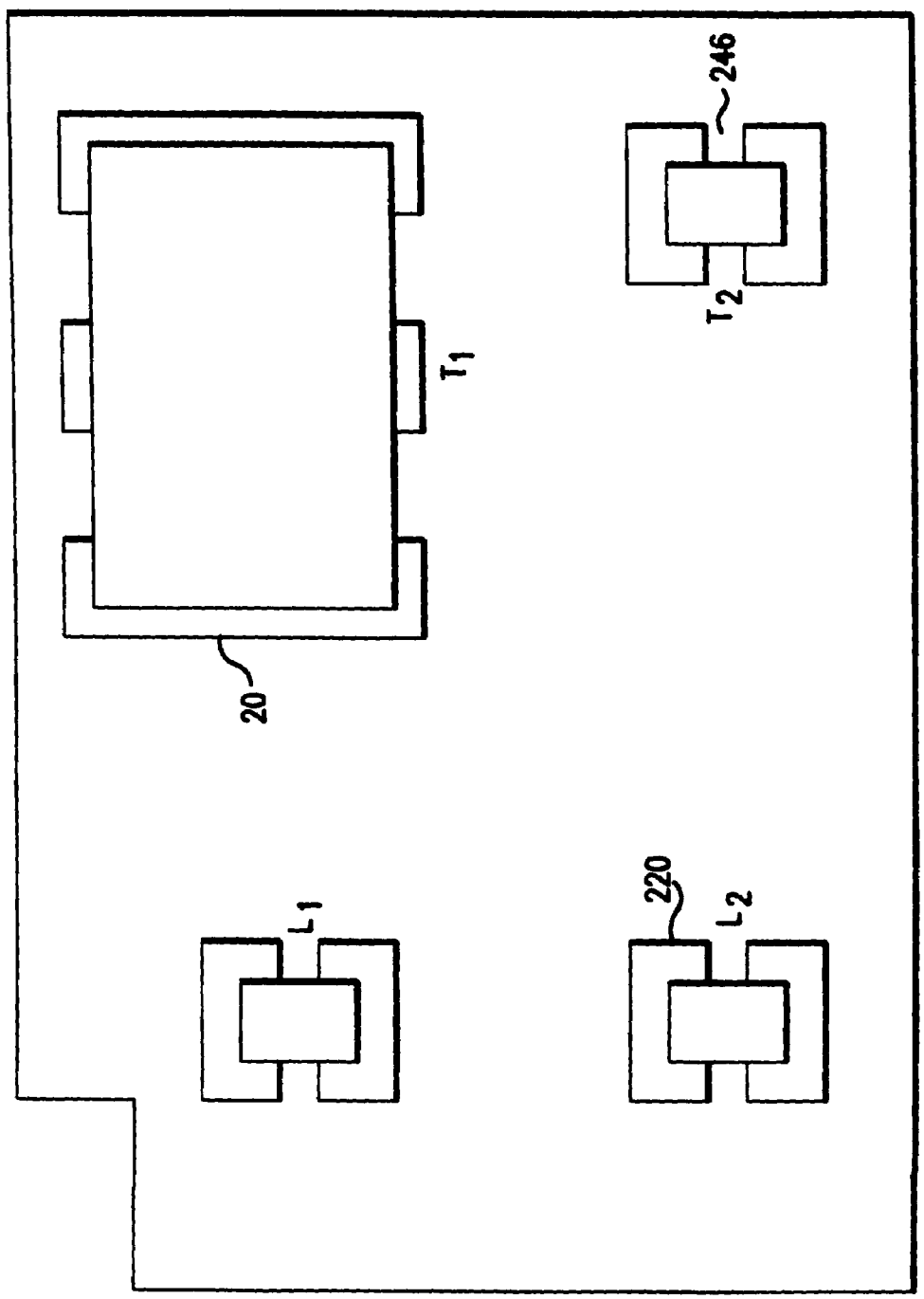

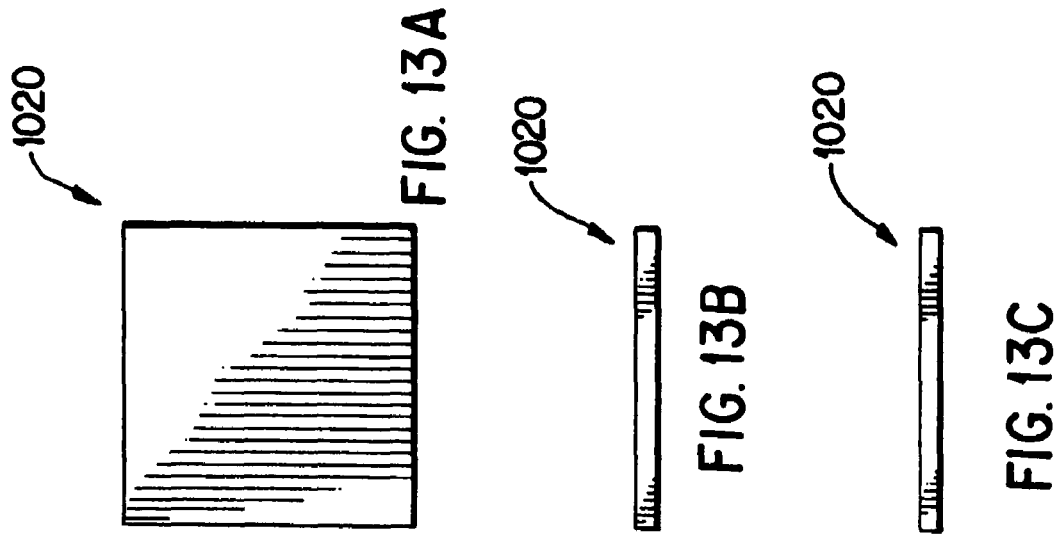
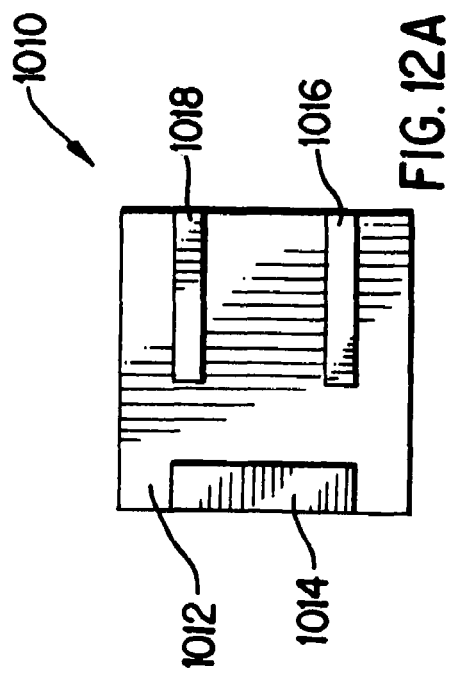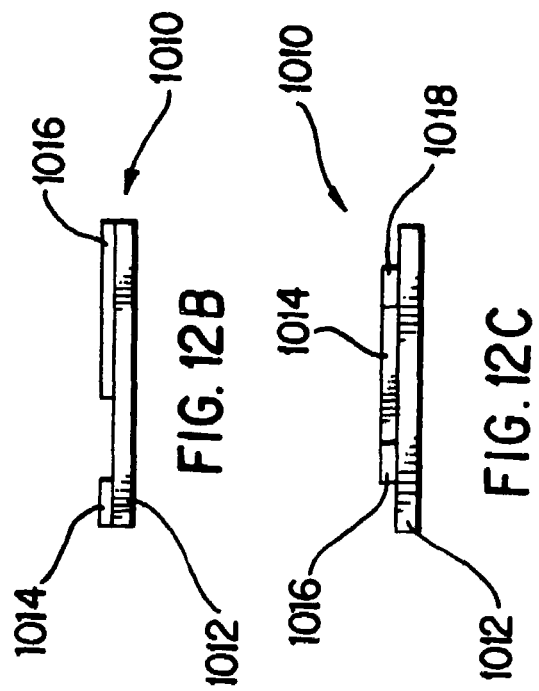

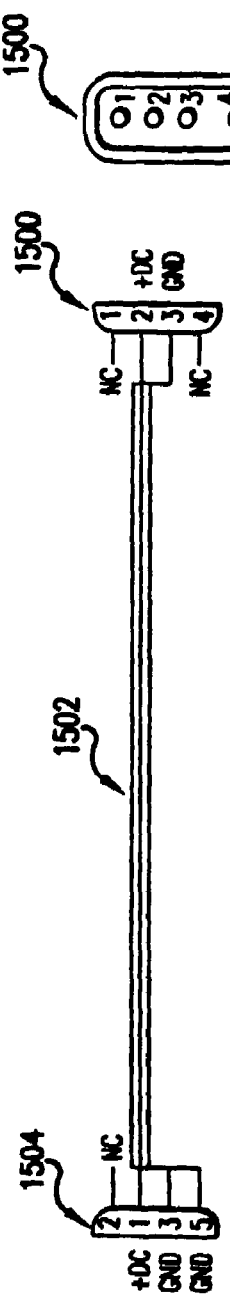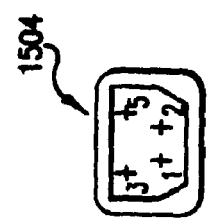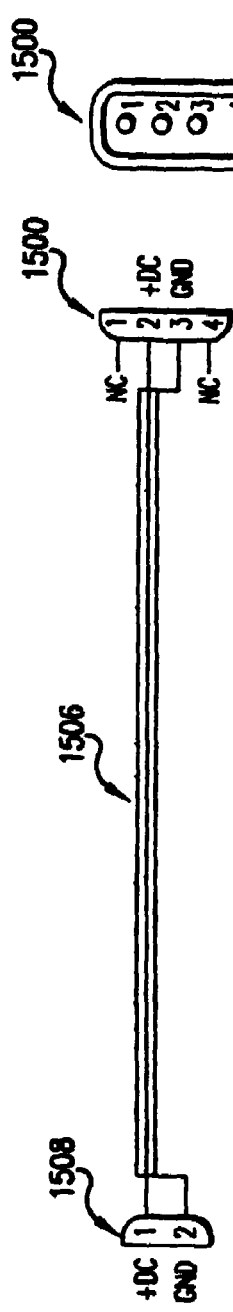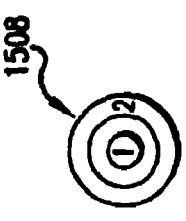

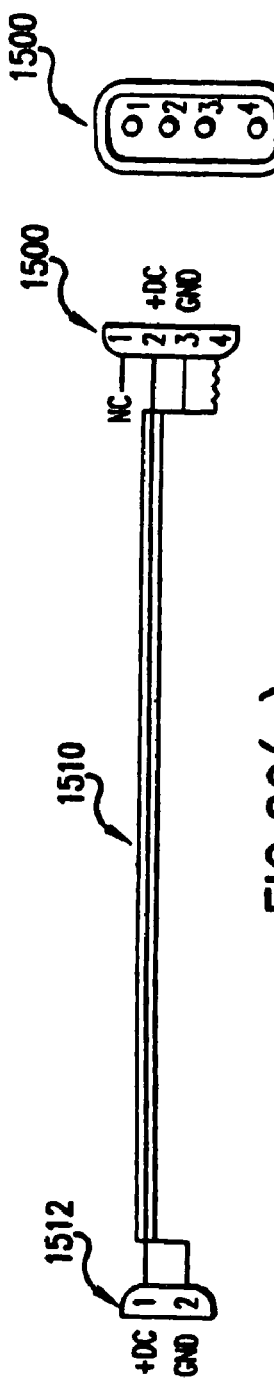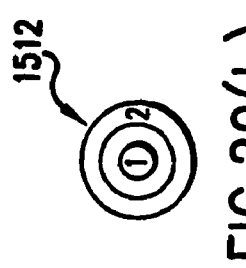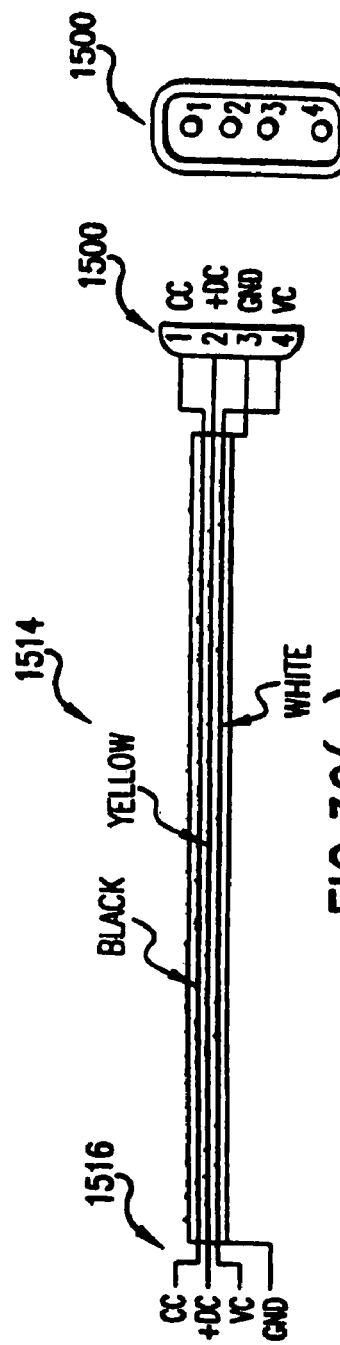
FIG.29(a)
FIG.29(b)
FIG.29(c)
FIG.30(a)
FIG.30(b)

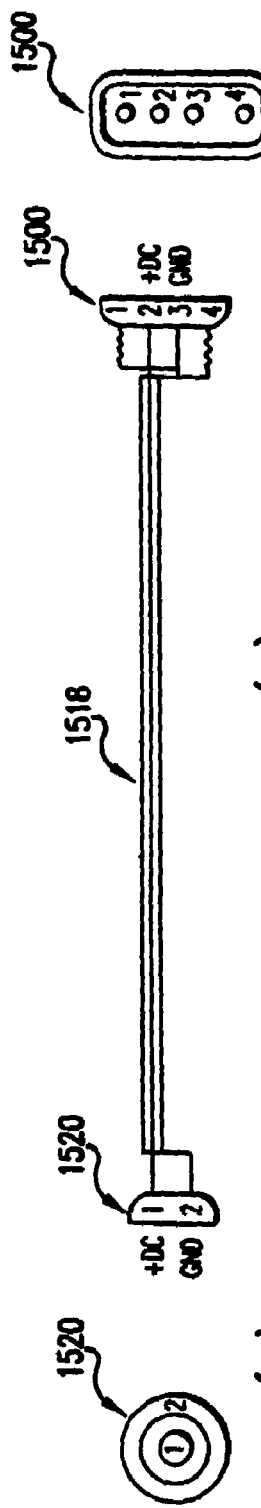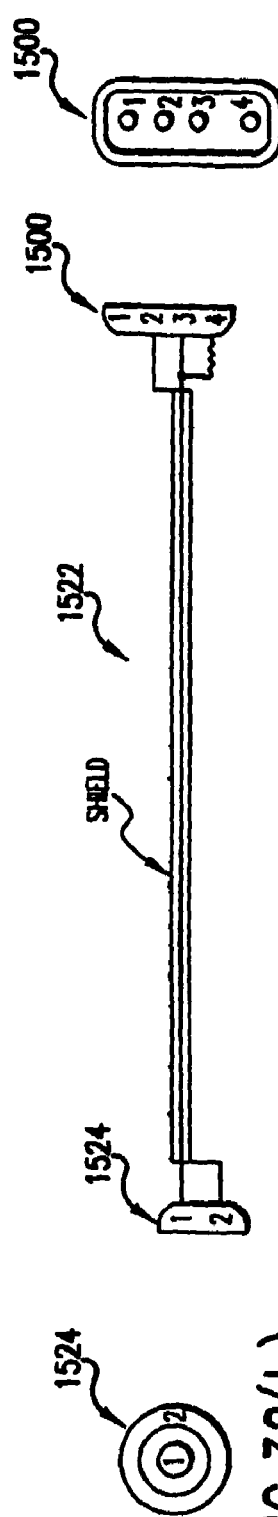

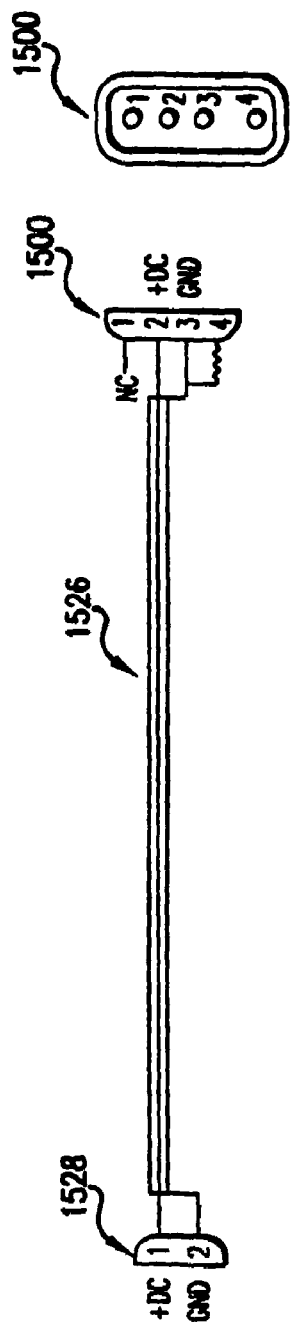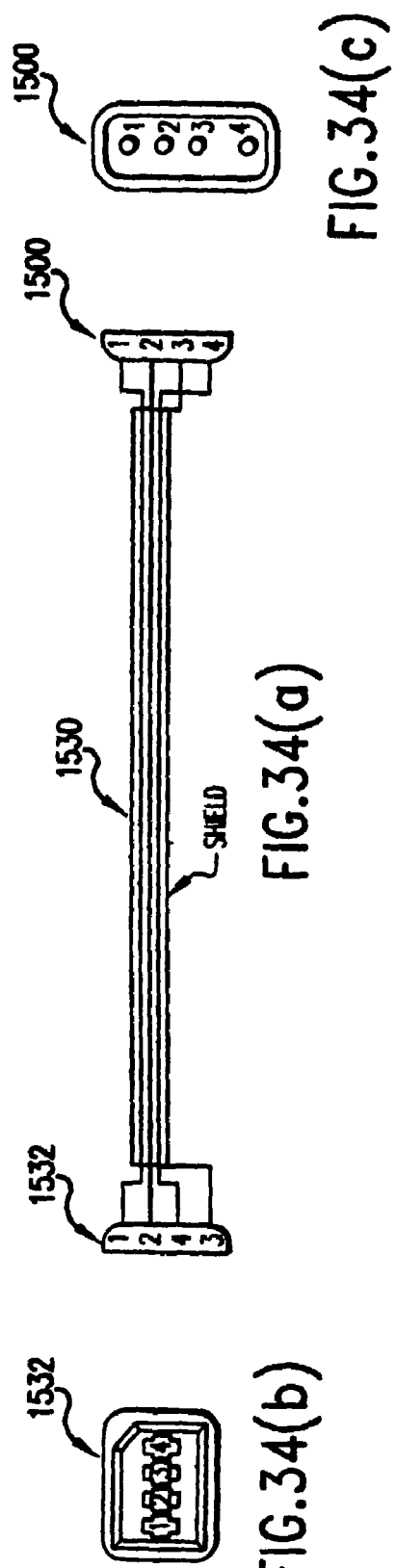

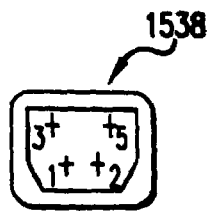
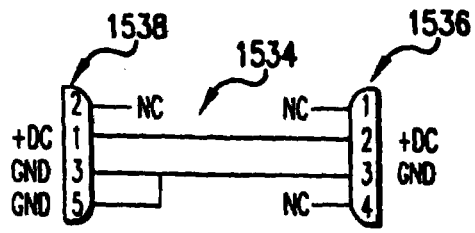
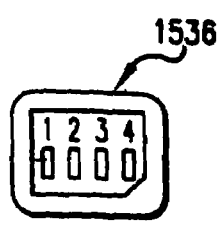
FIG.35(b)   FIG.35(a)   FIG.35(c)
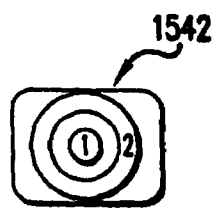
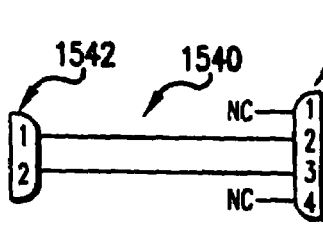
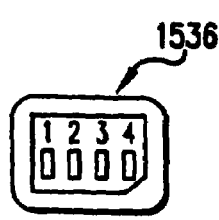
FIG.36(b)   FIG.36(a)   FIG.36(c)
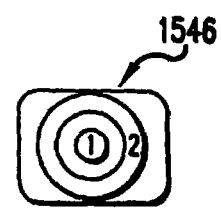
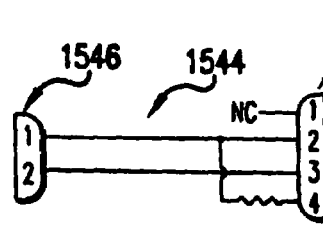
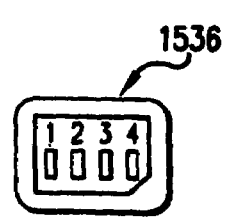
FIG.37(b)   FIG.37(a)   FIG.37(c)
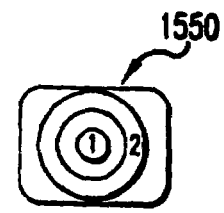
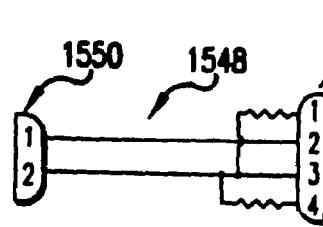
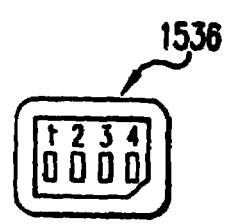
FIG.38(b)   FIG.38(a)   FIG.38(c)

SWITCHING POWER SUPPLY UTILIZING SWITCH-SELECTABLE RESISTORS TO DETERMINE OUTPUT VOLTAGE

RELATED APPLICATIONS

This application is a continuation application of utility application Ser. No. 11/403,046, filed Apr. 12, 2006, which is a continuation application of utility application Ser. No. 11/154,199, filed Jun. 16, 2005, now U.S. Pat. No. 7,145,787, which is a continuation application of utility application Ser. No. 10/927,566, filed Aug. 26, 2004, now U.S. Pat. No. 6,922,347, which is a divisional application of utility application Ser. No. 10/313,793, filed Dec. 5, 2002, now U.S. Pat. No. 6,809,943, which is a continuation application of utility application Ser. No. 10/140,513, filed May 2, 2002, now U.S. Pat. No. 6,693,413, which is a continuation application of utility application Ser. No. 09/694,972, now abandoned, which is a continuation-in-part application of utility application Ser. No. 09/310,461 filed on May 12, 1999, now U.S. Pat. No. 6,172,884, which is a continuation-in-part application of utility application Ser. No. 09/148,811, filed on Sep. 4, 1998, now U.S. Pat. No. 5,949,213, which is a continuation-in-part application of utility application Ser. No. 09/148,811, filed Sep. 4, 1998, now U.S. Pat. No. 6,091,611, which is a continuation application of utility application Ser. No. 08/994,905, filed Dec. 19, 1997, now U.S. Pat. No. 5,838,554, which is a continuation-in-part of utility application Ser. No. 08/767,307 filed Dec. 16, 1996, now abandoned, which is a continuation-in-part application of utility application Ser. No. 08/567,369 filed Dec. 4, 1995, now U.S. Pat. No. 5,636,110 and claims priority of provisional application Ser. No. 60/002,488 filed Aug. 17, 1995, and is also a continuation-in-part application of utility application Ser. No. 08/233,121 filed Apr. 26, 1994, now U.S. Pat. No. 5,479,331.

NOTICE OF COPYRIGHTS

A portion of the disclosure of this patent document contains material which is subject to copyright protection. The copyright owner has no objection to the facsimile reproduction by anyone of the patent disclosure, as it appears in the United States Patent and Trademark Office patent files or records, but otherwise reserves all copyright rights whatsoever.

BACKGROUND OF THE INVENTION

1. Field of the Invention

This invention relates to power supplies and in particular relates to power supplies for use with a variety of different devices.

2. Background of the Invention

Prior art power supplies include a variety of techniques, particularly those used for powering microelectronics such as the class of computers commonly known as "notebook" computers such as the Powerbook Series available from Apple Computer of Cupertino Calif. and the Thinkpad Series available from International Business Machines (IBM) of Armonk, N.Y. More recently, even smaller personal computers referred to as "sub-notebooks" have also been developed by various companies such as Hewlett-Packard's Omnibook. The goal of these notebooks and sub-notebooks designs is to reduce the size and weight of the product. Currently, notebooks typically weigh about six pounds and sub-notebooks weigh slightly less than four pounds.

Many of these notebook and sub-notebook computers have a battery that must be recharged. Also, typically the computers are designed to be operated from external power sources such as line current and the electrical power system of automobiles.

To power these computers, the manufacturer typically provides an external power source. The external power source may be a switching power supply that may weigh close to a pound and may be about eight inches long, four inches wide and about four inches high. Smaller power supplies do exist but frequently they lack sufficient power to charge new batteries such as nickel hydride batteries.

Such external power supplies therefore contribute substantial additional weight that the user of the computer must carry with him or her to permit battery charging and/or operation from an electrical socket. Further, the external power supply is bulky and may not be readily carried in typical cases for such notebook and sub-notebook computers. In addition, conventional power supplies often have difficulty providing the necessary power curve to recharge batteries that have been thoroughly discharged. Also, a power supply is needed for each peripheral device, such as a printer, drive or the like. Thus, a user needs multiple power supplies.

While it has long been known to be desirable to reduce the size and weight of the power supply, this has not been readily accomplished. Many of the components such as the transformer core are bulky and have significant weight. Further, such power supplies may need to be able to provide DC power of up to seventy-five watts, thereby generating substantial heat. Due to the inherent inefficiencies of power supplies, this results in substantial heat being generated within the power supply. Reduction of the volume, weight and heat are all critical considerations for a power supply in this type of application and cannot be readily accomplished. In particular, it is believed to be desirable to have a package as thin as possible and designed to fit within a standard pocket on a shirt or a standard calculator pocket on a brief case. In addition, conventional power supplies are device specific and each device requires its own power supply. Therefore, users need multiple power supplies, which consumes space and increases unnecessary weight.

Cellular telephones are also extensive users of batteries. Typically, cellular telephone battery chargers have been bulky and are not readily transportable. Moreover, cellular telephone battery chargers often take several hours, or more, to charge a cellular telephone battery.

SUMMARY OF THE INVENTION

It is an object of an embodiment of the present invention to provide an improved small form factor power supply that is resistant to liquids and/or is programmable to supply power for a variety of different devices, which obviates for practical purposes, the above mentioned limitations.

These and other objects are accomplished through novel embodiments of a power supply having a transformer. The primary portion includes a primary rectifier circuit, a controller, first and secondary primary drive circuits each coupled magnetically by a coil to the core and a primary feedback circuit magnetically coupled by a separate core. The secondary portion includes a secondary output circuit magnetically coupled by a coil to the core that provides the regulated DC output and a secondary feedback back circuit magnetically coupled to the second core to provide a signal to the primary feedback circuit. In alternative embodiments, different transformer topologies may be used.

The controller provides a separate square wave signal to each of the two primary circuits and the phase of the square wave signals may be altered relative to each other as determined by the controller. The secondary circuit is positioned on the core relative to the two primary circuits so that the secondary circuit coil is positioned at a summing point on the core of the first and second primary circuit coils. The DC voltage and current levels produced at the output of the secondary circuit are monitored by the secondary feedback circuit to provide, through a secondary feedback coil and a primary feedback coil, a signal to the controller. The controller alters the phase between the signals driving the two coils to produce the desired output DC voltage and current at the secondary coils. This results in providing a regulated DC power supply with high efficiency.

By mounting all of the components on a printed circuit board using planar or low profile cores and surface mounted integrated circuits, a small form factor power supply can be attained. Given the high efficiency of the conversion and regulation, the system minimizes dissipation of heat permitting the entire power supply to be mounted within a high impact plastic container dimensioned, for example, as a right parallelepiped of approximately 2.85×5.0×0.436 inches, thereby providing a power supply that can readily be carried in a shirt pocket. It should be understood that changes in the overall dimensions may be made without departing from the spirit and scope of the present invention. Making a relatively thin package having relatively large top and bottom surface areas relative to the thickness of the package provides adequate heat dissipation.

Particular embodiments of the present invention utilize an improved transformer core that, by moving the relative position of the transformer legs, maximizes a ratio of the cross-sectional area of the transformer legs to the windings, thereby requiring less windings for the same magnetic coupling. Fewer windings means less area of a layer of a circuit board may be used so that the number of layers on the circuit board may be minimized. The improved transformer core also provides this maximized ratio while maintaining the ratio of the secondary and primary windings at a constant value. In alternative embodiments, different transformer topologies may be used.

It is an object of an additional embodiment of the present invention to alleviate the need for having a separate power supply for providing power for using each portable electronic device having distinct power requirements.

It is another object of the additional embodiment of the present invention to provide a power supply which is programmable to transmit an appropriate input power to any one of several electrically powered devices.

Briefly, the additional embodiment of the present invention is directed to a power supply which is programmable for providing between about zero and seventy five watts of power DC to a portable electronic appliance adapted for receiving DC power at one of an operational current and an operational voltage. The power supply comprises an input circuit for receiving input power from a power source, an output circuit adapted for coupling to the electronic appliance at an output connection for transmitting power to the electronic appliance and a power conversion circuit for providing output power at the operational current or the operational voltage in response to a detection of one of a programming signal received at the output connection.

The power supply may be configured to be programmable to support a variety of different devices and/or more than one device at a time. This may be accomplished with an on-board processor or by using external cables to provide the programming signal. Thus, the need for having multiple power supply devices (each adapted for meeting the power requirements of a distinct portable device) for providing power to different portable devices.

Other features and advantages of the invention will become apparent from the following detailed description, taken in conjunction with the accompanying drawings which illustrate, by way of example, various features of embodiments of the invention.

BRIEF DESCRIPTION OF THE FIGURES

A detailed description of embodiments of the invention will be made with reference to the accompanying drawings, wherein like numerals designate corresponding parts in the several figures.

FIG. 4 is a top planar view of a printed circuit board containing the circuit of FIG. 3.

FIGS. 12A-12C are a top plan view and two side plan views of a transformer core in accordance with another embodiment of the present invention.

FIGS. 13A-13C are a top plan view and two side plan views of a transformer cap for use with the transformer core shown in FIGS. 12A-12C.

FIGS. 27(a)-27(c) show a cable with connections in accordance with an embodiment of the present invention to program the small form factor power supply for supplying power to different devices;

FIGS. 28(a)-28(c) show a cable with connections in accordance with an embodiment of the present invention to program the small form factor power supply for supplying power to different devices;

FIGS. 29(a)-29(c) show a cable with connections in accordance with an embodiment of the present invention to program the small form factor power supply for supplying power to different devices;

FIGS. 30(a)-30(b) show a cable with connections in accordance with an embodiment of the present invention to program the small form factor power supply for supplying power to different devices;

FIGS. 31(a)-31(c) show a cable with connections in accordance with an embodiment of the present invention to program the small form factor power supply for supplying power to different devices;

FIGS. 32(a)-32(c) show a cable with connections in accordance with an embodiment of the present invention to program the small form factor power supply for supplying power to different devices;

FIGS. 33(a)-33(c) show a cable with connections in accordance with an embodiment of the present invention to program the small form factor power supply for supplying power to different devices;

FIGS. 34(a)-34(c) show a cable with connections in accordance with an embodiment of the present invention to program the small form factor power supply for supplying power to different devices;

FIGS. 35(a)-40(c) show various connector adapters four use with the cable shown above in FIGS. 34(a)-34(c).

DETAILED DESCRIPTION OF THE PREFERRED EMBODIMENTS

Figure 1:
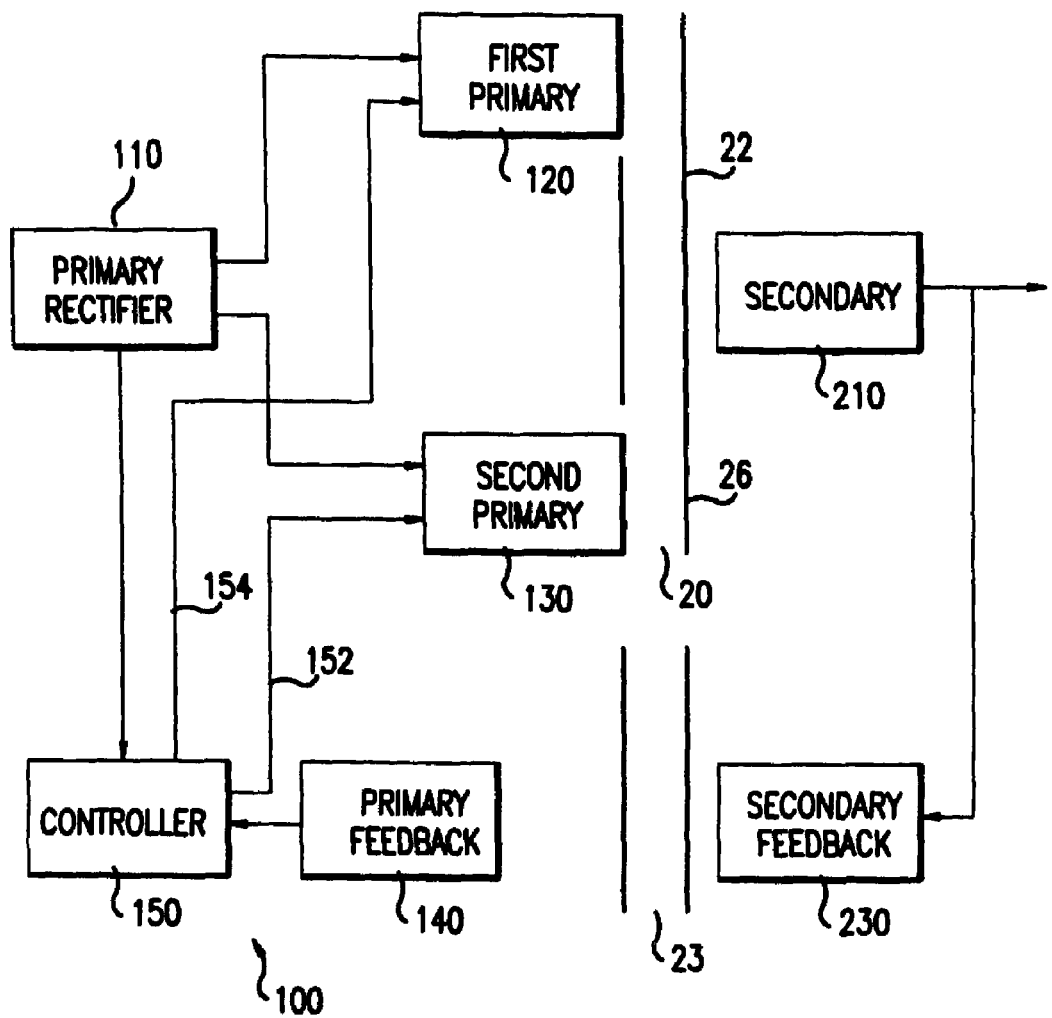
FIG. 1 is a block diagram of a first embodiment of the disclosed invention.

As shown in the drawings for purposes of illustration, embodiments of the present invention are directed to an improved small form factor power supply. In preferred embodiments of the present invention, the small form factor power supply is packaged in a small volume and produces over 75 watts of power with temperatures below 140° F. Preferred embodiments are used to power portable computers. However, it will be recognized that further embodiments of the invention may be used with other electronic devices, such as computer peripherals, audio and video electronics, portable telephone equipment and the like.

Other embodiments of the present invention are more generally directed to a power supply which is capable of providing power to any selected one of a number of electronic devices in response to a programming signal. Each of the electronic devices is adapted for receiving input power at either a set operational voltage or a set operational current. The programming signal preferably controls the power supply to maintain the output power at one of an operational current or an operational voltage associated with the selected electronic device.

FIG. 1 shows a block diagram of the power supply according to an embodiment of the present invention. All components on the left side of a magnetic core 20 are part of the primary portion 100 and all portions on the right hand side are part of the secondary portion 200 of the power supply.

The primary portion 100 includes a primary rectifier and input circuit 110, a first primary and drive circuit 120, a second primary and drive circuit 130, a primary feedback circuit 140 and a controller 150. The secondary portion 200 includes a secondary output circuit 210 and a secondary feedback circuit 240.

The function of the primary rectifier and input circuit 110 is to couple the embodiment 10 to the line voltage (for example 110 volt, 60 Hz), to rectify that voltage and provide DC power for the remainder of the primary portion 100 and a ground path for the primary circuits 120 and 130. The controller 150, which may be a Unitrode 3875 provides two square wave driver signals 152 and 154 having alterable phases to the first and the second primary circuits 120 and 130. The first and second primary circuits are resonant circuits that are resonant at about the frequency of the driver signals and include coils that are coupled to the core 20, which may be a planar or low profile "E" type core, which may be any low loss material, as is shown in a sectional view in FIG. 2. Hence, the driver signals are magnetically coupled to the core 20 by first and second primary coils contained within the circuits 120, 130.

Figure 2:
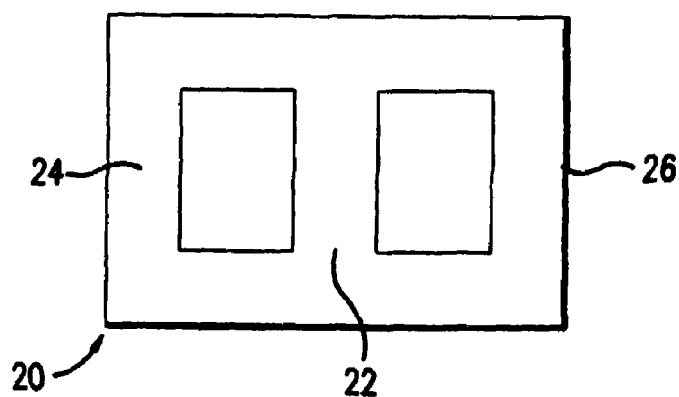
FIG. 2 is a sectional view of the E core for use in the embodiments of FIG. 1.

The coil 212 in the secondary circuit 210 is preferably positioned relative to the coils of the two primary cores so that the coil in the secondary circuit is at a summing point of the magnetic flux from the primary circuit coils. If a planar or low profile "E" type core as shown in FIG. 2 is used, the coil 212 for the secondary circuit 210 is positioned about the central leg 22. The coil for the feedback circuits 140 is positioned on one of the outer legs 24, 26. As a result, the magnetic flux from the two primary coils of the primary circuits 120, 130 are summed at the position where the secondary coil 212 for the secondary circuit 210 is positioned. (This positioning of the coils is shown in FIG. 1 by using the double line to indicate the central leg 22 and a single line to represent the outer legs 24, 26).

The amplitude of the DC voltage and current produced by the secondary circuit 210 are monitored by the secondary feedback circuit 230. The primary feedback circuit 140 and the secondary feedback circuit 230 are magnetically coupled by coils positioned on another core 23 to provide a feedback signal to the controller 150. In response to the feedback signal, the controller alters the relative phase between the two driver signals 152 and 154 to obtain the desired magnitude of the voltage and current. Since the secondary coil 212 is located at a summing point on the core of the flux from the two primary coils, as the phase between the driving signals 152 and 154 to the two primary coils alters, the magnitude of the current and voltage induced in the secondary coil will vary. This will permit control of the secondary circuit 210 output voltage and current, thereby providing a readily controlled output voltage.

Figure 3A:
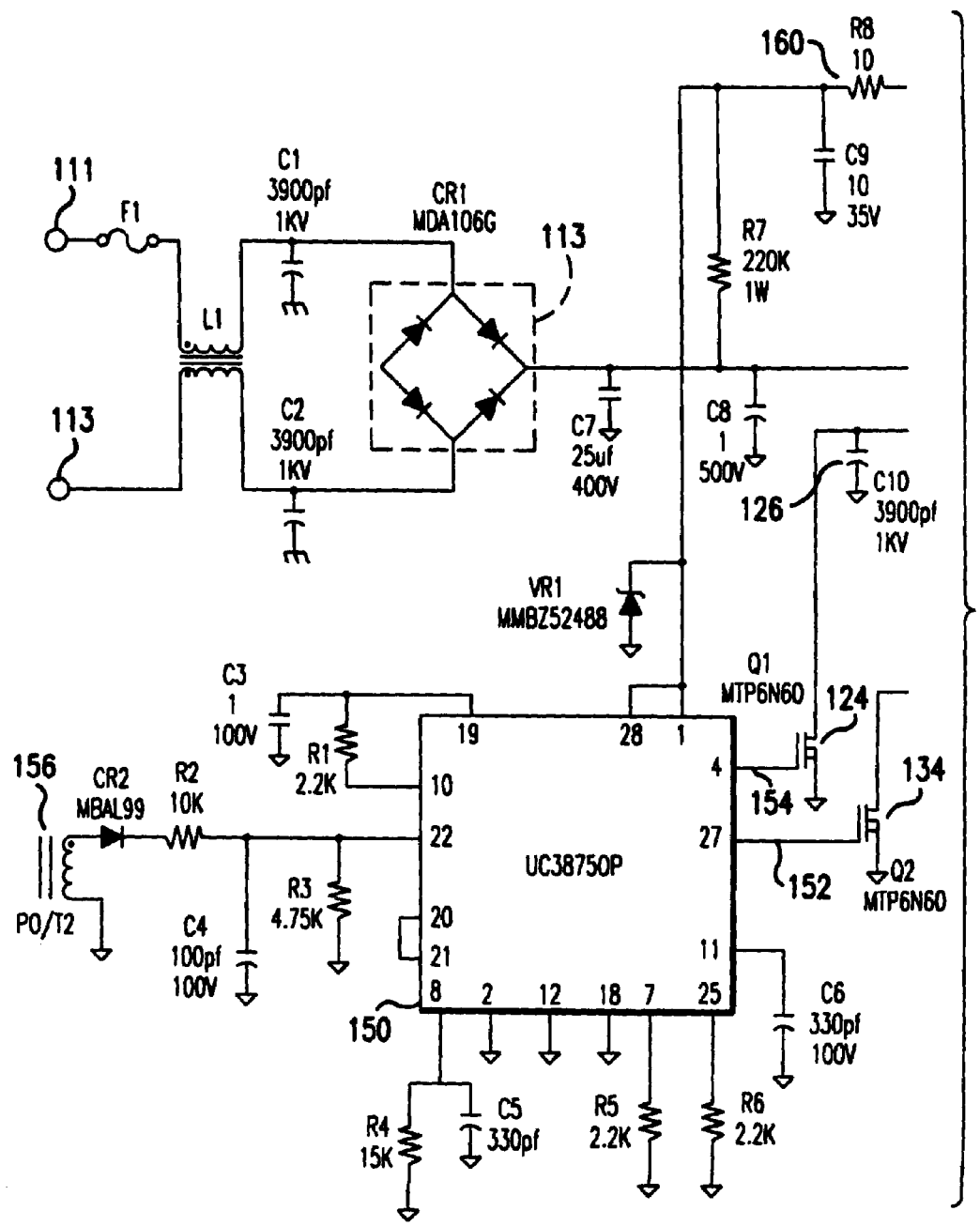
FIG. 3 is a detailed circuit schematic of the embodiment of FIG. 1.
Figure 3B:
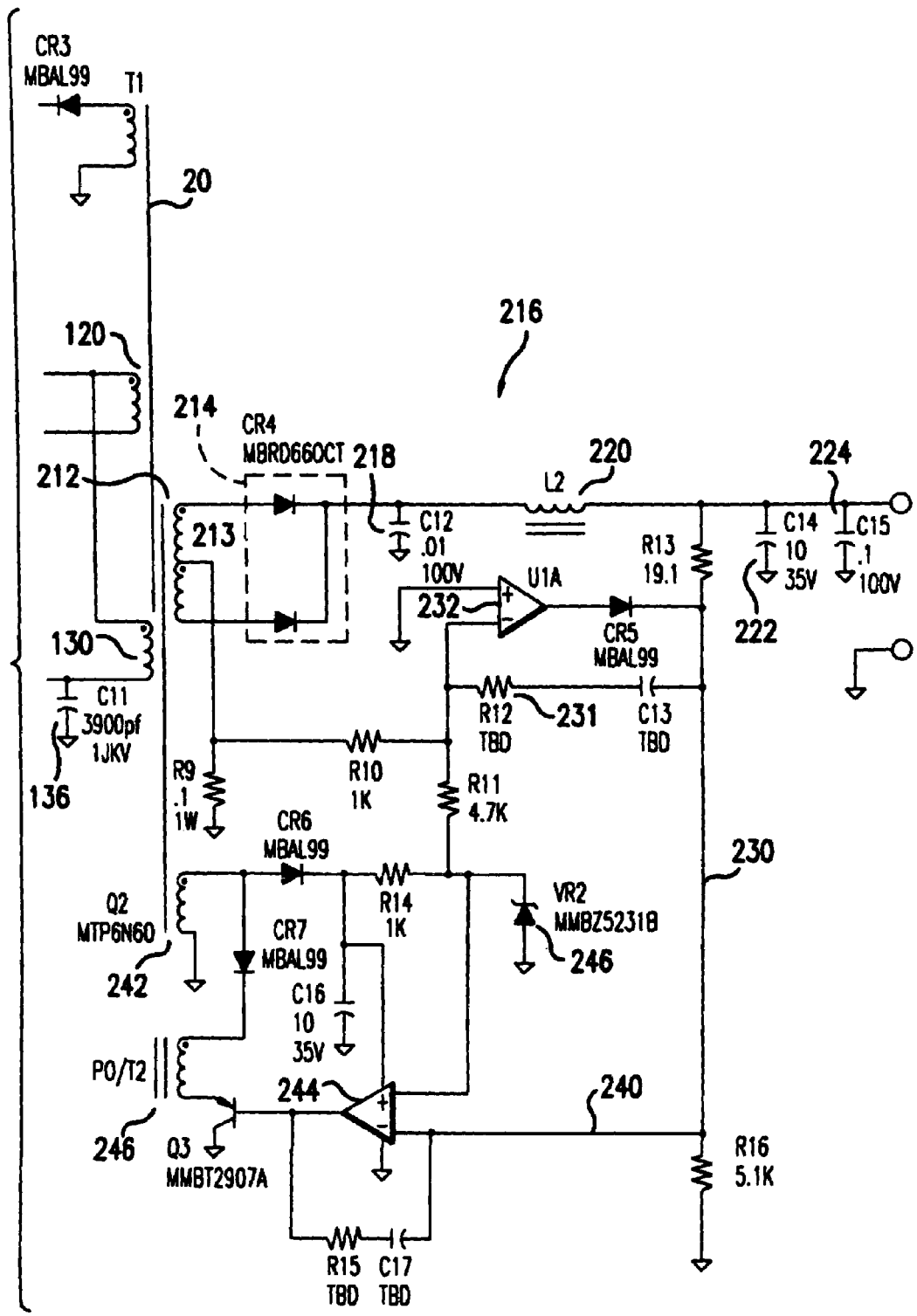

FIG. 3 shows a more detailed schematic of an embodiment of the invention. A standard AC plug may be coupled to input nodes 111, 112 to a first filter coil L1 that is coupled to a full wave rectifier bridge 113, which may be a MDA106G. Filtering capacitors C1, C2, C7, C8 are also coupled to the bridge 113 and one side of the bridge is coupled to AC ground.

The other side of the bridge is coupled to the primary coils 122 and 132 of the first and second primary circuits 120, 130 respectively. The other terminal of the primary coils 122, 132 are coupled to the remainder of the primary circuits 120 and 130. Each of these primary circuits 120, 130 also comprise a drive field effect 124, 134, which may be a MTP6N60 and a capacitor 126, 136. The coils 122, 132, transistors 124, 134 and capacitors 126, 136 are selected so that the resonant frequency of the circuits 120, 130 is at about the frequency of the drive signals 152, 154 to maximize the efficiency of the power supply. In this embodiment, the drive signal frequency is about one megahertz, though other frequencies may be used.

The drive signals 152 and 154 are supplied by a controller 150 such as a Unitrode UC3875QP or other similar product. The controller 150 receives the biasing power at pins 28 and 1 from the primary power supply circuit 160.

Each of the coils 122 and 132 induce a varying magnetic field in the outer legs of the core 20. The secondary coil 212, which has a center tap 213, is coupled to a half wave rectifier bridge 214, which may comprise an MBRD66OCT, and then is coupled to a filtering circuit 216 comprised of a capacitor 218, an inductor 220, and capacitors 222 and 224 to provide a DC regulated output 226.

The regulation is provided by feeding back to the controller 150 a signal modulated by a current sensing amplifier circuit 232 and a voltage sensing circuit 240 comprising the feedback circuit 230. To provide the carrier for modulation, a further secondary carrier coil 242 is coupled to one of the outer legs of the core 20. One of the legs of this transformer coil 242 is coupled to an isolation feedback transformer T2.

The current sensing circuit takes the output of the center tap of the secondary coil 212 and provides a voltage drop across resistor R9 that is provided to current sensing amplifier circuit 232. The output of the current sensing amplifier circuit 232 is added to a voltage dropped across R13 and is provided to an amplifier 244 in the voltage sensing circuit 240. The other input in the voltage sensing circuit is a reference voltage developed by the Zener reference diode 246 and also provided as a biasing level to the current sensing amplifier circuit 232. The output of the amplifier 244 is provided to the base of bipolar transistor Q3, which may be a MMBT2907T, configured in a common base configuration, to amplitude modulate the current through the secondary side coil 246.

The primary side coil 156 of feedback transformer T2 is magnetically coupled to the secondary side coil of 246 and generates an amplitude modulated signal that is envelope detected and integrated to provide a feedback voltage at input 22 of the controller 150.

As a result, as the amplitude of the envelope of the modulated signal increases, the voltage at input 22 of the controller 150 increases. When the controller 150 determines that the voltage has exceeded a predetermined limit, indicating that either the current or voltage at the output has increased beyond the predetermined maximum, the relative phase difference of driver signals 152 and 154 is increased. If the amplitude at input 22 decreases below a predetermined threshold indicating that the voltage or the current is below the desired levels, the relative phase of signals 152 and 154 is decreased towards zero to increase the voltage or current. Due to the summing effect of the magnetic flux at secondary coil 212, a highly efficient control or regulation of the power supply circuit is obtained.

Because of the high efficiency that is attained with this circuit, heat dissipation is much less and it is possible to reduce the size of power supply to a much smaller form factor. In particular, each of the electrical components in FIG. 2, other than the transformer, may be mounted using surface mount devices on a printed circuit board. Further, each of the inductors and transformer cores are low profile or planar cores mounted through cutouts formed in the printed circuit board. The coils of the inductors and transformers are provided by wiring traces on the circuit board that wrap around the portion of the appropriate core penetrating the circuit board. As a result, an extremely compact form factor may be obtained. FIG. 4 shows a top planar view of such a printed circuit board with each inductor L1, L2 and transformer cores T1 and T2 identified.

Notwithstanding the smaller size of the form factor, heat dissipation is not a serious problem due to the increased efficiency of the power supply according to the disclosed embodiments. Therefore, with all the components assembled on a printed circuit board as described above, the assembled printed circuit board may be housed within a housing formed from an injection molded plastic dimensioned 2.75×4.5×0.436 inches without undue heating of the housing, although other dimensions may be used with a key to maintaining a thin profile of the power supply being the ratio of the surface area of the top and bottom surfaces to the overall thickness of the housing. With proper heat sinks, for example, even smaller dimensions may be attained. For example, with such a housing, surface temperatures on the housing should not exceed one hundred twenty degrees Fahrenheit. A normal electrical plug such as a phased, three-prong plug, is coupled by an input cable (not shown) through a hole formed in the housing and an output cable (not shown) having a connector (not shown) coupled to the printed circuit board and to an output connector. Alternatively, the three-prong plug (not shown) may be formed within the housing with the prongs projecting from the housing to avoid the opening for a cable. Also, the plug may be of a pivotable type (not shown) mounted on the surface of the housing and rotate between a recessed position in a cutout formed within the housing and an in use position projecting at ninety degrees from the surface of the housing.

Although the disclosed embodiment shows only one regulated DC voltage being supplied (for example +5 or +16 volts DC), it would readily be understood by those of ordinary skill in the field that other regulated or unregulated voltages may also be supplied with minor modifications to the disclosed embodiment. For unregulated voltages, additional secondary coils (not shown) with the appropriate number of windings to provide the voltage may be magnetically coupled to any of the legs of the transformer core 120. The appropriate circuitry must then be provided for rectifying and filtering the output of this additional secondary coil. Similarly, an additional regulated voltage may be supplied by providing a feedback control circuit such as the type described above that provides the appropriate feedback.

Figure 5A:
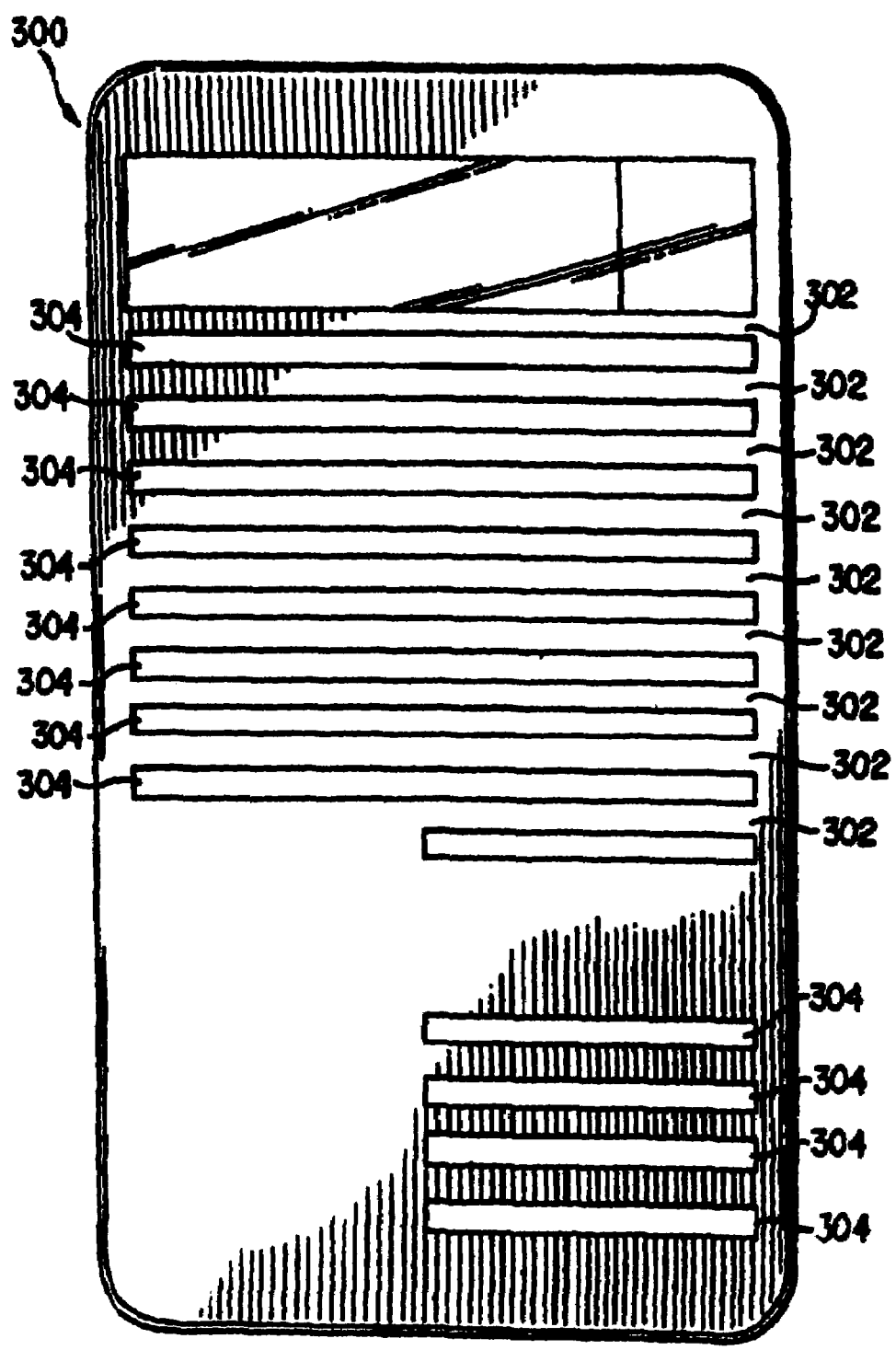
FIG. 5A is a top planar view of a case or housing for an additional embodiment of the for an invention where the case houses the other components.

FIG. 5A shows a top planar view of a case 300 for an additional embodiment of the invention substantially having the shape of a right parallelepiped. The case may have dimensions of 5 inches long by 2.85 inches wide and the thickness (not shown) is 0.436 inches. Both the top portion of the case 300 and the bottom portion (not shown) define a number of louvers 304 defining multiple openings 302. The configuration of the openings 302 on both the top and bottom (not shown) portions of the cover are relatively unimportant. These openings must, however provide sufficient air circulation so that even when operating at maximum rated output power such as seventy-five watts DC, the surface temperature of the case 300 is less than one hundred and forty degrees Fahrenheit and preferably less than one hundred and twenty degrees Fahrenheit when the unit is operated at the maximum rated power of, for example seventy five watts DC. Having the openings defined on both the top and the bottom permits the user to operate the power supply in both the "right side up" and the "upside down" position with adequate air circulation. The case may be made of any high impact suitable plastics, such as Lexan or ABF, and when the top and bottom portions are assembled together such as by a snap lock or a force fit, they define a chamber in which all of the components are housed. Also, the exact dimensions are not critical, but preferably, the ratio of the top and bottom surface areas should be much greater than the thickness.

Figure 5B:
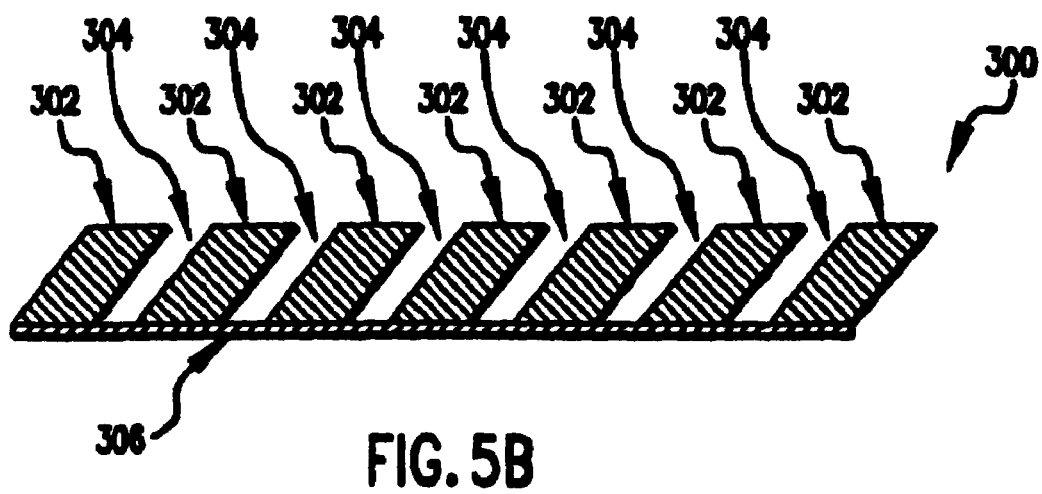
FIG. 5B is a partial cross-section of the louvers and openings of the case top as shown in FIG. 5A.

FIG. 5B shows a partial cross-section of top portion of the case 300. In preferred embodiments of the present invention, a thin layer 306 of material is connected to the bottom of the louvers 302 to cover the openings 304 that lead into the interior of the case 300. The thin layer 306 is thin enough to still allow heat to pass through the openings 304 using ordinary convection. However, the thin layer 306 is thick enough to prevent entry of liquids into the case 300, which could affect operation of the power supply. In preferred embodiments, the thin layer is 1 to 3 mils thick. However, in alternative embodiments, thinner or thicker layers may be used, so long as the layer is thick enough to resist penetration of liquids into the case 300 and as long as the layer is thin enough to permit normal heat dissipation by convection. In preferred embodiments, the thin layer 306 is formed from a plastic material, such as Lexan, ABF or the like from which the remainder of the case is also formed. However, in alternative embodiments, the thin film 306 may be formed from metals, composites, ceramics or other heat conductive and liquid resistant materials.

Figure 6:
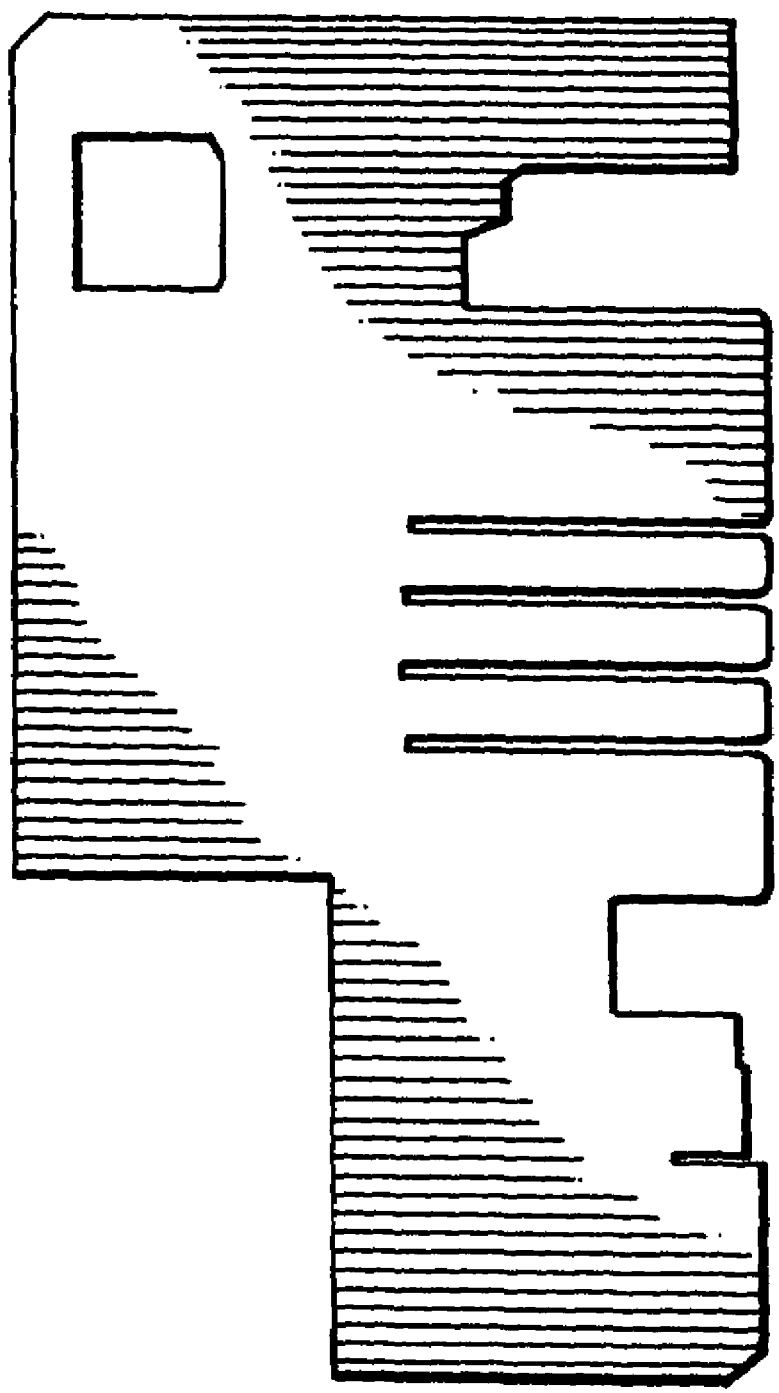
FIG. 6 is a top planar view of one of two heat sinks for the additional embodiment of the invention that sandwich a printed circuit board containing the circuitry for the additional embodiment.

In an assembled unit, immediately beneath the top (and above the bottom (not shown)) of the case 300 are heat sinks such as those shown in FIG. 6. Each heat sink, which comprises a thin sheet of thermally conductive material such as aluminum (which may be anodized) is configured preferably to fit precisely within the top or bottom portions of the case and defines a number of cutouts. These cutouts may provide clearance for certain components to be directly cooled by air entering through the openings 304 defined between the louvers 302 or may be provided for clearance of the components mounted on the printed circuit board (not shown). Preferably, whatever pattern of cutouts are formed in the heat sink, the pattern should be positioned so that when the unit is assembled, the heat sink material should provide adequate coverage over the openings in the case 300 to resist penetration of spilled liquids into the assembled unit. This allows the unit to comply with Underwriters Laboratories and other safety standards. Alternatively, the top and bottom heat sinks may cover the entire power supply circuit board (not shown). Of course, other suitable materials besides aluminum may be used for the heat sinks. In preferred embodiments of the present invention, the undersides of the louvers are scalloped (either along the length of the louver 302 or from side to side of the louver 302) to provide an air gap between the louvers 302 and the heat sink to minimize conduction of the heat from the heat sink to the material of the case 300 and louvers 302.

As shown in FIG. 5B, the louvers 302 are spaced close together to form the openings 304 so that the openings 304 have a relatively narrow width. The width and depth of the openings 304 are chosen so that fingers cannot come into contact with either the thin layer 306 or the heat sinks under the thin layer 306. This minimizes the heat transfer to the user so that the touch temperature of the unit appears lower than the actual temperature. In preferred embodiments, the openings 304 are 3 to 5 mm, which is narrow enough to prevent the entry of fingers from small children. However, in alternative embodiments, narrower or wider openings 304 may be used, with the width being selected based upon the environment in which the power supply will be used.

Figure 5C:
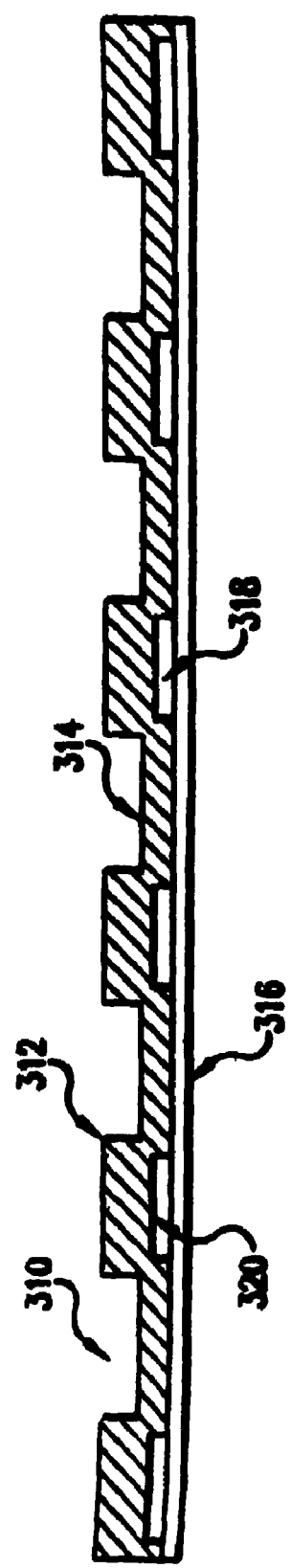
FIG. 5C is a partial cross-section of another embodiment of the louvers formed from raised ridges and depressions on the case top.

FIG. 5C illustrates a partial cross-section of another embodiment of the louvers in accordance with an embodiment of the present invention. In this embodiment, the louvers 310 are formed from a single piece of material with raised ridges 312 separated by depressions 314. The depressions are connected and secured to the heat sink 316 (such as those shown in FIG. 6) by adhesives, snap fit, simple contact or the like. The raised ridges 312 of the louvers 310 are spaced close together to form the depressions 314 so that the depressions 314 have a relatively narrow width. The width and depth of the depressions 314 are chosen so that fingers cannot come into contact with either the bottom of the depressions 314 or the heat sink 316. This minimizes the heat transfer to the user so that the touch temperature of the unit appears lower than the actual temperature. In preferred embodiments, the depressions 314 are 3 to 5 mm, which is narrow enough to prevent the entry of fingers from small children. However, in alternative embodiments, narrower or wider depressions 314 may be used, with the width being selected based upon the environment in which the power supply will be used. To minimize the transfer of heat from the raised ridges 312, an air gap 318 is formed beneath an undersurface 320 of the raised ridges 312 and the heat sink 316. The air gap 318 acts as an insulator so that the touch temperature of the case is lower than the actual temperature of the power supply heat sink 316. In preferred embodiments, the raised ridges 312 and the depressions 314 are formed from a plastic material, such as Lexan, ABF or the like from which the remainder of the case is also formed. However, in alternative embodiments, the raised ridges 312 and the depressions 314 may be formed from composites, ceramics or other heat conductive resistant and liquid resistant materials.

Figure 7A:
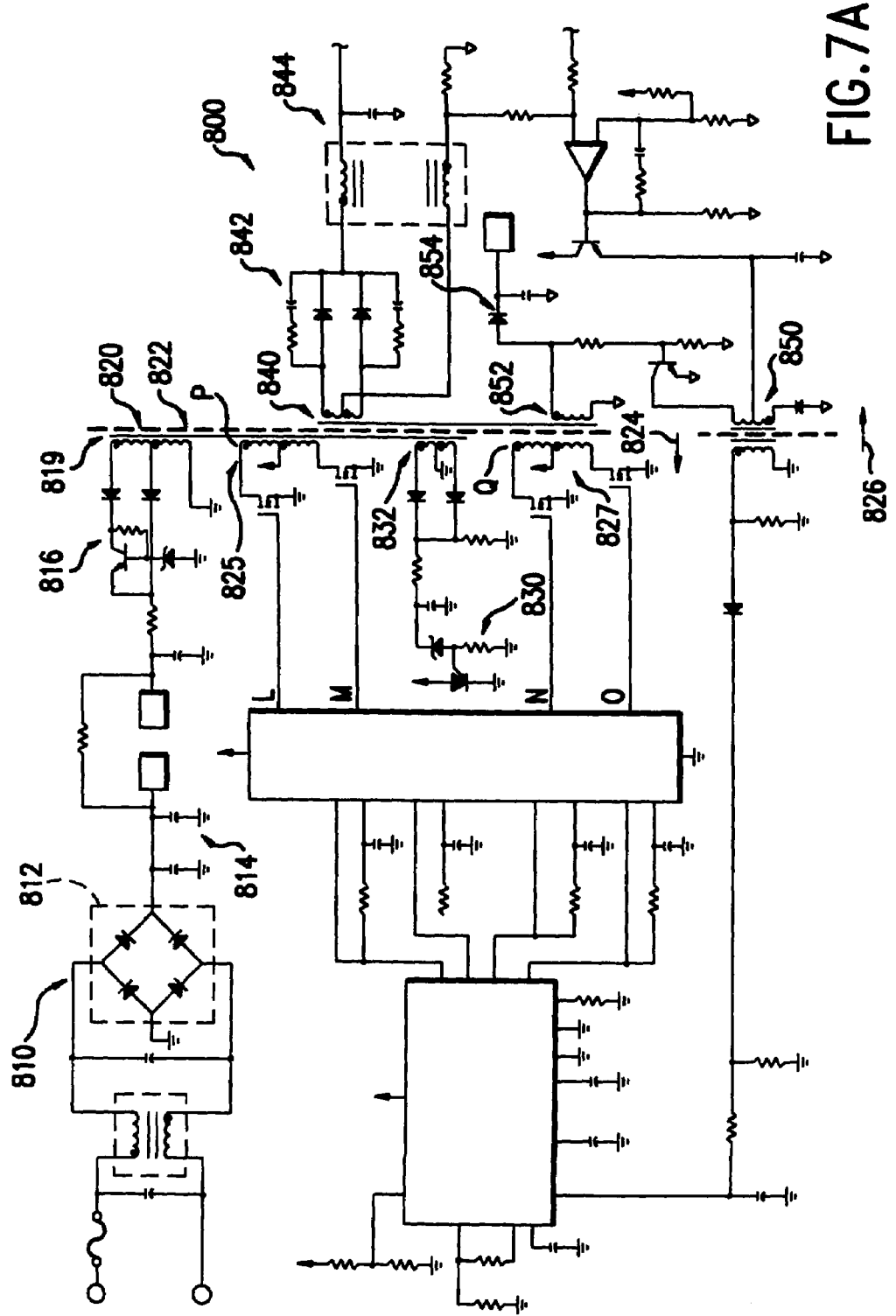
FIGS. 7A and 7B are a schematic diagram of the additional embodiment of the invention.
Figure 7B:
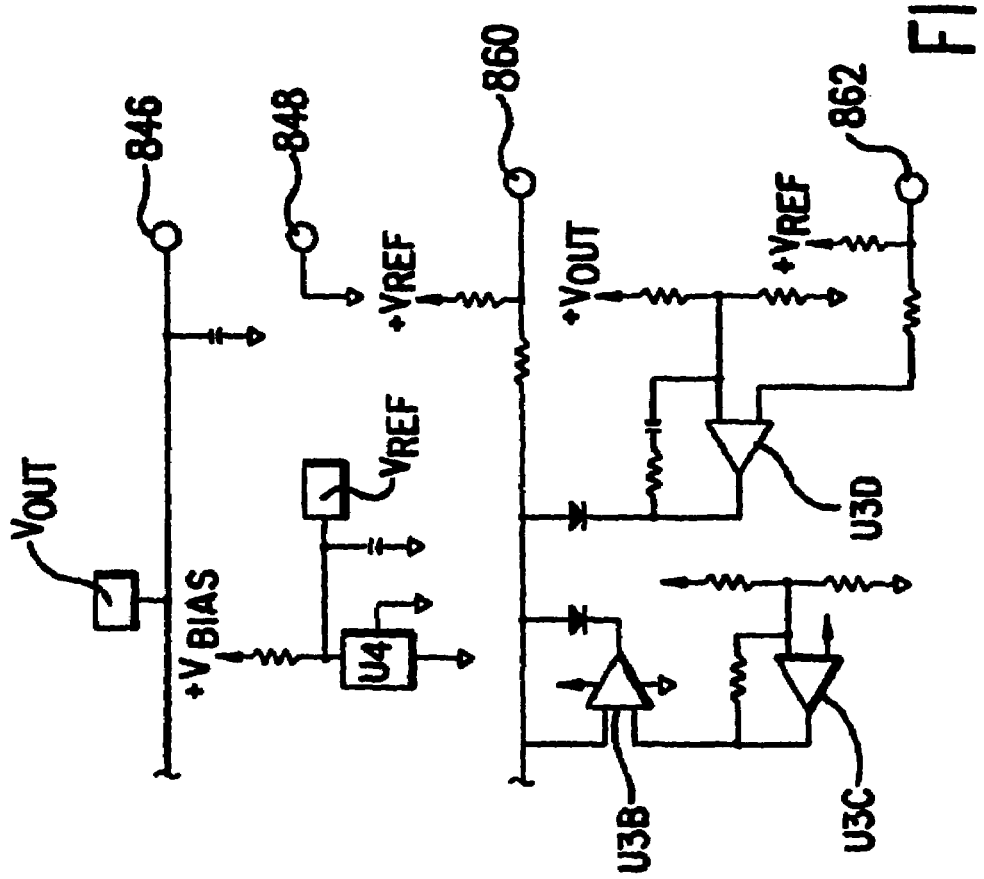

FIGS. 7A and 7B show a schematic for the power supply circuit 800 with all resistance in ohms and all capacitance in microfarads unless otherwise labeled. The power supply is formed on a multilayer printed circuit board (not shown) having length and width dimensions that are only slightly smaller than the exterior of the case and fit as precisely as possible within the chamber of the case 300 sandwiched between the heat sinks to minimize movement after assembly. Further, as far as possible, surface mount devices are used to minimize the vertical dimension and all coil cores are preferably planar, low profile cores. Optimally, parts having the smallest possible thickness should be used.

The power supply 800 includes an input circuit 810 that may be coupled to any AC power source preferably having a frequency of between about 50 to 90 hertz and preferably having a voltage of between about 90 to 240 Volts AC. This input circuit 810 may include a full wave bridge rectifier 812, a filter circuit 814 and a regulation circuit 816 to provide an independent power supply for all integrated circuits used on the primary side 824 of the circuit. For filtering purposes, the input regulator circuit 816 may also include a center tapped coil 819 mounted on one of the exterior legs of the "E" planar core 822 of the transformer 820. (Preferably, the planar "E" core of the type shown in FIG. 2 is used.) When the AC input voltage exceeds a predetermined range such as one hundred and forty volts RMS, transistor Q9 in cooperation with Zener diode VR1 will cooperate so that the center tap of the coil 819 will be selected. This permits the output Vbias of the regulator to be in an acceptable range for higher input voltages such as may be common outside of the United States. The output Vbias is used for supplying power to all of the internal integrated circuits on the primary side 824 of the transformer 820, namely integrated circuits U1 and U2. This permits these integrated circuits U1, U2 to continue functioning even if the DC output voltage from the power supply 800 drops below the range necessary for the integrated circuits U1 and U2 to continue operating.

A controller integrated circuit U1 provides the four control signals for powering the MOSFETs coupled to the two primary coils 825 and 827 with their center taps coupled to Vbias. The outputs of integrated circuit U1 at pins 7 through 10 provide the control signals to a MOSFET driver circuit U2 such that MOSFETs Q1, Q2, Q4 and Q5 provide the appropriate phase control as is described in connection with FIG. 8. Integrated circuit U2 may be for example a 4468 available from Micrel, Teledyne and Telcom.

Each of power switching MOSFET transistor pairs Q1 and Q2, and Q4 and Q5 are coupled to center tapped primary coils 825 and 827, respectively. These transistors preferably have heat sinks (not shown) coupled to their cases, and/or these heat sinks may also be thermally coupled to one of the heat sinks mounted immediately below and immediately above the top and bottom heat sinks for better thermal control. The capacitance of the MOSFETs Q1, Q2, Q4 and Q5 and the inductance of the coils 825 and 827 are selected to provide resonance at the frequency at which the drive signals are supplied, which may be about 1 MHz. Nonetheless, other frequencies may be used, for example, between a range of about 500 KHz to 2 MHz.

Figure 8:
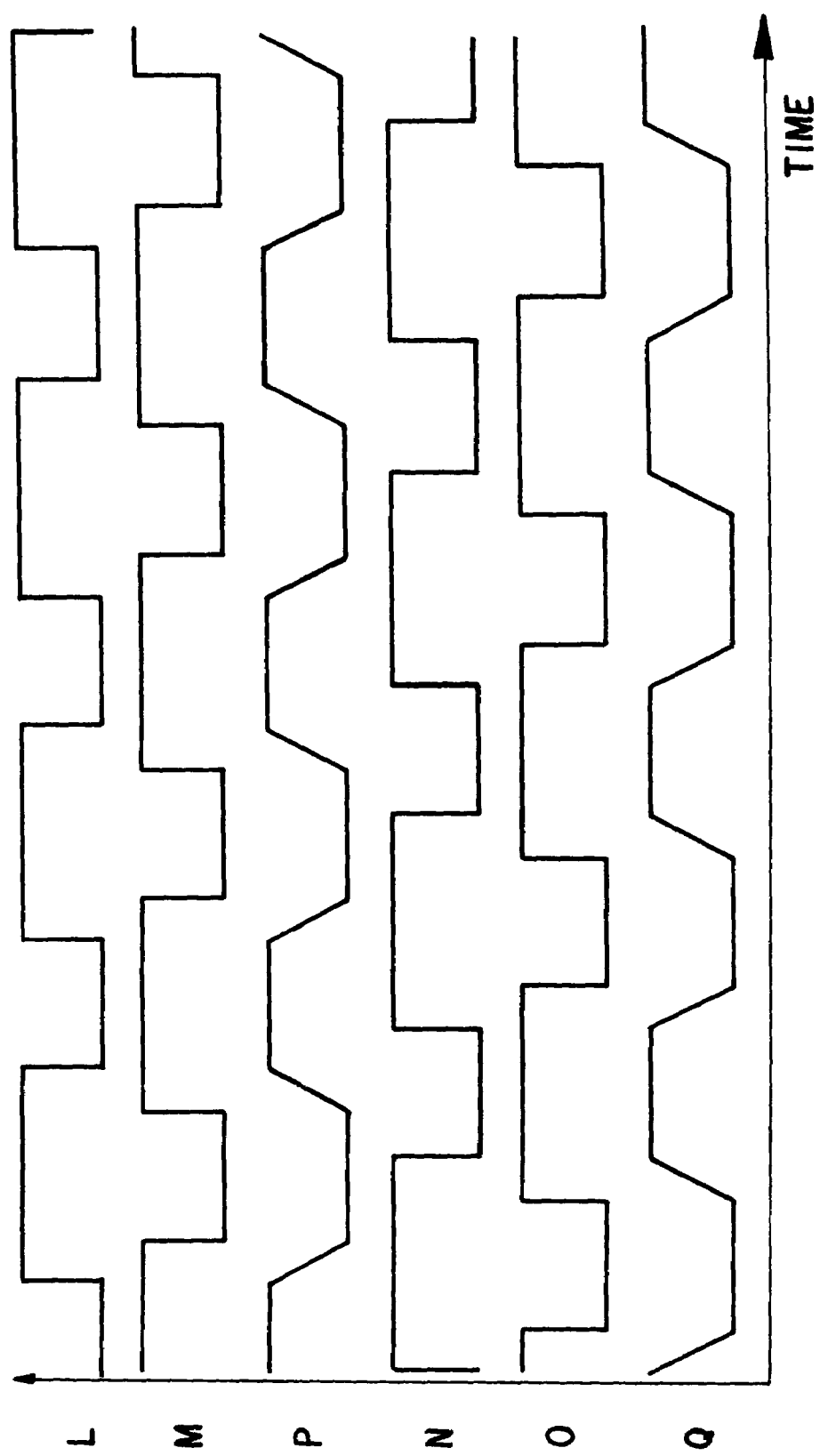
FIG. 8 is a timing diagram for the circuit shown in FIGS. 7A and 7B.

FIG. 8 shows a timing diagram of the signals at nodes L through Q shown on FIGS. 7A and 7B. The integrated circuit U1, as described in more detail below, through feedback, provides MOSFET driving signals L through O. The MOSFET driving signals provided to each primary winding, 825 and 827 (i.e., L and M for primary winding 825 and N and O for primary winding 827) are always one hundred eighty degrees out of phase as shown in FIG. 8. However, the relative phase relationship of driving signal pair L and M for primary winding 825 with respect to driving signal N and O for primary winding 827 may be changed by the integrated circuit controller U1 in the manner described below to provided the regulated DC output voltage at connectors 846 and 848. Maximum power is provided when the pairs of driving signals are in phase with each other. It should be noted that while the control signal provided at pins 7 through 10 are preferably at substantially a fifty percent duty cycle, the resistors R10 through R13 and the capacitors C10 through C13 combine with the integrated circuit U2 to provide preferably driving pulses L through O with a duty cycle of less than 50 percent. This ensures that the FETS in a pair (i.e., Q1 and Q2 for winding 825 and Q4 and Q5 for winding 827) are never both on at the same time to provide zero resonant switching and reduce power consumption.

Due to the zero volt resonant switching design of the circuit, MOSFET pair Q1 and Q2 are preferably never on the same time and MOSFET pair Q4 and Q5 are preferably never on at the same time. MOSFET Q1 will turn on just about when the voltage at node P, which is at the drain of transistor Q1, reaches a minimum and will turn off immediately after the voltage at the drain of transistor Q1, goes above that minimum level. Similarly, due to the phase relationship of drive signal pair L and M at nodes L and M, transistor Q2 will only be on when the voltage at the drain is almost at the minimum. Transistor Q4 will also only be on when the voltage at node Q is virtually at its minimum and the transistor Q5 will only be on when the voltage at its drain is nearly at its minimum.

It should be noted that the duty cycle of signals L through O is selected so that the waveforms P and Q are substantially trapezoidal with clipping occurring by transistors Q1, Q2, Q4 and Q5. This permits operation of the circuit over a wider range of input voltages. However, in alternative embodiments, transistors Q1, Q2, Q4 and Q5 need not clip so that the waveshapes at the drains of these transistors are substantially sinusoidal. Alternatively, using a low enough frequency for the drive signals, a square wave on the drains of the actual transistors could be used but would probably require larger cores.

For the secondary side 826 of the power supply circuit 800, a single secondary winding 840 is located at the magnetic summing node of the core 822 (i.e., the center leg of the low profile "E" type core shown in FIG. 2). That secondary winding 840 is coupled to a rectifier circuit 842 and then to an output filter 844 including a filter choke L2 to provide the regulated DC output at connectors 846, 848 in the manner described below.

The center tap of the secondary winding 842 is coupled through a coil in the filter coil L2 sharing a common core with the coil in the output filter 844. Through resistor R23, this center tap of winding 842 provides a current sense input to a summing amplifier U3A. A voltage sense of the output DC regulated voltage Vout is provided to an amplifier including amplifier U3C. The sensed voltage signal at the output of amplifier U3C is provided to the summing amplifier U3A through amplifier circuit U3B to provide the feedback necessary for the desired regulation of the DC output.

The output of the summing amplifier U3A is provided through an emitter follower transistor Q7 to the center tap of the secondary side 826 of the feedback transformer 850. This transformer is magnetically isolated from the transformer 820. The signal at the center tap of transformer 850 amplitude modulates a carrier signal provided by winding 852 provided on the same exterior leg of the core 822 as primary winding 827. Preferably also, this should be the opposite exterior leg of the core 822 on which coil 819 and winding 825 are mounted.

The primary side 824 coil of transformer 850 provides an amplitude modulated feedback signal that has an amplitude envelope. A diode detector comprised of diode CR5 and resistor R17 strip the carrier away, leaving the amplitude envelope as a feedback control signal to the VMOD input (pin 1 of U1) to provide the feedback useful for altering of the phase relationship between the drive signal pairs of signals L and M on the one hand, and signals N and O, on the other hand to regulate the DC power supply output at connectors 846, 848.

With the current control connector 860 and the voltage control connector 862 left unconnected (as shown), amplifiers comprising U3B and U3D along with the current and voltage sense signals cause the integrated circuit U1 to control the phase relationship between the drive signal pairs L and M, on the one hand, and N and O, on the other hand, to provide a constant power supply until the output voltage drops below about ten volts. Then, due to the feedback signal at pin 1 of the controller U1, the integrated circuit controller U1 controls the relative phase relationship between the pair of drive signals L and M, on the one hand, and N and O, on the other hand, to provide a constant current source down to a minimal voltage, which is preferably less than about one volt.

It should also be noted that the Vcc used by the amplifiers U3A through U3D in the integrated circuit U3 and the voltage regulator U4 to generate the +5 volts used in the control circuit (e.g. comprising amplifiers U3B, U3C and U3D) is supplied by a rectifier circuit 854. The rectifier circuit 854 is also coupled to secondary coil 852.

Figure 9:
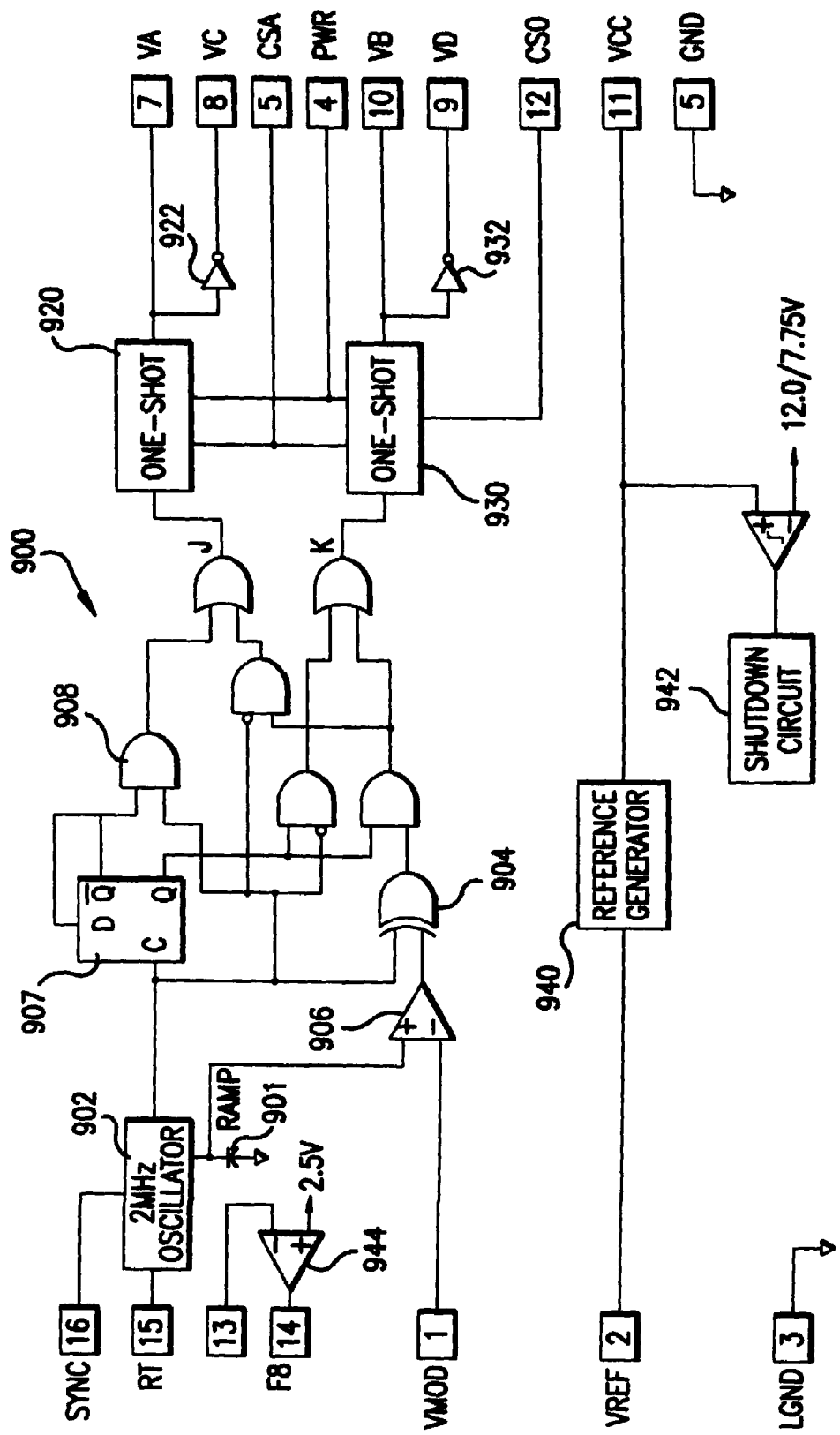
FIG. 9 is a block diagram of the U1 integrated circuit shown in FIG. 7.
Figure 10A:
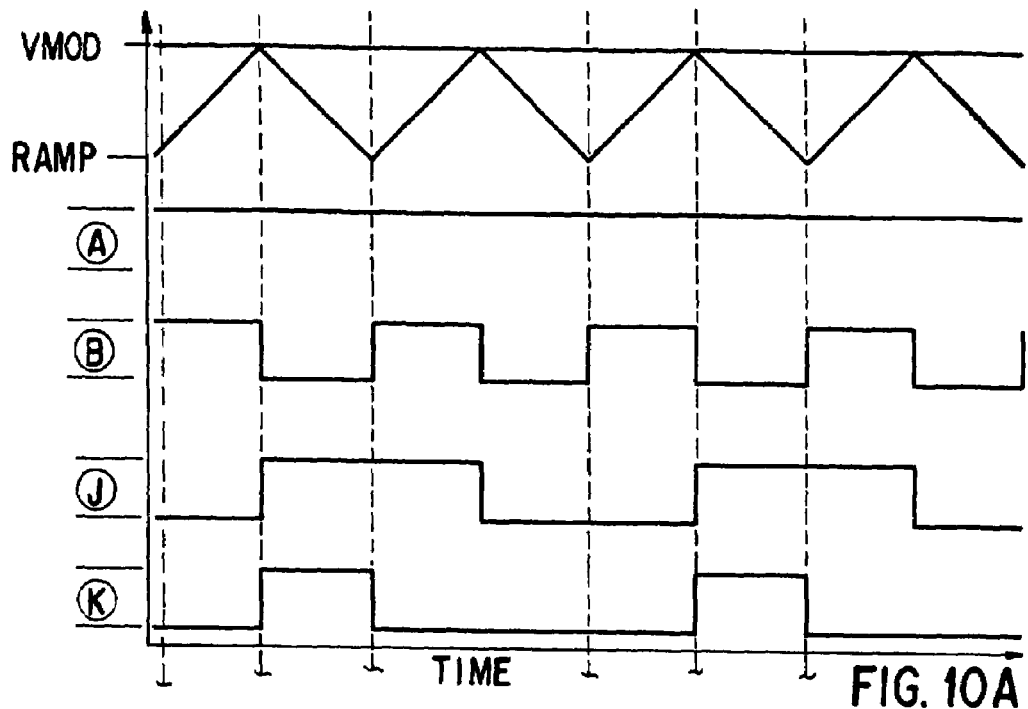
FIGS. 10A and B are timing diagrams for the block diagram shown in FIG. 9.
Figure 10B:
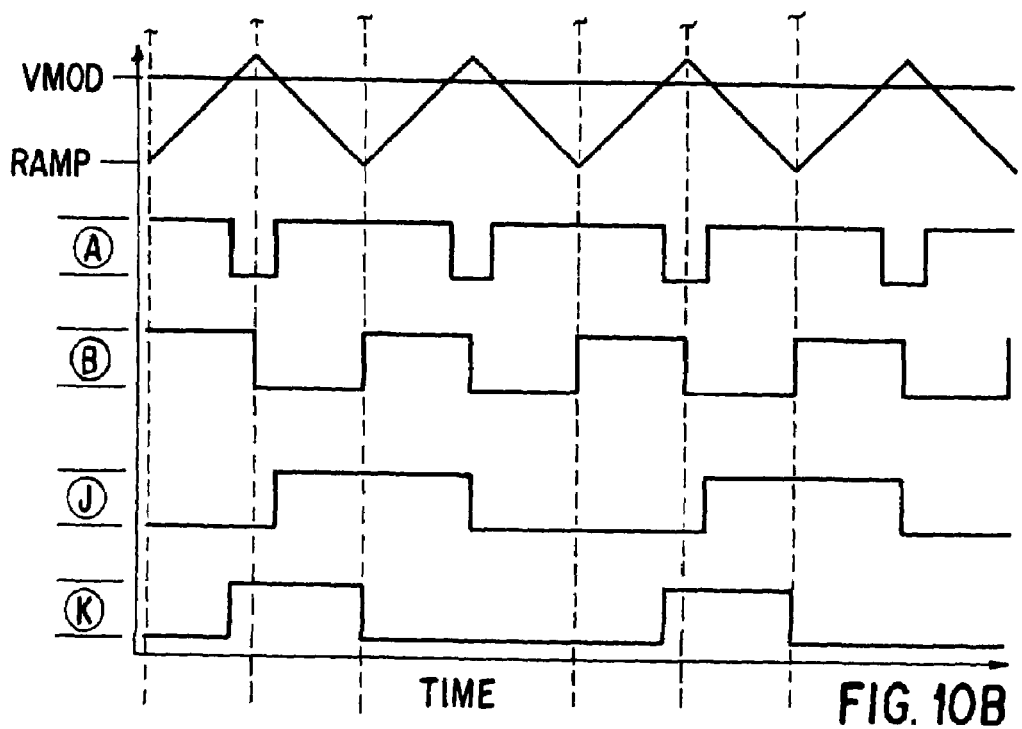

FIG. 9 shows a block diagram 900 of the controller integrated circuit U1. Pins 13, 14, and 15 cooperate together along with external components R3, R4, R5 and R6 to set the operational frequency of the oscillator 902 to be preferably at 2 MHz, although other frequencies may be selected. An output of the oscillator 902 is coupled to an internal capacitor 901 to provide a triangle signal labeled Ramp on FIGS. 10A and 10B while another output of the oscillator 902 is a 2 MHz square wave coupled to exclusive OR gate 904 and the clock input of a D flip flop 907. A Schmitt trigger comparator 906 compares the feedback signal VMOD at pin 1 with the ramp signal as is shown in FIGS. 10A and 10B. In FIG. 10A, the VMOD signal, which is the envelope of the feedback signal from the feedback transformer 850 is at the maximum level, while in FIG. 10B, the VMOD signal is somewhat less than the maximum. As can be seen in FIGS. 10A and 10B, the comparator 906 cooperates with the D flip flop 907, the exclusive OR gate 904, and the associated logic gates 908 to generate one shot control signals J and K. As can be seen by comparing FIG. 10A, when VMOD is at a maximum, the one shot drive signals J and K are controlled so that both one shot control signals go high at the same time. When the amplitude of VMOD drops below the maximum, the timing of the one shot control signal J is retarded and the timing of the one shot control signal K is advanced. These one shot control signals J and K are provided to one shot circuits 920 and 930 within the controller circuit U1, which have dual outputs VA and VC and VB and VD respectively. The one shots 920 and 930 trigger on the rising edge of signals J and K respectively, and the durations to the falling edge of the control signals J and K are irrelevant provided that they fall before the one shots need to be retriggered. Due to the inclusion of inverters 922 and 932, the output pair of signals VA and VC and VB and VD are approximately one hundred and eighty degrees out of phase. It should also be noted that the external capacitor C7 and resistor R7 are coupled to pins 5 and 4 of the controller U1 to control the duration of the output pulses at the one shot 920 and the one shot 930 to trigger them for the same duration. Further, these component values are selected to be as near as possible to provide a fifty percent duty cycle on the outputs L through O of the MOSFET driver circuit U2 at the frequency of operation.

The controller circuit U1 also includes a reference voltage generator 940 that provides the reference voltage for the over voltage protection circuit 942 and the comparator 944. As shown in FIG. 7, an over voltage protection circuit 830 having a coil 832 is located at or near the summing node of the E block core 822. The value of the components within over voltage protection circuit 830 are selected such that if the output voltage DC Output goes above a predetermined threshold, silicon controlled rectifier (SCR) Q3 will fire, shunting the Vbias to ground. This will cause the integrated circuits U1 and U2 to cease operating, thereby shutting down the output until the unit is recycled by temporarily removing the AC input voltage.

Thus, a small, highly efficient form factor power supply has been disclosed that may be readily mounted within a small container having a thickness of 0.436 inches or less and having dimensions suitable for holding in a typical shirt pocket or calculator pocket in a brief case at high power levels of up to about 75 watts DC output with a surface temperature of about 140 degrees Fahrenheit at the surface. Thicknesses of less than 0.436 inches may be attainable if thinner electrolytic or other types of filtering capacitors can be obtained using standard production techniques. Alternatively, a thinner case may be obtained by maximizing coupling of heat generating components to the heat sinks with maximum air flow through the openings defined by the louvers 302 and by making the top and bottom surface areas of the case larger. Regulation of the output voltage may be readily attained. Still further, the secondary coil can be positioned where the magnetic flux induced in the core from the two primary coils destructively interfere with each other and where the phase of the two driving signals is approximately one hundred eighty degrees out of phase at maximum output. In further alternatives, cooling methods other may be used, such as small electric fans, thermal-electric coolers or the like, to permit smaller form factor power supply configurations. Other alternatives will be readily apparent to those of skill in the art. It should be noted that in alternative embodiments, the various resistors, capacitors, frequencies and inductors may be different and other types of integrated circuits may also be used.

FIGS. 12-16 illustrate an improved transformer core 1010 in accordance with an embodiment of the present invention. FIG. 12A shows a top plan view of the transformer core 1010, which is formed by a base plate 1012, a secondary leg 1014 and a pair of primary legs 1016 and 1018. The secondary leg 1014 and the primary legs of the transformer 1010 may be bosses attached to the base plate 1012 by welds, magnetically permeable adhesives, or the like, or the entire assembly may be molded using magnetically permeable powder. FIGS. 12B and 12C show two side plan views of how the transformer legs 1014, 1016, and 1018 are positioned on the base plate. FIG. 13A shows a top plan view of a transformer cap 1020, which is secured to the legs 1014, 1016, and 1018 of the transformer core 1010 to complete the transformer core once the bosses have been inserted through cutouts. The transformer legs 1014, 1016, and 1018 are secured to the transformer cap 1020 by magnetically permeable adhesives, welding or the like. FIGS. 13B and 13C show side plan views of the transformer cap 1020.

In preferred embodiments, the transformer core 1010 and transformer cap 1020 are formed from a ferrite material. The operational frequency range of the core is from about 0.5 to 1.0 MHZ. Also, the initial magnetic permeability is preferably 1400±20%. In addition, the saturation flux density may be 5300 gauss, and the Curie temperature may be 250 degrees Centigrade. The core loss while operating at a frequency of 1 MHZ should preferably be approximately 500 KW/m at 500 gauss. In other embodiments, different core parameters may be used.

In the disclosed embodiments, the base plate 1012 and the transformer cap are dimensioned to be 1.260×1.260×0.075 inches. The secondary transformer leg 1014 is dimensioned to be 0.800×0.200 by 0.060 inches, and each primary transformer leg is 0.133×0.700×0.060 inches. The secondary transformer leg 1014 is positioned away from the primary transformer legs 1016 and 1018, as shown in FIGS. 12A-12C, to maximize the cross-sectional area of each of the transformer legs (i.e., the length and width of the transformer legs). This maximizes a ratio of the cross-sectional area of the transformer legs to the windings, thereby requiring less windings for the same magnetic coupling. Fewer windings means less area of a layer of a circuit board may be used so that the number of layers on the circuit board may be minimized. The improved transformer core also provides this maximized ratio while maintaining the ratio of the secondary to the primary windings at a constant value. However, in alternative embodiments, slightly different dimensions for the core parts may be used. Also, as described in the previous embodiments, the secondary coil is still positioned at a summing point of the primary coils.

Figure 14:
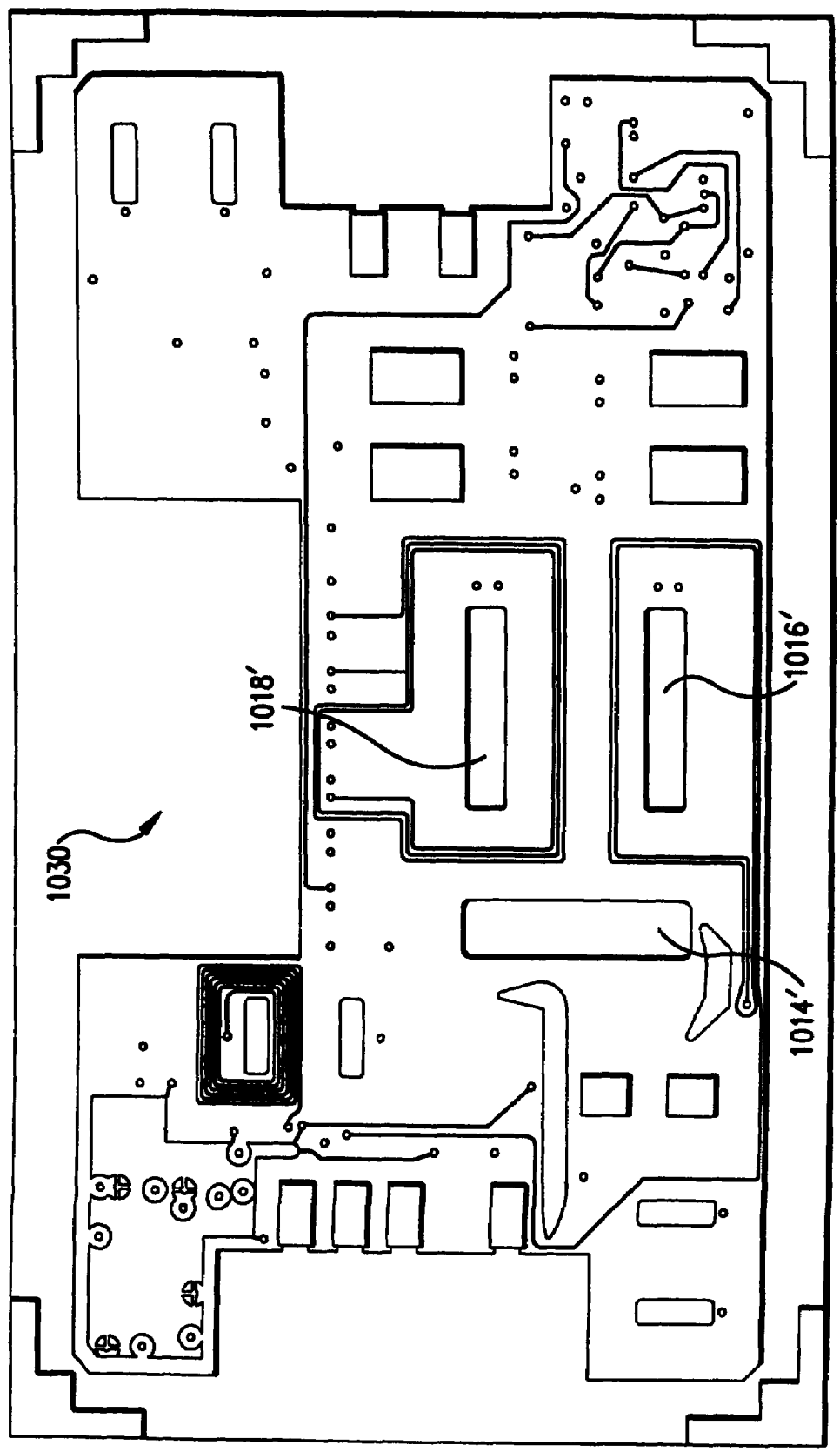
FIG. 14 is a top plan view of a printed circuit board layer, without winding patterns, to be coupled with the transformer core shown in FIGS. 12A-12C.
Figure 15:
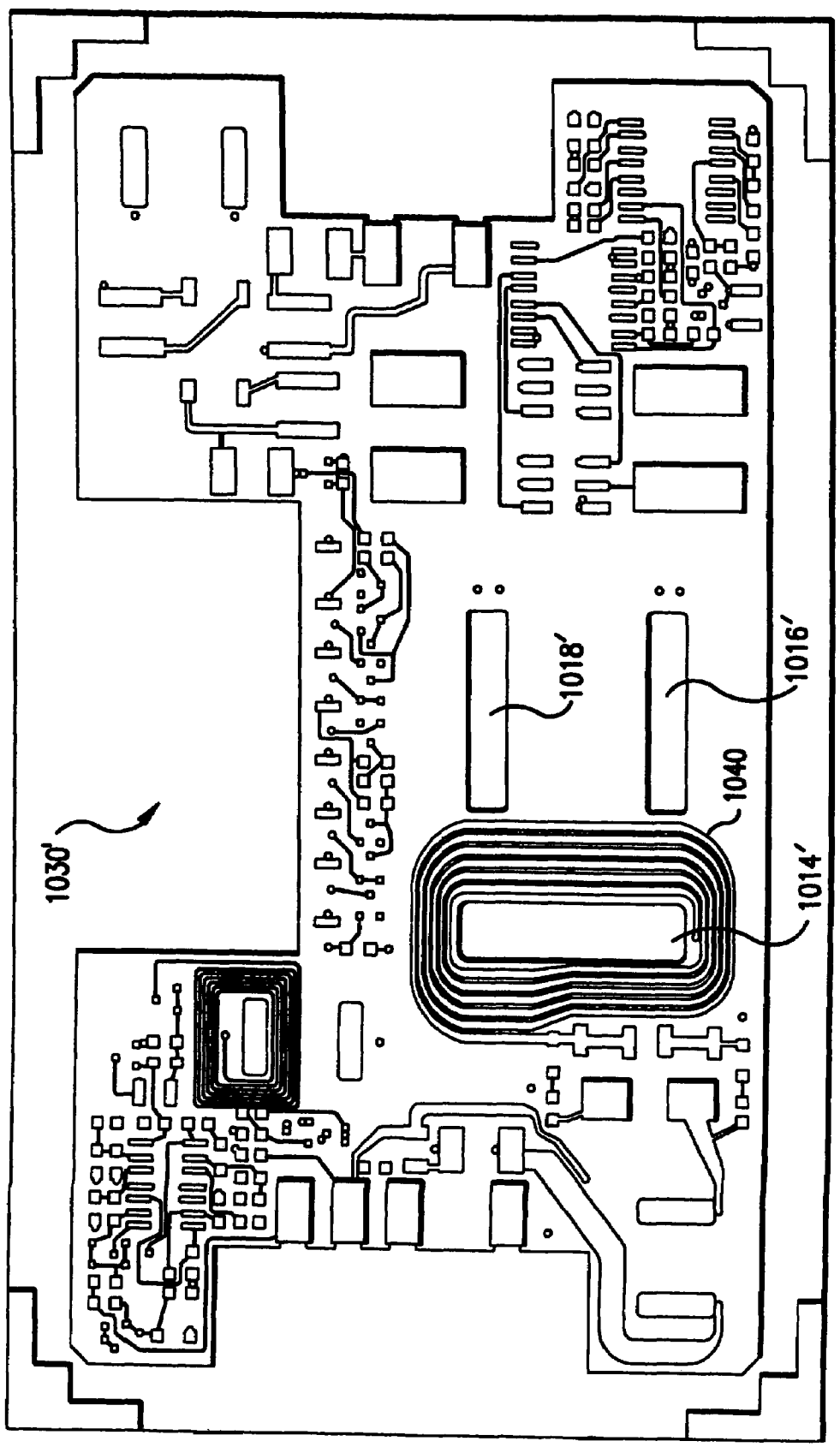
FIG. 15 is a top plan view of another printed circuit board layer showing a secondary winding pattern to be coupled with to the transformer core shown in FIGS. 12A-12C.
Figure 16:
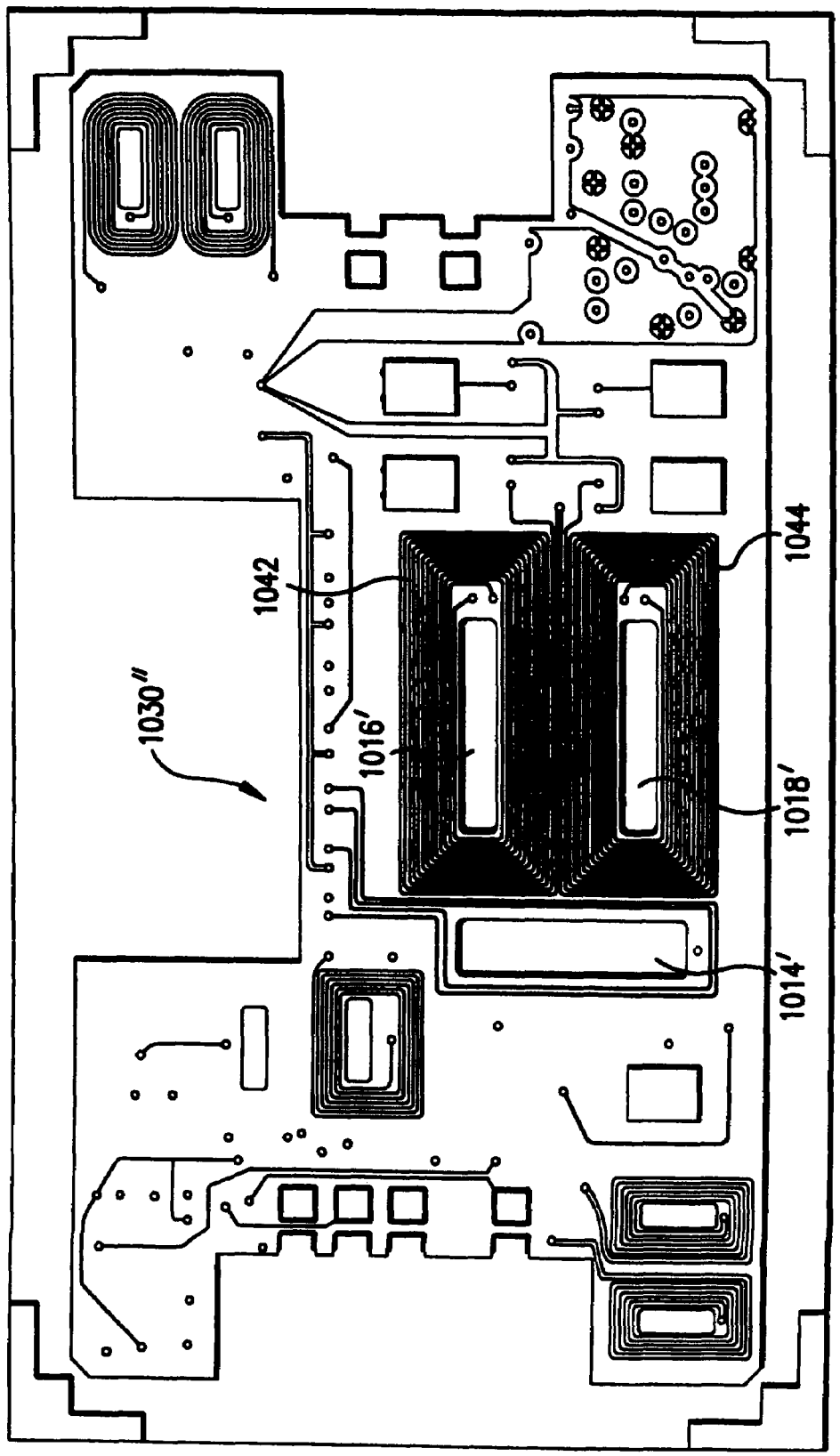
FIG. 16 is a top plan view of another printed circuit board layer showing a primary winding pattern to be coupled with the transformer core shown in FIGS. 12A-12C.
Figure 18A:
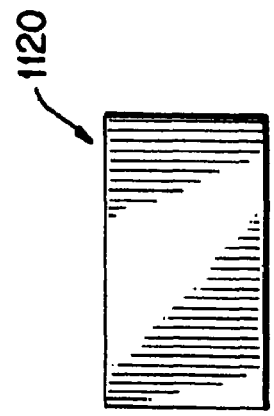
FIGS. 18A-18C are a top plan view and two side plan views of a transformer cap for use with the transformer core shown in FIGS. 17A-17C.
Figure 18B:
Figure 18C:

FIG. 14 shows a printed circuit card layer 1030 without secondary or primary cores attached and having cutouts 1014', 1016' and 1018' to allow the corresponding transformer legs 1014, 1016 and 1018 to pass through the printed circuit board. FIG. 15 shows another printed circuit card layer 1030" in which a secondary coil pattern 1040 surrounding the cut-out 1014' for the secondary transformer leg 1014. FIG. 16 shows still another printed circuit card layer 1030' in which primary coil patterns 1042 and 1044 surround the cut-outs 1016' and 1018' for the to primary transformer legs 1016 and 1018, respectively.

FIGS. 17-22 illustrate an alternative embodiment using two transformer cores 1110 in accordance with the present invention. FIG. 17A shows a top plan view of bottom portion of the transformer core 1110, which is formed by a base plate 1112, a central leg 1114 and a pair of peripheral legs 1116 and 1118. The central leg 1114 and the peripheral legs of the transformer 1110 may be bosses attached to the base plate 1112 by welds, magnetically permeable adhesives, or the like, or the entire assembly may be molded using magnetically permeable powder. FIGS. 17B and 17C show two side plan views of how the transformer legs 1114, 1116, and 1118 are positioned on the base plate 1112. FIG. 18A shows a top plan view of a transformer cap 1120, which is secured to the legs 1114, 1116, and 1118 of the transformer core 1110 to complete the transformer core once the bosses have been inserted through cutouts. The transformer legs 1114, 1116, and 1118 are secured to the transformer cap 1120 by magnetically permeable adhesives, welds or the like. FIGS. 18B and 18C show side plan views of the transformer cap 1120.

In preferred embodiments, the transformer core 1110 and transformer cap 1120 are formed from a ferrite material that has properties and characteristics that are similar to those of the embodiment with the transformer core 1010, discussed above.

Figure 17A:
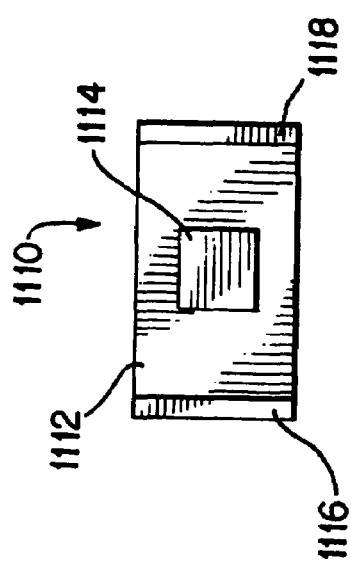
FIGS. 17A-17C are a top plan view and two side plan views of a transformer core in accordance with an alternative embodiment of the present invention.
Figure 17B:
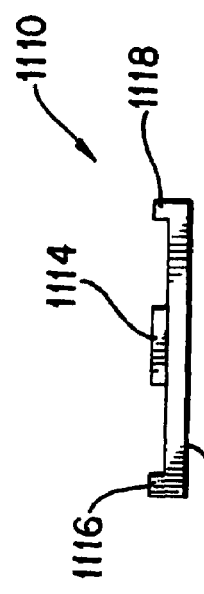
Figure 17C:
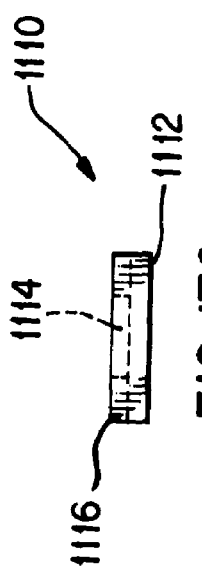

In the disclosed embodiments, the base plate 1112 and the transformer cap 1120 are dimensioned to be 1.113×1.113×0.075 inches. The central transformer leg 1114 is dimensioned to be 0.300×0.300 by 0.060 inches, and each peripheral transformer leg is 0.075×0.630×0.060 inches. The central transformer leg 1114 is positioned away from the peripheral transformer legs 1116 and 1118, as shown in FIGS. 17A-17C, to maximize the cross-sectional area of the central transformer leg 1114 (i.e., the length and width of the central transformer leg). This maximizes a ratio of the cross-sectional area of the central transformer leg 1114 to the windings, thereby requiring less windings for the same magnetic coupling. Fewer windings means less area of a layer of a circuit board may be used so that the number of layers on the circuit board may be minimized. The improved transformer core also provides this maximized ratio while maintaining the ratio of the secondary to the primary windings at a constant value. Also, as described in the previous transformer core 1010 embodiment, the secondary coil is still positioned at a summing point of the primary coils.

Figure 19:
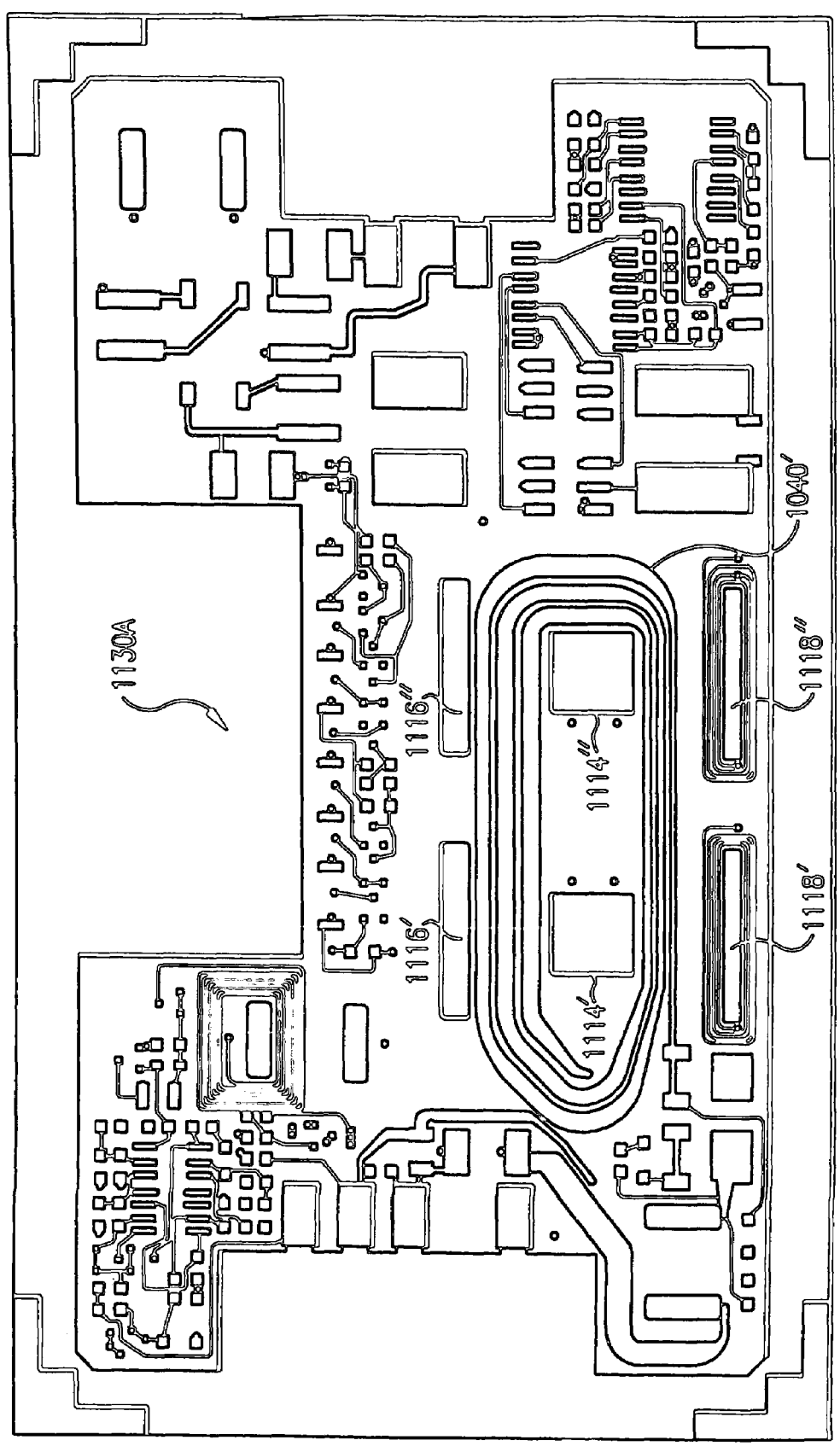
FIG. 19 is a top plan view of a printed circuit board layer with a secondary winding pattern to be coupled with the transformer core shown in FIGS. 17A-17C.
Figure 20:
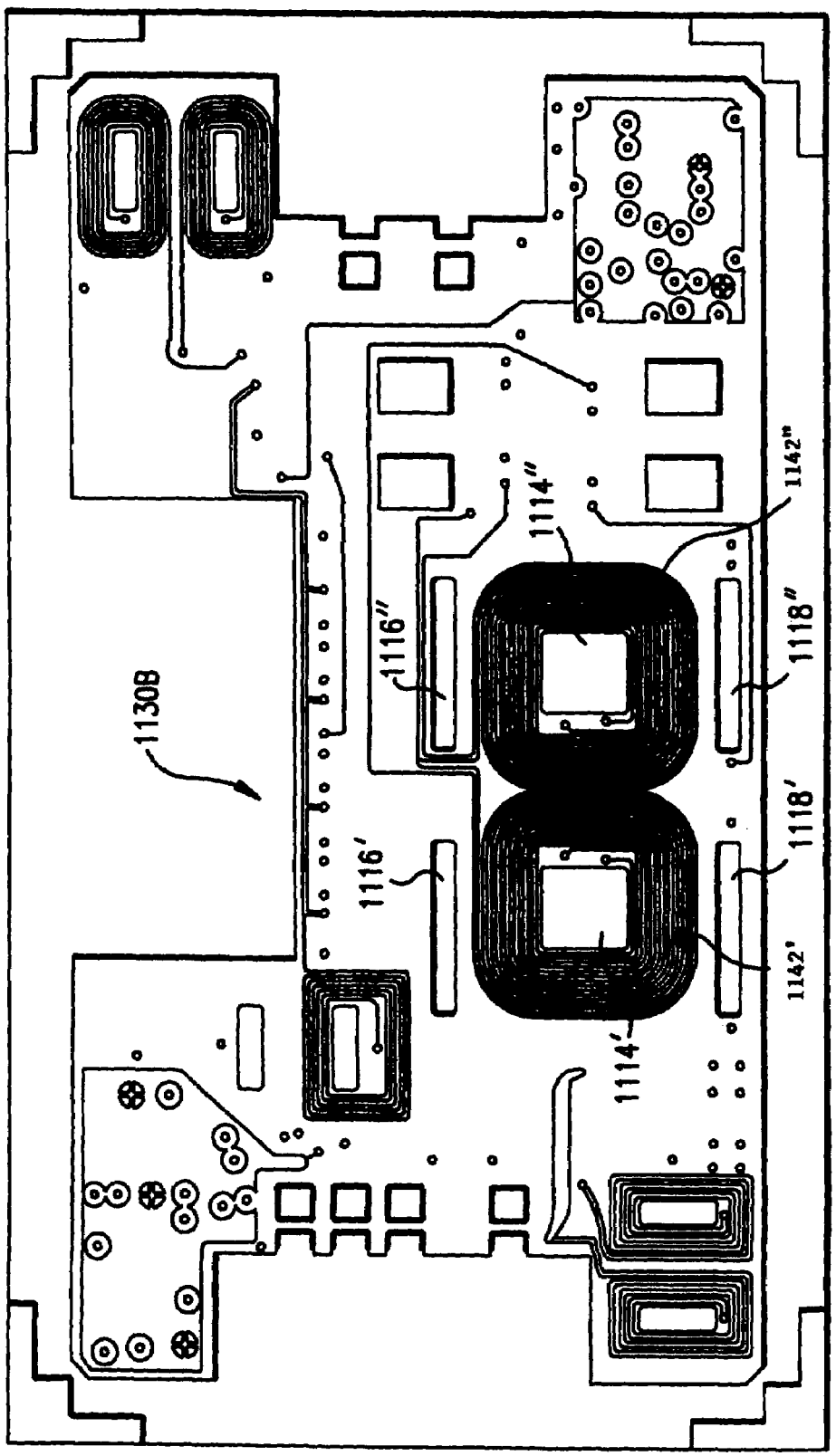
FIG. 20 is a top plan view of another printed circuit board layer showing primary winding patterns to be coupled with the transformer core shown in FIGS. 17A-17C.
Figure 21:
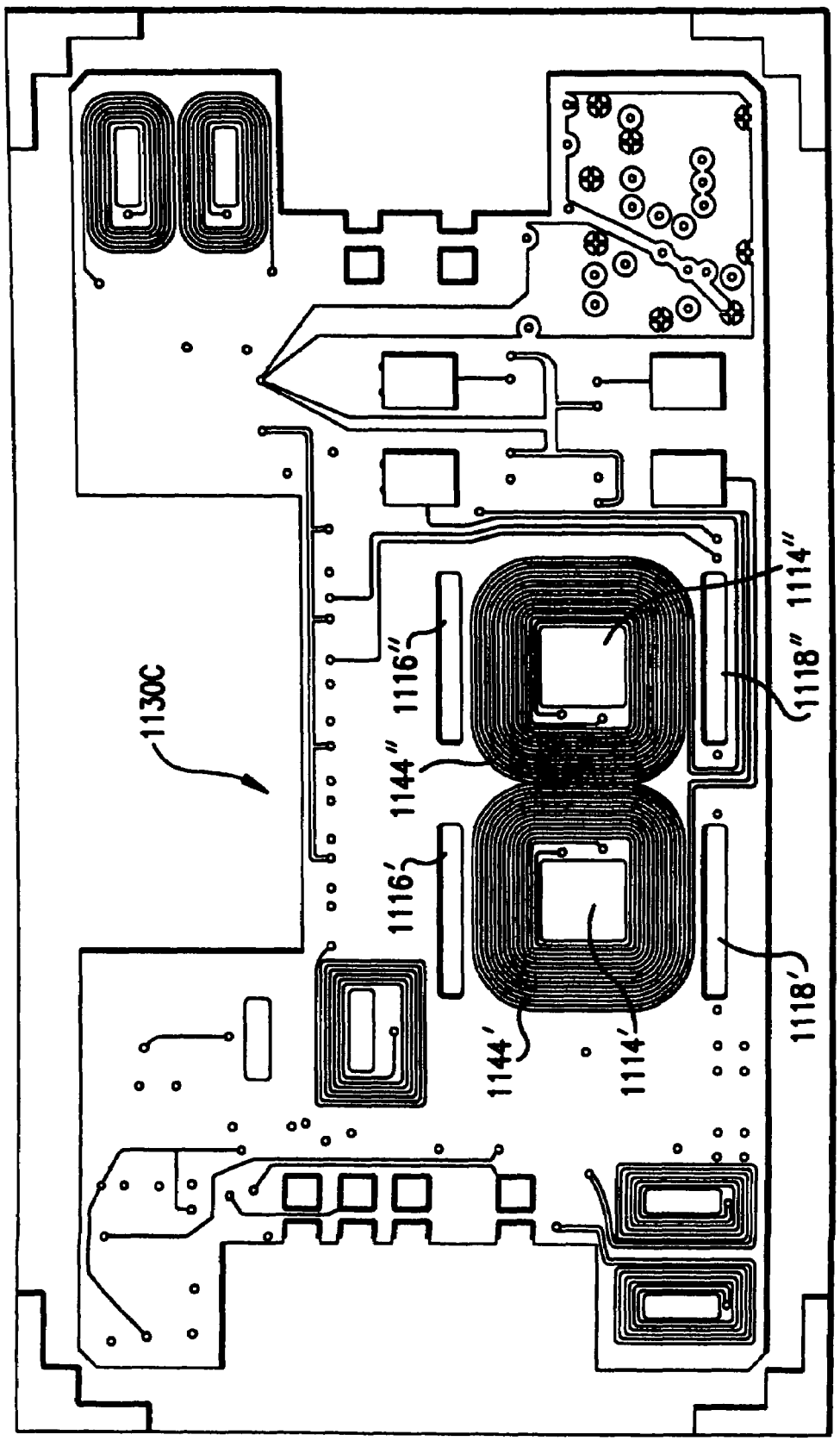
FIG. 21 is a top plan view of another printed circuit board layer showing additional primary winding patterns to be coupled with the transformer core shown in FIGS. 17A-17C.
Figure 22:
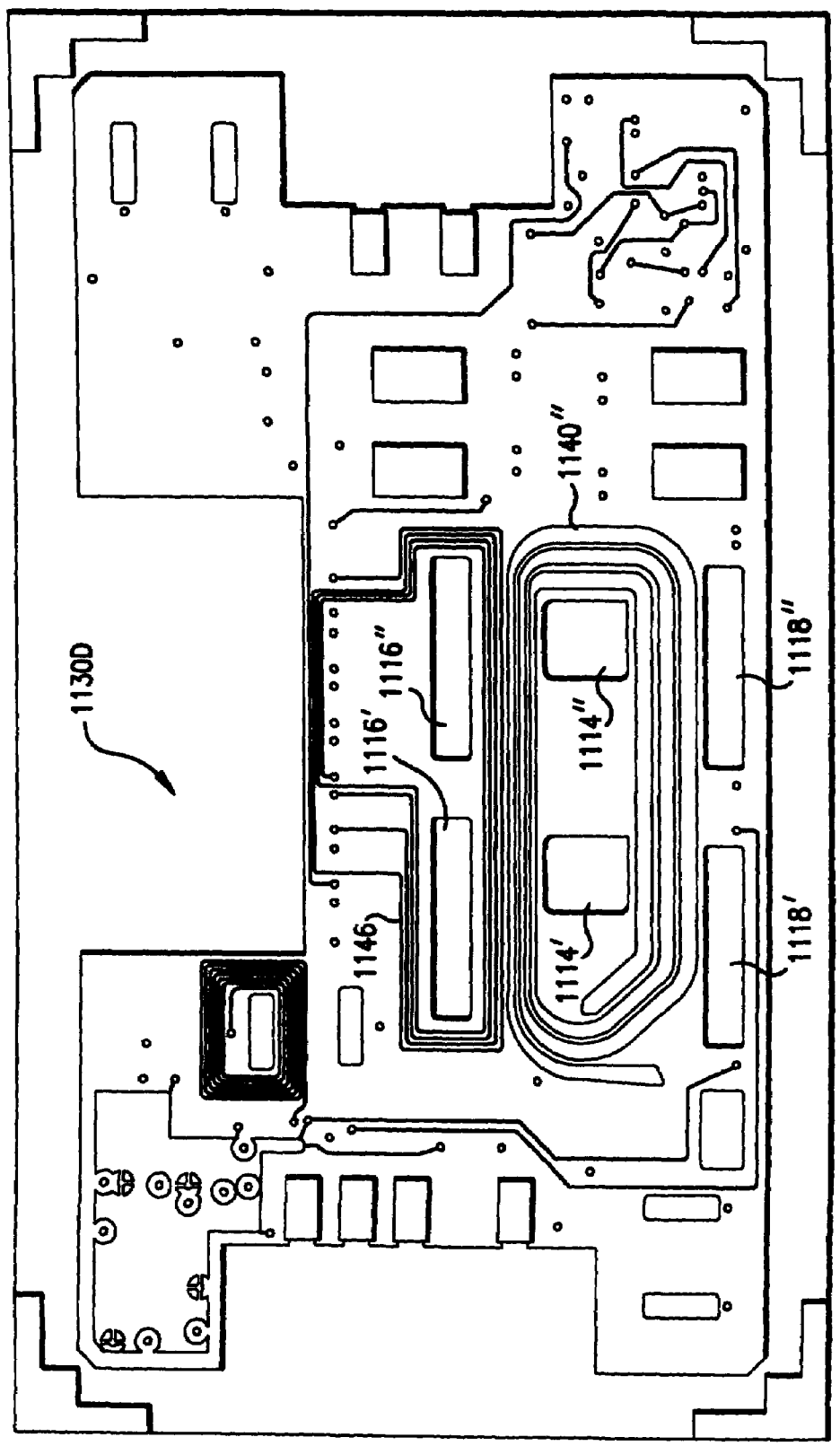
FIG. 22 is a top plan view of another printed circuit board layer showing a another secondary winding pattern to be coupled with the transformer core shown in FIGS. 17A-17C.

FIG. 19 shows a printed circuit card layer 1130A defining a secondary coil 1040' and having cutouts 1114', 1116' and 1118' and cutouts 1114", 1116" and 1118" to allow the corresponding transformer legs 1114, 1116 and 1118 of two transformer cores 1110 to pass through the printed circuit board. The secondary coil pattern 1140' passes around both central leg cutouts 1114' and 1114" to magnetically couple the secondary coil pattern 1040' with the summing point of two primary coils (see FIGS. 20 and 21). FIG. 20 shows another layer 1130B of the printed circuit card in which two primary coil patterns 1142' and 1142" surround the corresponding central cutout 1114' and 1114", respectively. FIG. 21 shows another printed circuit card layer 1130C in which two additional primary coil patterns 1144' and 1144" surround the corresponding central cutout 1114' and 1114", respectively. It should be noted that primary coil patterns 1144' and 1144" are coupled to corresponding primary coil patterns 1142' and 1142" to form the two primary coils that drive the secondary coil. FIG. 22 shows still another printed circuit card layer 1130D in which a secondary coil pattern 1140" surrounds the corresponding central cut-out 1114' and 1114", respectively. It should be noted that secondary coil pattern 1140' is coupled to the corresponding secondary coil pattern 1140" to form the secondary coil that is coupled to the primary coils. Finally, it should be pointed out that the ancillary coil patterns 1146 surrounding the peripheral legs 1116' and 1116" are provided to produce a signal useful for protecting the circuit from over voltage.

Figure 11:
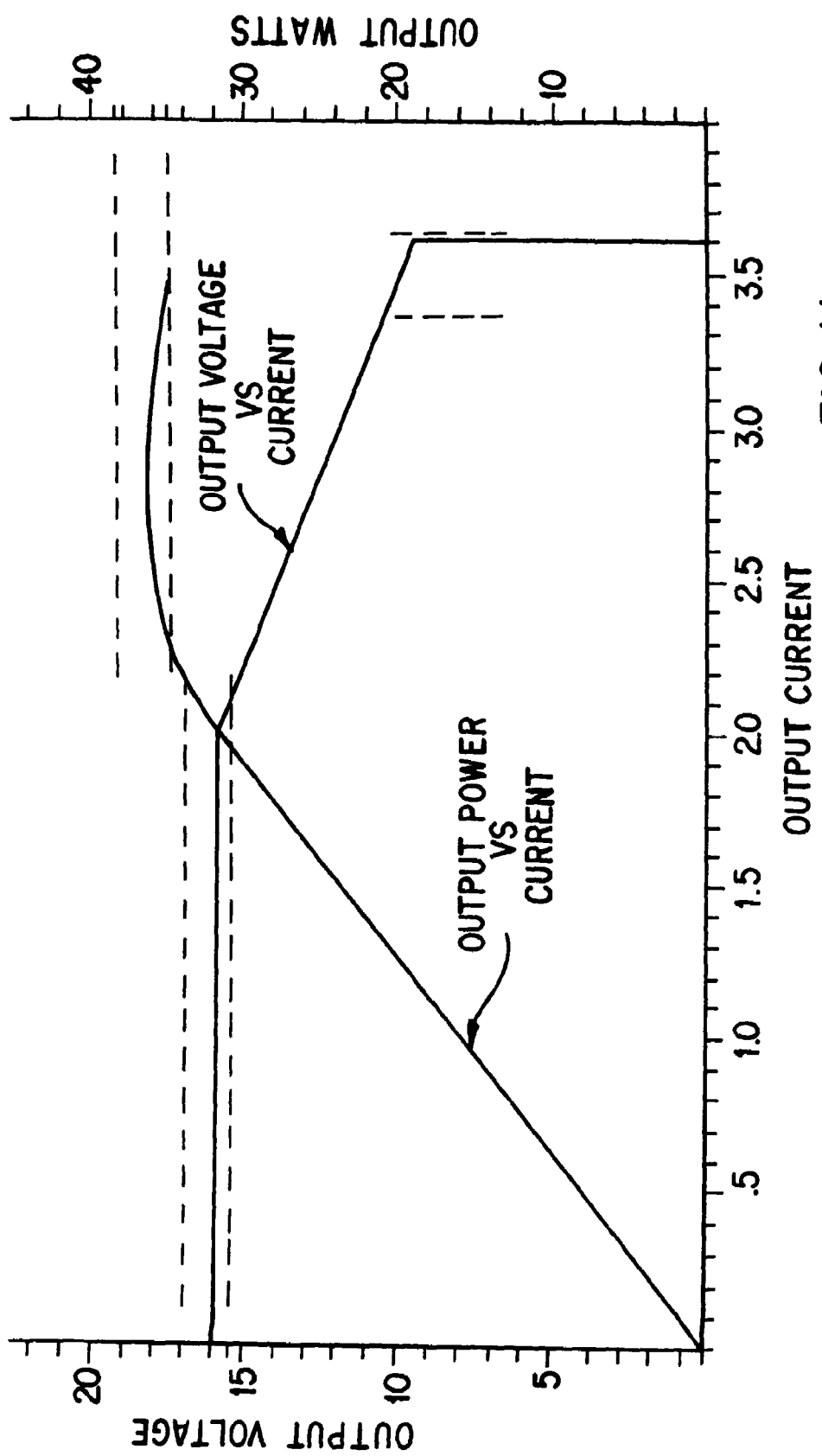
FIG. 11 is a power versus output current curve and an output voltage versus current curve of a power supply in accordance with an embodiment of the present invention.

The applicant has found that this characteristic power and current curve provides good charging of lithium ion, nickel metal hydride, nickel cadmium and other rechargeable batteries. Thus, the small form factor power supply is capable of supplying sufficient power to a personal computer or the like, even when the batteries are thoroughly discharged. The constant current at the output connectors 846, 848 can provide minimal voltages down to about less than one volt because the controller U1 can attain relative phase shifts between the drive signal pairs to between about one degree to one hundred eighty degrees (i.e., signal N lags signal L between about one degree to one hundred eighty degrees and signal O and lags signal M between about one degree and one hundred eighty degrees). Thus, as shown in FIG. 11, if one were to draw a power versus output current curve and an output voltage versus output current curve of such a power supply, the slope of the output voltage curve is relatively constant until the output current reaches approximately 2.0 amperes, then slopes down to 10 volts at which time the output current is essentially constant at approximately 3.6 amperes for voltages under 10 volts. The output power curve increases relatively linearly until the current level reaches approximately 2.2 amperes, at which time the output power curve tends to level off until the current reaches it maximum value of approximately 3.6 amperes. Therefore, the power supply is capable of providing constant current to the personal computer or the like, even if the battery is only capable of producing a fraction of a volt. This power curve is determined as a result of the selected amplifier configuration associated with integrated circuit U3, which may be an LM 324 on the secondary side 826. The predetermined limit may be as high as 75 watts DC for a power supply having an upper and lower surface area within the case 300 of about 14 square inches and a thickness of about 0.436 inches or less so that the ratio of the top or bottom surface areas to the thickness is about 30:1.

Figure 7C:
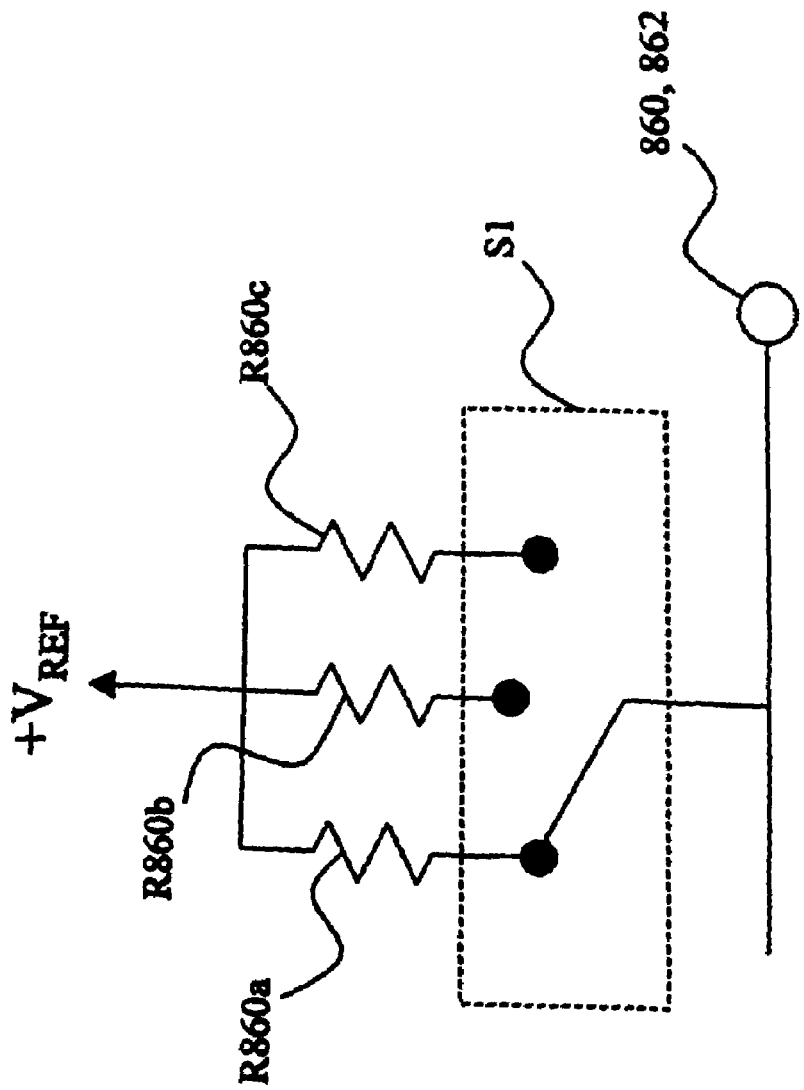
FIG. 7C is a schematic diagram of a switch mechanism that may be used to select a resistor from among a plurality of resistors in order for the power supply to produce a desired output voltage or output current.

However, the circuit can readily be programmed to provide other power/current characteristics, such as the power characteristics for lap top computers, appliances, cellular or portable telephones, notebook computers, game systems or the like. This may be accomplished by coupling additional resistors to ground and/or +5 volts (generated by a voltage regulator U4) to the current control and voltage control inputs. FIG. 7B shows such an embodiment, with resistors R860 and R862 connected between Vref (produced by the voltage regulator U4) and current control input 860 and voltage control input 862, respectively. In embodiments of the invention, multiple resistors such as resistors R860 and R862 may be selectively connected between ground or a regulated voltage, such as the +5 volts produced by the voltage regulator U4 (as shown in FIG. 7C), and the current control input 860 or voltage control input 862. In the embodiment shown in FIG. 7C, a switch S1 may be used to select which one of the resistors R860a, R860b and R860c is connected between the regulated voltage and a control input CI, which may be a current control input 860 or a voltage control input 862, in order to control the output voltage or output current of the power supply. The switch S1 may be a mechanical switch, a transistor switch, a logic gate or the like and may receive an input signal to control which of the resistors R860a, R860b and R860c is selected.

In embodiments of the invention, the power supply may be used to power a variety of electrical appliances with varying input voltage and input current requirements by attaching various connectors to interface with the output connection terminal of the power supply and the input connection terminal of the appliance. These connectors may have a common type of input interface adapted to mate with the output connection terminal of the power supply but differing types of output interfaces adapted to mate with the input terminals of particular appliances. At the same time, a resistor from among resistors R860a, R860b and R860c may be selected to provide a particular output voltage or output current required by a particular electrical appliance.

In embodiments of the invention, a resistor indicator (e.g., a color or symbol element associated with the connection of a selected resistor) may correspond to a connector characteristic to ensure that the selected connector and selected resistor match a particular appliance to be powered. For example, where a particular type of cellular phone is to be powered, the connector corresponding to that type of phone may be colored blue. Text associated with the mechanical switch setting corresponding to the resistor to be connected for powering that type of phone may also be colored blue. The user may be instructed to match the color of the mechanical switch setting to the color of the connector fitting the appliance input connection terminal. Alternatively, the connector and switch setting may both be marked with a symbol associated with a cellular telephone, the connector may be marked with an indication of a corresponding switch setting (such as a switch position number), a light may be activated or changed in color when the selected connector and selected resistor match, or the like.

In embodiments of the invention, resistors and/or a resistor-and-switch combination similar to the one shown in FIG. 7C may be incorporated into connectors that interface between the power supply and the electronic appliance as described hereinafter. As in embodiments in which a switch is included as part of the power conversion circuit, the switch may be mechanical or electronic (e.g., a transistor-based switch or logic gate). In embodiments in which an electronic switch is used, the resistor selection may be based upon an input signal received by the switch.

Figure 23:
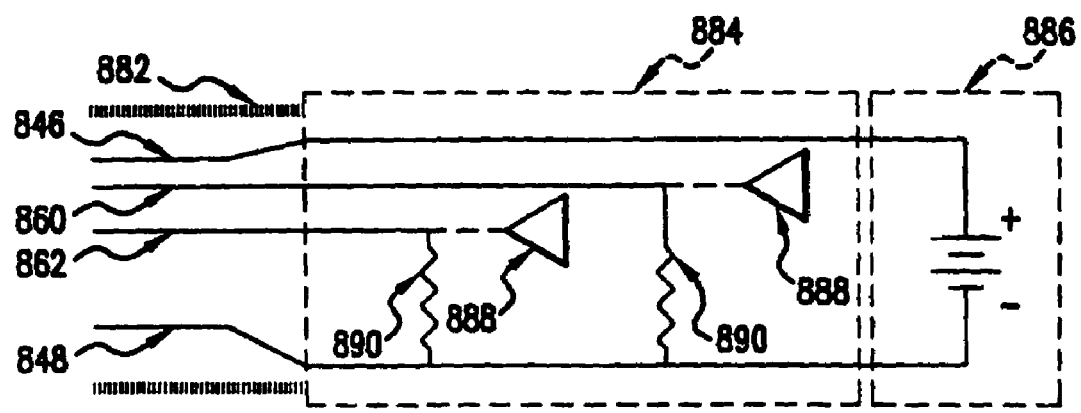
FIG. 23 is a schematic of a control circuit in accordance with an embodiment of the present invention.

Alternatively, as shown in FIG. 23, the current control input 860 and voltage control input 862 (see FIG. 7) can be coupled through a cable 882 to control circuits 884 commonly contained within the rechargeable batteries 886 coupled to the DC output connectors 846 and 848. These control circuits 884 may contain amplifiers 888, resistors 890, digital to analog converters or any other analog signal generator that may be coupled to the current and voltage control inputs 860, 862 through the cable 882 coupled to the battery terminals for charging. This would permit the controller in the battery programmatically to regulate the voltage and the current provided at the DC output to minimize recharging time based upon the known characteristics of the battery.

Preferably, the programming of the small form factor power supply is carried out using either resistive programming or analog programming. However, in alternative embodiments, other programming methods may be employed, such as digital or microprocessor controlled programming (with or without resistance ladder networks), with the type of programming technique being dependent on the power requirements of the device.

Figure 26:
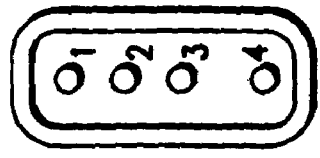
FIG. 26 is an end view of a connector that mates with the small form factor power supply and is useable to program the small form factor power supply.
Figure 25:
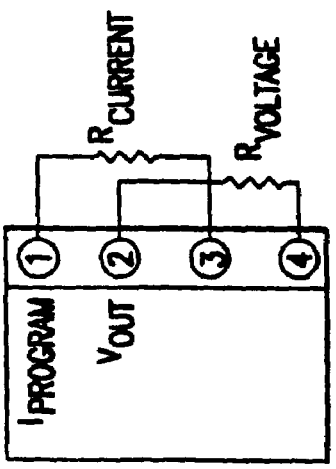
FIG. 25 is a schematic of another programming circuit in accordance with an embodiment of the present invention that is used to digitally program the power supply to produce between 16 and 18 volts.
Figure 24:
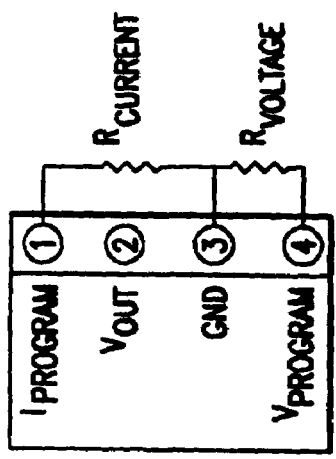
FIG. 24 is a schematic of a programming circuit in accordance with an embodiment of the present invention that is used to digitally program the power supply to produce between 0 and 16 volts.

FIG. 24 is a schematic of a programming circuit in accordance with an embodiment of the present invention that is used to resistively program the power supply to produce between 0 and 16 volts, and FIG. 25 is a schematic of another programming circuit in accordance with an embodiment of the present invention that is used to resistively program the power supply to produce between 16 and 18 volts. FIG. 26 is an end view of a connector that mates with the small form factor power supply (shown in FIGS. 3 and 7) and is useable to program the small form factor power supply, as shown in FIGS. 24 and 25.

As shown in FIGS. 24 and 25, the power supply may be programmed remotely to provide the required power at voltages between 0 to 18 volts using various external cables having built in resistances that program the power supply to output the required power level (i.e., voltage and current). This method allows the small form factor power supply to be programmed for any value of voltage and/or current by connecting a resistor from the voltage and/or current programming pins (e.g., pins 1 and 4) to ground (e.g., pin 3) as shown in FIG. 24, or from the voltage programming pin (e.g., pin 1) to V$_{OUT}$ (e.g., pin 4) for voltages above 16 volts as shown in FIG. 25.

To program the voltage between zero and 16 volts, as shown in FIG. 24, the following formula is used:

$$R = \frac{10(V_{OUT})}{16(V_{OUT})}$$

where R=the programming resistance between pins 3 and 4 (in Kohms); and where V$_{OUT}$=output voltage.

To program the output voltage between 16 and 18 volts, as shown in FIG. 25, the following formula is used:

$$R = \frac{10(V_{OUT})}{V_{OUT} - 16}$$

where R=the programming resistance between pin 2 and 4 (in Kohms); and where V$_{OUT}$=output voltage.

To program the output current between 0 and 3.6 amps, as shown in FIGS. 24 and 25, the following formula is used:

$$R = \left(\frac{I_{OUT} + 4.133}{3.647 - I_{OUT}}\right) \times 7.823$$

where R=programming resistance between 1 and 3 (in Kohms); and where I$_{OUT}$=output current In another method, analog programming of the small form factor power supply is used.

This method allows the small form factor power supply to be programmed for any value of voltage and/or current by providing an analog voltage signal from the respective programming pins and ground.

To program the output voltage between 0 and 18 volts, the following formula is used: where $$V_P = \frac{V_{OUT}}{3.2}$$

V$_P$=programming voltage applied to pin 4 with respect to pin 3; and where V$_{OUT}$=output voltage.

To program the output current between 0 and 3.6 amps, the following formula is used:

$$I_P = \left(\frac{I_{OUT}}{1.238}\right) + 1.68$$

where I$_P$=programming voltage applied to pin 1 with respect to pin 3; and where I$_{OUT}$=output current.

In addition, the power supply may interface with a programmable current generator interface, such as an MC33340 fast charge battery controller manufactured by Motorola, Inc. of Schaumberg, IL or a BQ2002C manufacture by Benchmarq, Dallas, Tex. This allows the cable to directly interface with the power supply, while performing the functions of charge termination or trickle charging. In preferred embodiments, there is a ½ power factor available. The cable includes a chip that is adapted to work with a specific device, such as a cellular telephone, laptop computer or the like, so that the charging characteristics of the power supply are altered as needed by simply changing cables. Alternatively, a generic cable can be used and an adapter may be connected to the power supply between the cable and the power supply that contains different resistors that program the power supply to provide a desired power supply. Typically, precise charge termination is difficult to detect when the battery reaches saturation. Thus, preferred embodiments of the present invention detect the knee of the power curve shown in FIG. 11 and reduce the current to deliver at a more steady rate.

FIGS. 27(a)-34(c) show various cables with connectors in accordance with embodiments of the present invention that program the small form factor power supply for supplying power to different devices. These cables have a connector 1500 for connecting with the small form factor power supply and use various configurations of resistances and wire connections to program the small form factor power supply to work with various devices. In these figures, NC=no connection, +DC=V$_{OUT}$ (e.g., from pin 2 of FIG. 26), CC=I$_{program}$ (e.g., from pin 1 of FIG. 26), VC=V$_{program}$ (e.g., from pin 4 of FIG. 26), and GND=ground (e.g., from pin 3 of FIG. 26). FIGS. 27(a)-27(c) show views of a cable 1502 having a connector 1504 for use with IBM computers, such as the "ThinkPad" or the like. No resistances are provided in the connectors 1500 and 1504, since the IBM computers provide their own power regulation, and the pins from the small form power supply (e.g., FIG. 27(c)) are converted to a compatible connector and pin out, as shown in FIG. 27(b). FIGS. 28(a)-28(c) show views of a cable 1506 having a connector 1508 for use with IBM computers, such as the "ThinkPad" or the like, and for Compaq computers, such as the Armada or the like. No resistances are provided in the connectors 1500 and 1508, since the IBM and Compaq computers provide their own power regulation, and the pins from the small form power supply (e.g., FIG. 28(c)) are converted to a compatible connector and pin out, as shown in FIG. 27(b). FIGS. 29(a)-29(c) show views of a cable 1510 having a connector 1512 for use with for Compaq computers, such as the Contura, LTE or the like, Toshiba computers, such as the Satellite and the Protege, Gateway computers, such as the Solo, and Hitachi computers, such as the C120T and the like. Either the connector 1500 or the connector 1512 use resistances between pins 2 and 4 of the small form factor power supply to program the small form factor power supply. FIGS. 30(a)-30(b) show views of a cable 1514 that does not have a connector. The end 1516 of the cable 1514 is left with bear wires to be configured to work with various computers that don't use the resistances or connectors shown in the other cables. Since the cable 1514 has no end connector, it can be wired to match various computer configurations. FIGS. 31(a)-31(c) show views of a cable 1518 having a connector 1520 for use with another configuration of a computer. Either the connector 1500 or the connector 1520 use resistances between pins 1, 3 and 4 of the small form factor power supply to program the small form factor power supply. FIGS. 32(a)-32(c) show views of a cable 1522 having a connector 1524 for use with Hewlett Packard computers, such as the Omnibook or the like. Either the connector 1500 or the connector 1524 use resistances between pins 3 and 4 of the small form factor power supply to program the small form factor power supply. FIGS. 33(*a*)-33(*c*) show views of a cable 1526 having a connector 1528 for use with Toshiba computers, such as the Tecra or the like. Either the connector 1500 or the connector 1528 use resistances (having a different value than those for cable 1522) between pins 3 and 4 of the small form factor power supply to program the small form factor power supply. FIGS. 34(*a*)-34(*c*) show views of a cable 1530 having a connector 1532 that is designed to be a universal cable that accepts various connector ends that can mate with different device. No resistances are provided in the connectors 1500 and 1532, since the cable 1530 is converted to be compatible with various devices based on the connector adapters connected to the connector 1532.

Figure 39B:
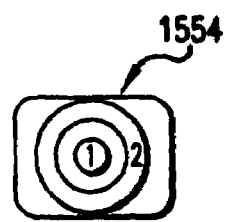
Figure 39A:
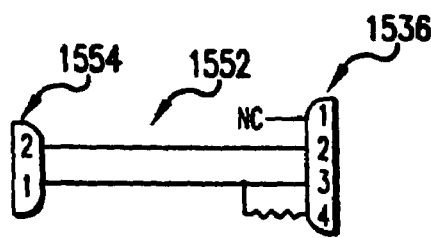
Figure 39C:
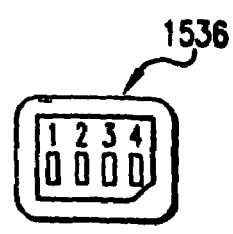
Figure 40B:
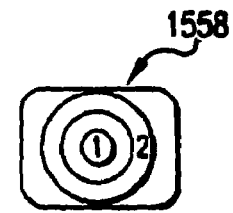
Figure 40A:
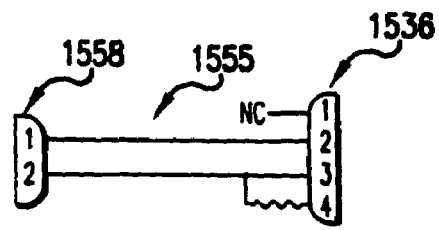
Figure 40C:
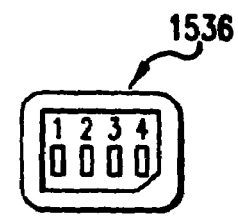

FIGS. 35(*a*)-40(*c*) show various connector adapters for use with the female connector 1532 of the cable 1530 shown above in FIGS. 34(*a*)-34(*c*). FIGS. 35(*a*)-35(*c*) show a connector adapter 1534 having a male connector 1536 for connecting with the connector 1532 and has an end connector 1538 that converts the generic cable 1530 of FIGS. 34(*a*)-34(*c*) to correspond to the cable 1502 shown in FIGS. 27(*a*)-27(*c*). FIGS. 36(*a*)-36(*c*) show a connector adapter 1540 having connectors 1536 and 1542 that convert the generic cable 1530 of FIGS. 34(*a*)-34(*c*) to correspond to the cable 1506 shown in FIGS. 28(*a*)-28(*c*). FIGS. 37(*a*)-37(*c*) show a connector 1544 having connectors 1536 and 1546 that convert the generic cable 1530 of FIGS. 34(*a*)-34(*c*) to correspond to the cable 1510 shown in FIGS. 29(*a*)-29(*c*). FIGS. 38(*a*)-38(*c*) show a connector adapter 1548 having connectors 1536 and 15505 that convert the generic cable 1530 of FIGS. 34(*a*)-34(*c*) to correspond to the cable 1518 shown in FIGS. 31(*a*)-31(*c*). FIGS. 39(*a*)-39(*c*) show a connector adapter 1552 having connectors 1536 and 1554 that convert the generic cable 1530 of FIGS. 34(*a*)-34(*c*) to correspond to the cable 1522 shown in FIGS. 32(*a*)-32(*c*). FIGS. 40(*a*)-40(*c*) show a connector adapter 1556 having connectors 1536 and 1558 that convert the generic cable 1530 of FIGS. 34(*a*)-34(*c*) to correspond to the cable 1526 shown in FIGS. 33(*a*)-33(*c*).

Figure 41B:
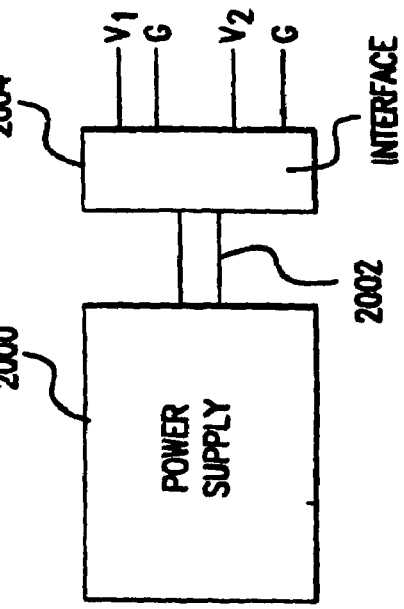
FIGS. 41(a) and 41(b) illustrate a block diagram and a schematic of an interface for providing power to more than one device at a time.
Figure 41A:
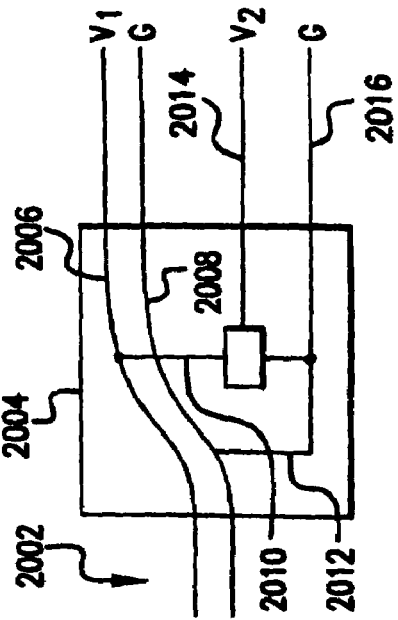

FIGS. 41(*a*) and 41(*b*) illustrate a block diagram and a schematic of an interface for providing power to more than one device at a time. As shown in FIG. 41(*a*), a small form factor power supply 2000 is connected through a cable 2002 to an interface 2004 that supports more than one device at a time by the power supply. The interface 2004 can support two or more devices, with the number of devices being dependent on the number of power output ports. The power to each device is controlled by cable connections to each device, such as the cables and connectors described above in FIGS. 27(*a*)-40(*c*). As shown in FIG. 41(*b*), the interface 2004 receives the cable 2002, which has a first voltage wire 2006 providing a first voltage V1 and a second voltage wire 2008 providing ground G. This is generally connected to the primary device. Additional devices are connected to wires 2006 and 2008 through taps 2010 and 2012. Tap 2012, if necessary, feeds into a voltage regulator to change the voltage to that desired by the device and outputs a second voltage on wire 2014 and ground on wire 2016. In alternative embodiments, the additional regulator may be provided in the cable used for each device.

Figure 42:
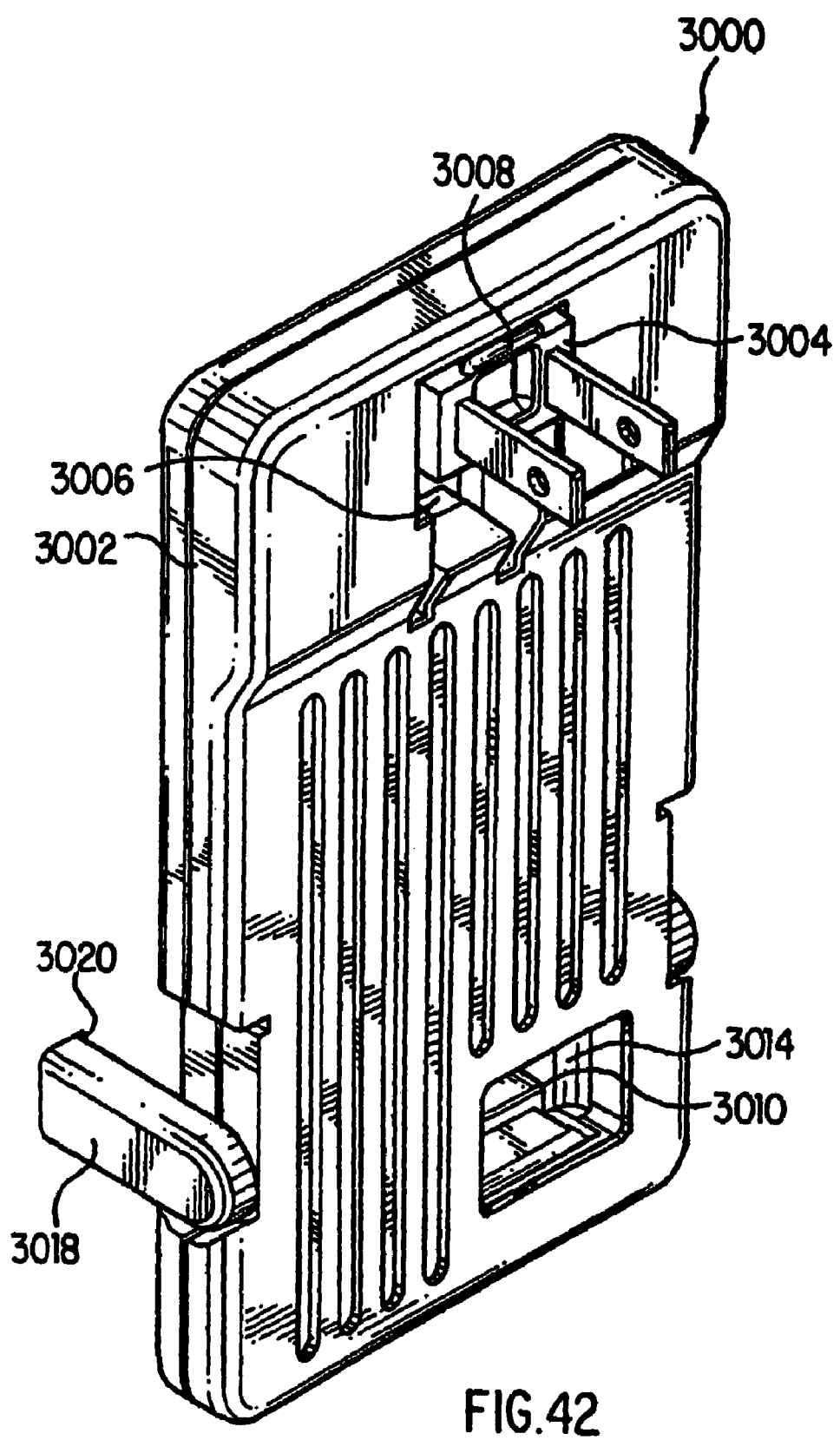
FIG. 42 shows a top and rear perspective view of a small form factor power supply for use with portable telephone equipment.
Figure 43:
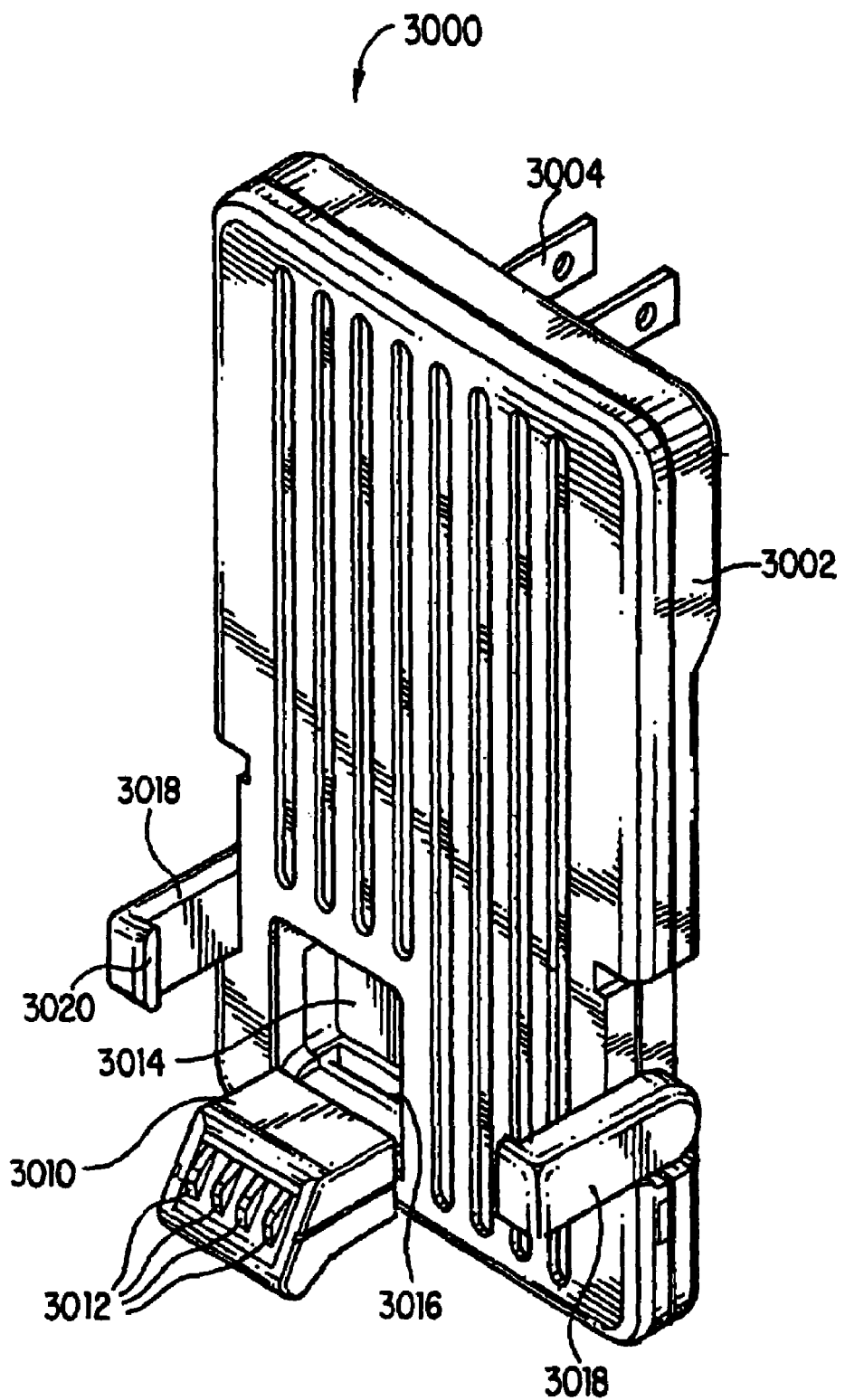
FIG. 43 shows a top and front perspective view of the small form factor power supply shown in FIG. 42.
Figure 44:
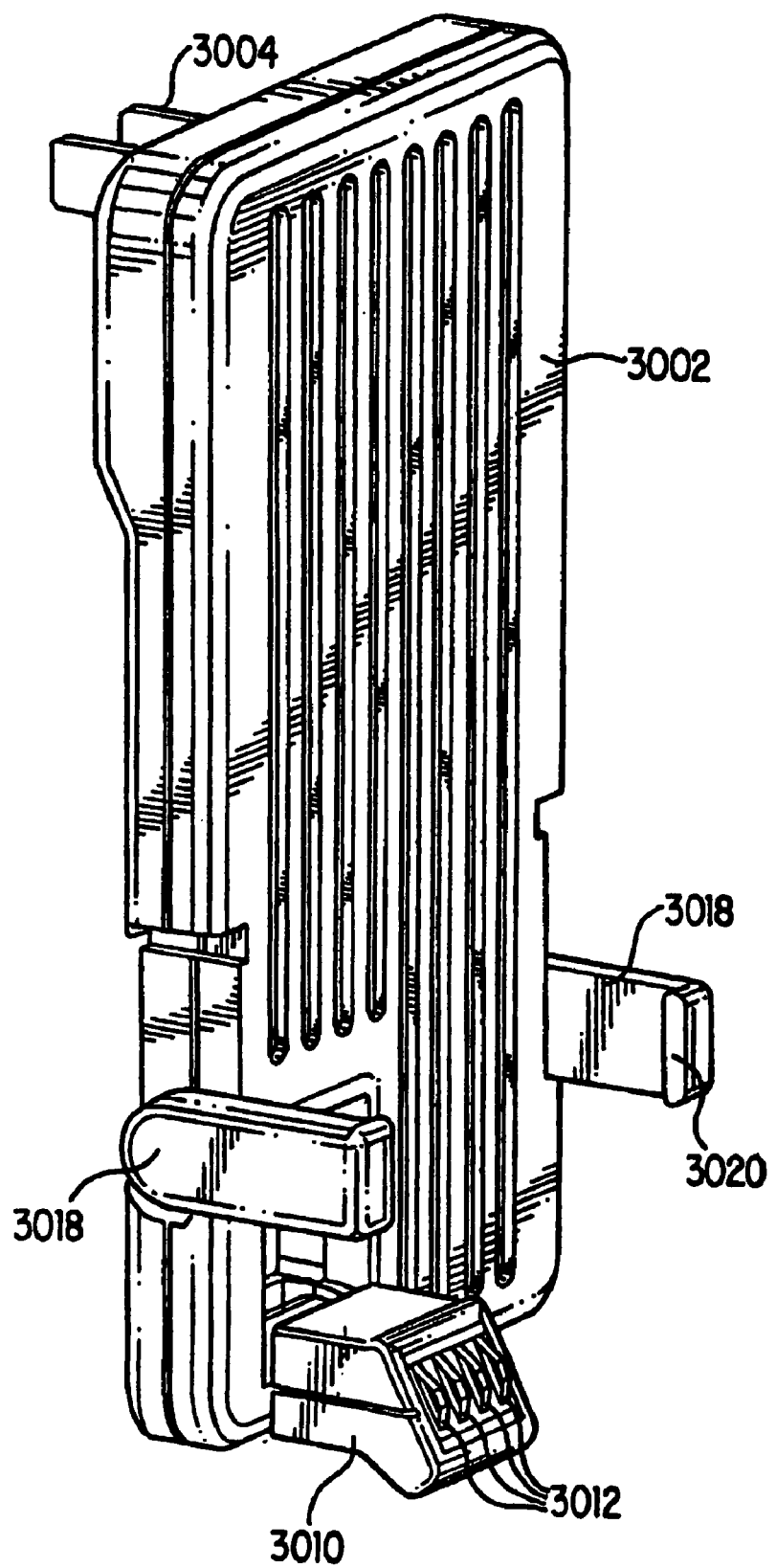
FIG. 44 shows a bottom and front perspective view of the small form factor power supply shown in FIG. 42.
Figure 45:
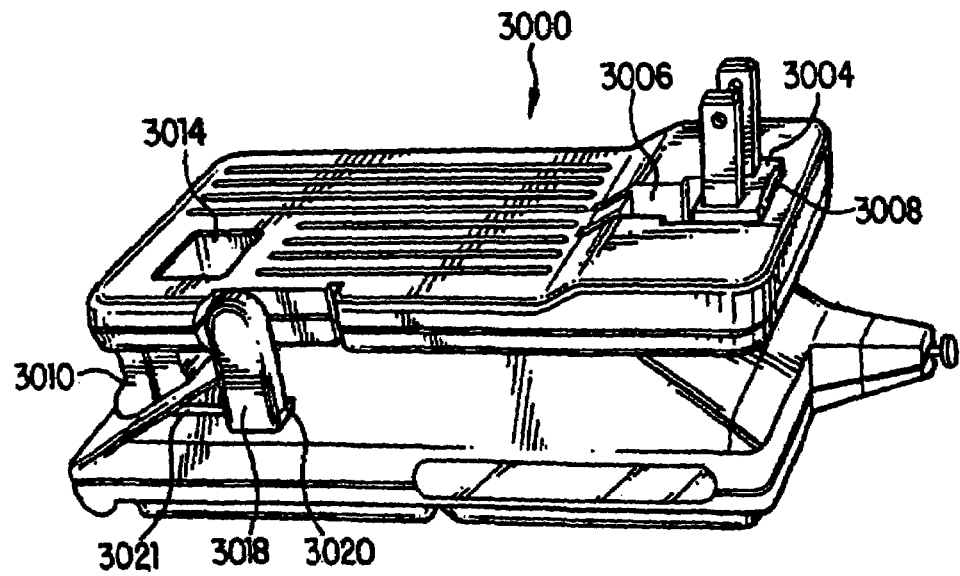
FIG. 45 shows a side perspective view of the small form factor power supply shown in FIGS. 42-44 connected to a cellular telephone battery and telephone.
Figure 46:
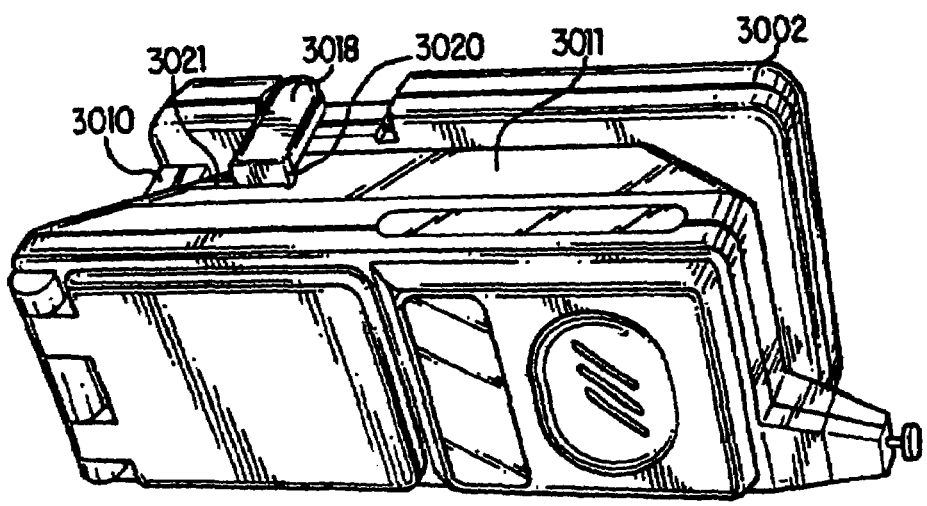
FIG. 46 shows a top front perspective view of the small form factor power supply shown in FIGS. 42-44 connected to a cellular telephone battery and telephone.
Figure 47:
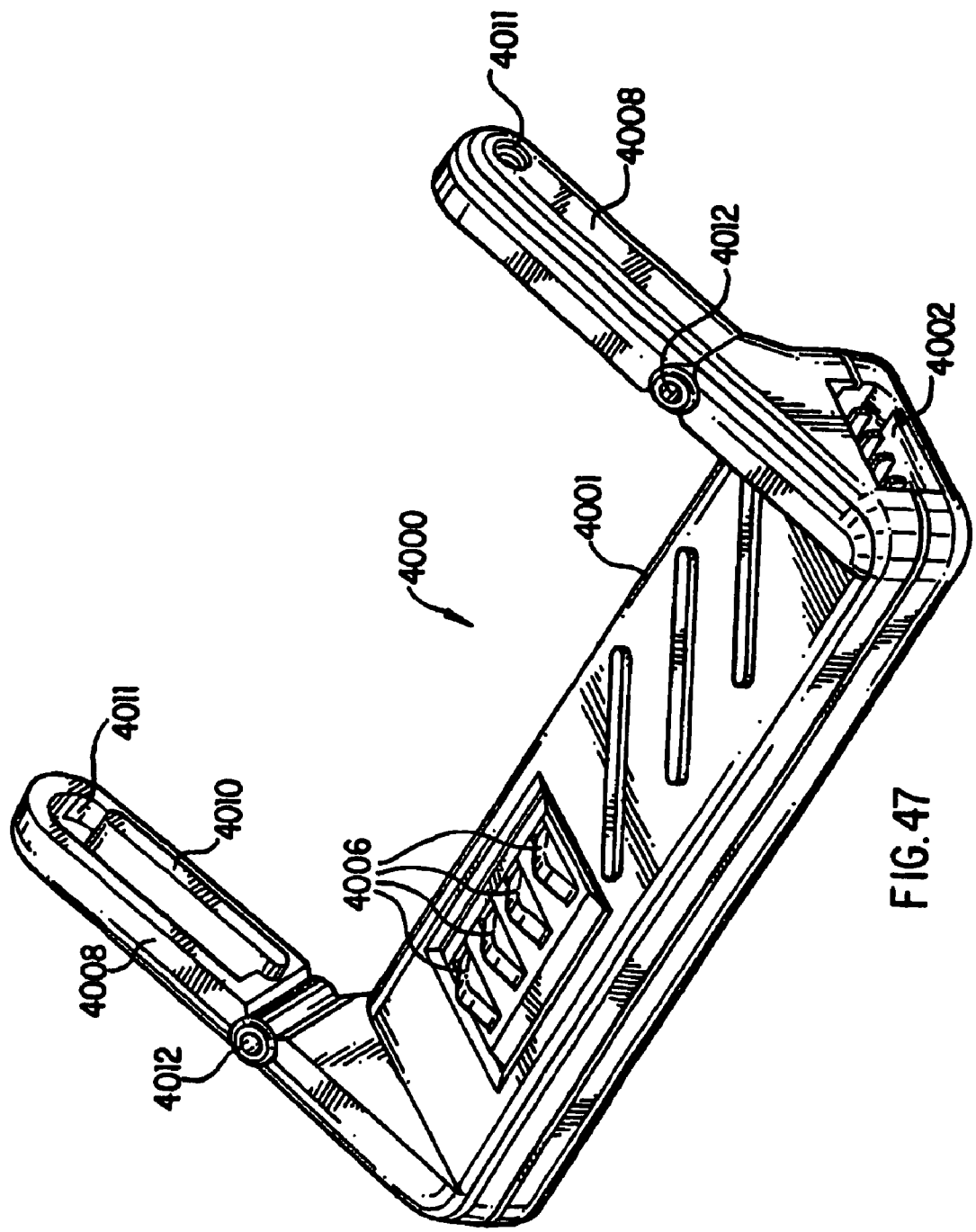
FIG. 47 shows a top and front perspective view of a small form factor power supply adapter connector for use with portable telephone equipment.
Figure 48:
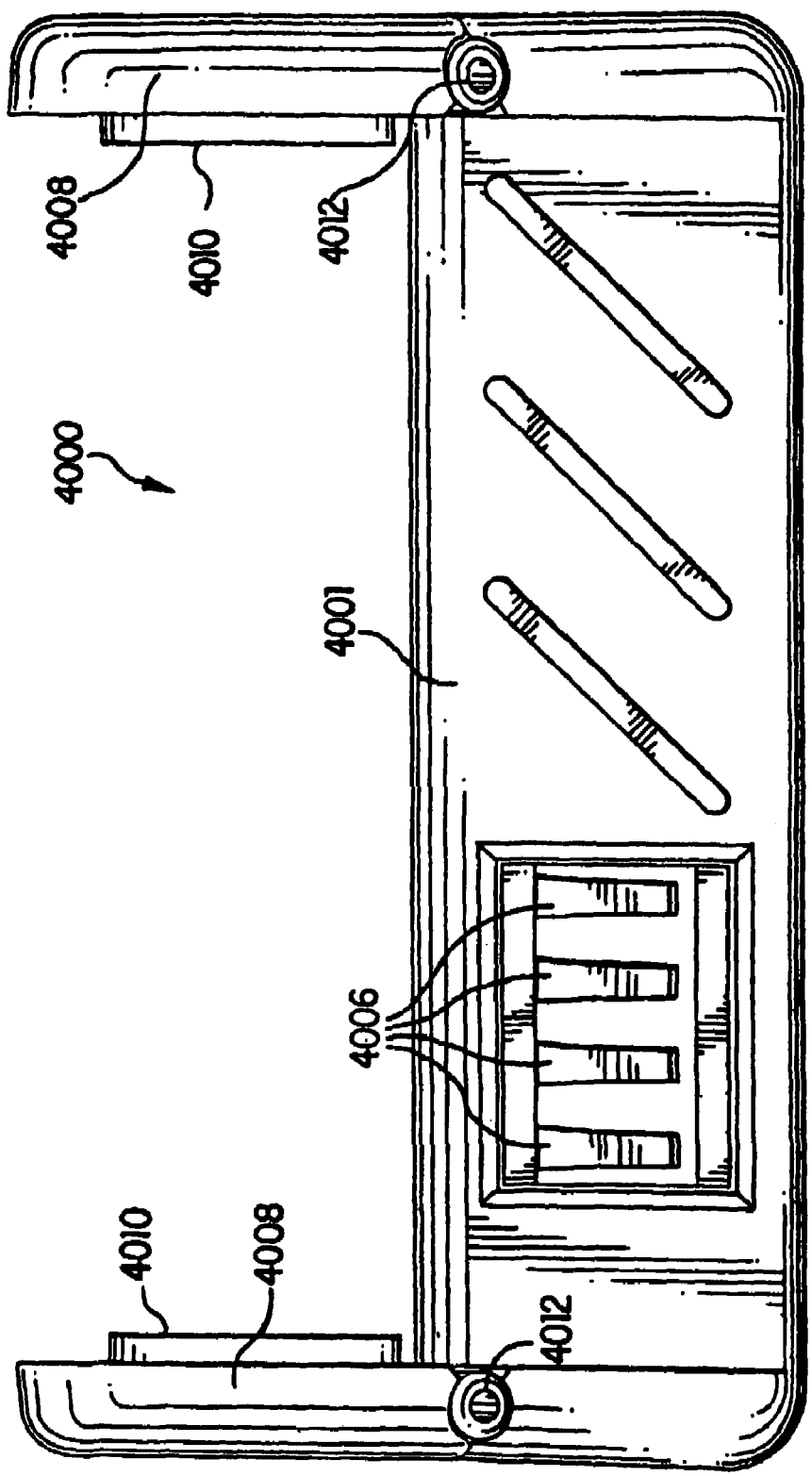
FIG. 48 shows a top perspective view of the adapter connector shown in FIG. 47.
Figure 49:
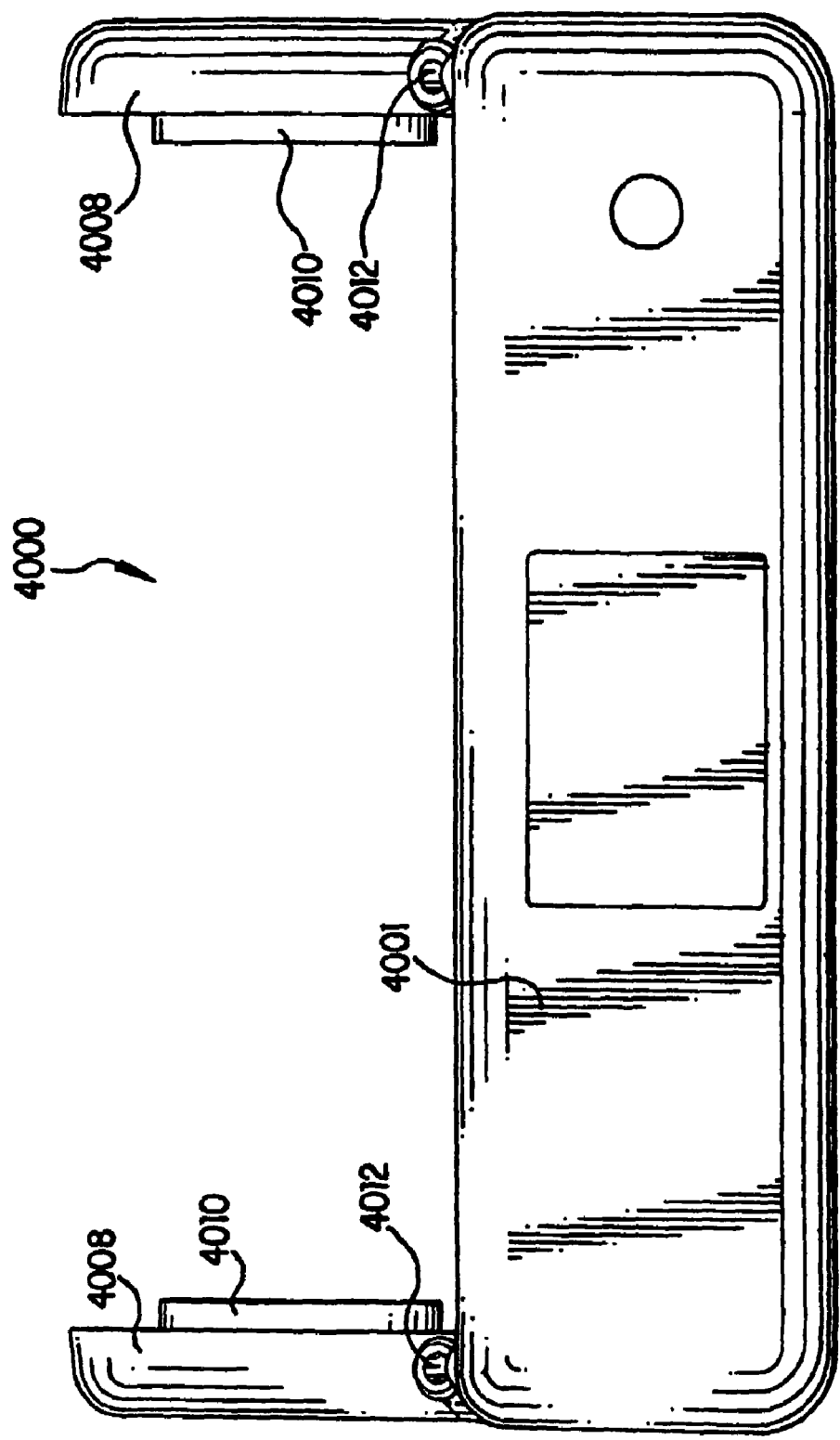
FIG. 49 shows a bottom perspective view of the adapter connector shown in FIG. 47
Figure 50:
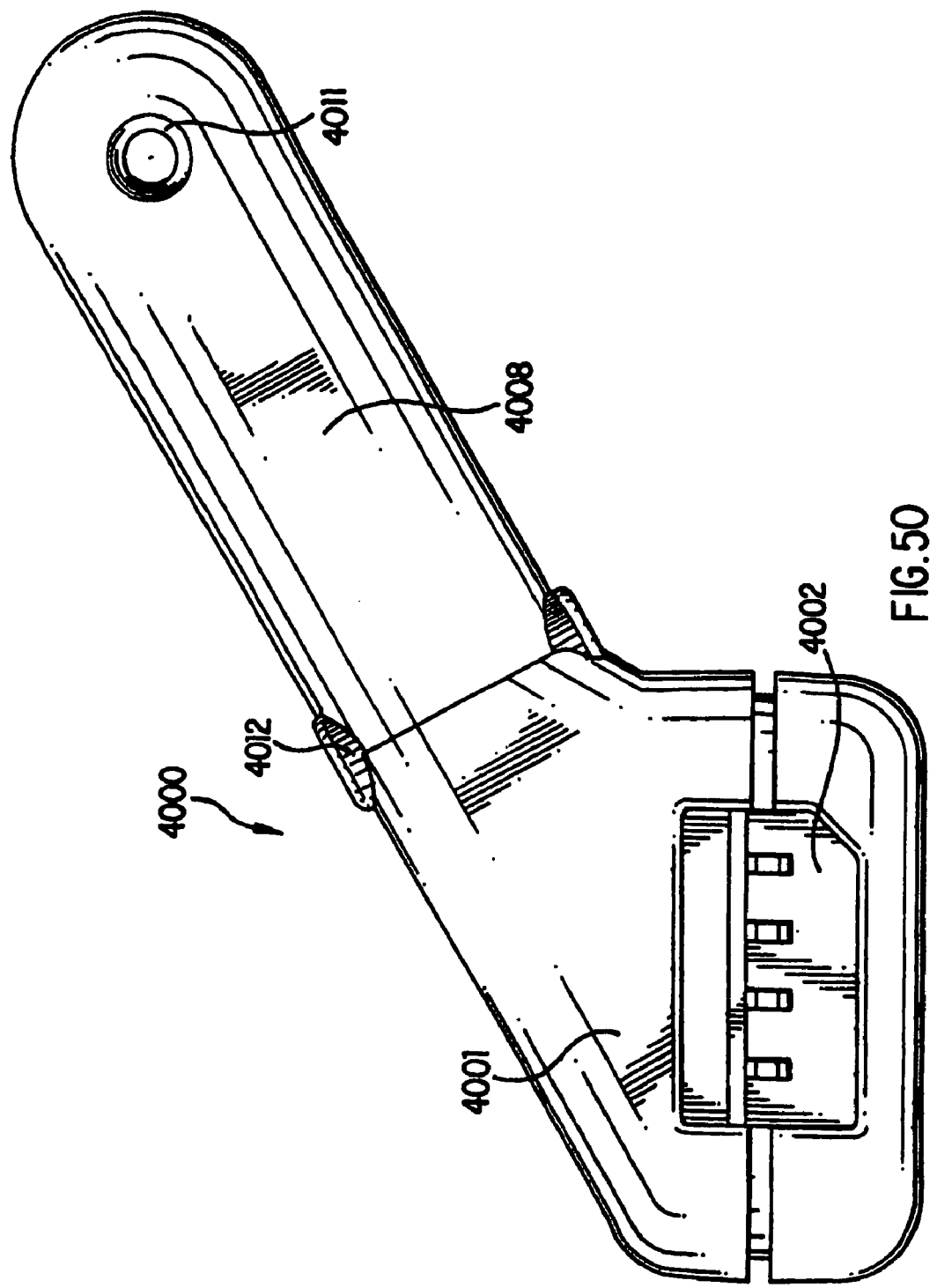
FIG. 50 shows a right side view of the adapter connector shown in FIG. 47.

FIGS. 42-44 show various perspective views of a small form factor power supply 3000 that has been configured for use with portable telephone equipment in accordance with an embodiment of the present invention (note: these drawings are from 3-Dimensional CAD drawings and the many lines in the drawings indicate curves on the small form factor power supply and do not represent surface features). FIGS. 45 and 46 show perspective views of the small form factor power supply 3000 connected to a cellular telephone battery and telephone. The small form factor power supply 3000 is directed to charging portable telephone batteries. It has a housing 3002 similar to that described above and uses the charging circuitry described above. However, in alternative embodiments, different charging topologies may be used, depending on the charging environment, the battery type and the weight requirements of the small form factor power supply. Embodiments of the small form factor power supply can be adapted to work with telephones manufactured by Audiovox, Ericsson/GE, Fujitsu, JRC, Mitsubishi/Daimondtel, Motorola, Murata, NEC, Nokia, Novatel, Oki, Panasonic, Sony, Uniden, AT&T, Tandy, Pioneer, JVC or the like. Also, the small form factor power supply can be used with a wide variety of portable telephone equipment, such as cordless telephones, cellular telephones, radio telephones, PCS telephones and the like.

The housing 3002 of the small form factor power supply 3000 includes a foldable AC plug 3004 that is adapted to plug into a standard electrical socket (not shown) to receive power, from standard lines, that is to be transformed and supplied to an attached device. Alternative embodiments may use different plugs to handle different voltages and/or different country's electrical socket and power configurations. As shown in FIG. 42, the AC plug 3004 folds into a recess 3006 when not being used. The AC plug 3004 is unfolded by engaging and rotating a tab 3008 to rotate the AC plug 3004 out of the recess 3006. In alternative embodiments, the AC plug may be spring loaded and utilize a catch to lock the AC plug in the folded down position and once the catch is released the spring rotates the AC plug into the unfolded position. The AC plug 3004 may include detentes or use other methods to maintain the AC plug 3004 in the folded or unfolded position. Once unfolded, the AC plug 3004 can be inserted into the socket, and the housing 3002 generally hangs down against a wall for stability and support. In alternative embodiments, the AC electric plug may be recessed and fixed in the housing of the small form factor power supply 3000 to receive an electrical cord that is attached between the AC plug and an electric socket.

As shown in FIGS. 42 and 43, a power output 3010 is adapted to fold out and includes a plurality of contacts 3012 that mate with the corresponding contacts (not shown) on a portable telephone equipment battery 3011. In preferred embodiments, the contacts 3012 of the small form factor power supply 3000 are placed in electrical contact with the contacts on the back of the battery 3011. Alternatively, when the battery 3011 is not coupled to portable telephone equipment, the contacts 3012 of the small form factor power supply may be placed in electrical contact with the contacts of the battery 3011 that provide power to the portable telephone equipment. To unfold the power output 3010, the user pushes the power output 3010 through a port 3014 to force the power output 3010 to rotate down about a hinge 3016. The power output 3010 may be spring loaded with a catch, detentes or other methods to lock the power output 3010 in the folded or unfolded position. In alternative embodiments, the small form factor power supply 3000 may use a recessed connector that connects to either the portable telephone equipment or battery using a cable such as described above and below.

The small form factor power supply 3000 also has support legs 3018 that include ends with guide tabs 3020. The guide tabs 3020 are shaped to engage with channels 3021 on the portable telephone equipment battery 3011 to hold the battery 3011 in electrical contact with the small form factor power supply 3000 during charging. The support legs 3018 are also capable of holding a portable telephone connected to the battery 3011, as shown in FIGS. 45 and 46. The support legs 3018 are rotated out when the small form factor power supply 3000 is to be connected to a battery 3011. To attach the small form factor power supply 3000, as shown in FIGS. 45 and 46, the user slides the battery 3011 to engage the channels 3021 of the battery 3011 with the guide tabs 3020 of the support legs 3018. The user then slides the battery 3011 back, until it is stopped and contacts the power output 3010. In preferred embodiments, each of the support legs 3018 rotates independently of the other to simplify manufacturing and reduce complexity of the small form factor power supply 300. However, in alternative embodiments, the support legs 3018 may rotate out together as a unit and/or rotate out when the power output 3010 is rotated.

In preferred embodiments, the small form factor power supply 3000 is capable of charging most telephone equipment batteries in less than 15 minutes. However, the actual charging time will vary based on the size of the battery and the battery chemistry. Most batteries (providing between 1 to 15 hours of high power operation) charge in 5-30 minutes. The small form factor power supply 3000 includes a temperature sensor that is included in the small form factor power supply control chip to charge the battery as described above. This temperature sensor allows the small form factor power supply to determine the proper charging rate for a battery and avoid generating undue heat by overcharging or charging at too high a rate. In further embodiments, the small form factor power supply can be used to power the portable telephone equipment simultaneously with charging of an attached battery. Alternatively, the small form factor power supply may be able to power the portable telephone.

In the embodiment of FIGS. 42-46, the AC plug 3004, the power output 3010, and the support legs 3018 are all designed to be folded in when the small form factor power supply 3000 is not in use. This minimizes the profile of the small form factor power supply when it is not in use and makes it easier to transport. In alternative embodiments, the AC plug, the power output and the support legs may be formed or maintained in the unfolded position, where the smaller profile is not needed or an advantage.

FIG. 47-50 show a perspective and plan views of a small form factor power supply adapter connector 4000 for use with portable telephone equipment in accordance with embodiments of the present invention (note: these: drawings are from 3-Dimensional CAD drawings and the many lines in the drawings indicate curves on the small form factor power supply and do not represent surface features). The adapter connector 4000 has a housing 4001 that includes a connector 4002 configured to mate with the connector 1532 of cable 1530 shown in FIGS. 34(a)-34(c). This adapter connector provides an upgrade path for users that already posses a small form factor power supply, as described above.

As shown in FIGS. 47-50, the adapter connector 4000 includes a plurality of contacts 4006 for connecting with corresponding contacts (not shown) on a portable telephone equipment battery. The housing 4001 may also contain additional circuitry or electronics needed to properly program a small form factor power supply to charge a portable telephone equipment battery.

The adapter connector 4000 includes leg supports 4008 with guide tabs 4010 that engage with channels on a battery (similar to those shown in FIGS. 45 and 46 above). To secure the adapter connector 4000 to a battery, an end clip (not shown) attached to the adapter connector 4000 by elastic straps (not shown), or the like. The elastic straps are threaded through eyelets 4011 so that the adapter connector 4000 can not slip off the battery. In the illustrated embodiment, the leg supports 4008 are foldable about a hinge 4012 to reduce the profile of the adapter connector 4000 when not in use and/or when being transported. In alternative embodiments, the support legs 4008 may be formed in a fixed open position.

The small form factor power supplies described above are capable of charging various different types of batteries, such as NiCad and NiH. However, in alternative embodiments, the small form factor power supplies may charge batteries using Zinc air, Lead acid, alkaline or the like. The power supply may also be used to charge Lithium ion batteries, although a different control chip or circuitry may be required to handle the unique charging requirements of these batteries.

While embodiments of the present invention are directed to a form factor power supply in particular, other embodiments of the present invention are directed more generally to power supplies which are programmable to provide power to any one of a number of electronic devices having differing input power requirements. The embodiment discussed above with reference to FIGS. 7A and 7B includes a power supply which is programmable to provide a power output at a terminal 846 at a suitable operational current or operational voltage associated with the particular electronic device which is to be powered. The appropriate programming signal can then be applied to either terminal 860 or 862 using, for example, an appropriate connector associated with the device to receive power as discussed above with reference to FIGS. 23 through 41.

Figure 51:
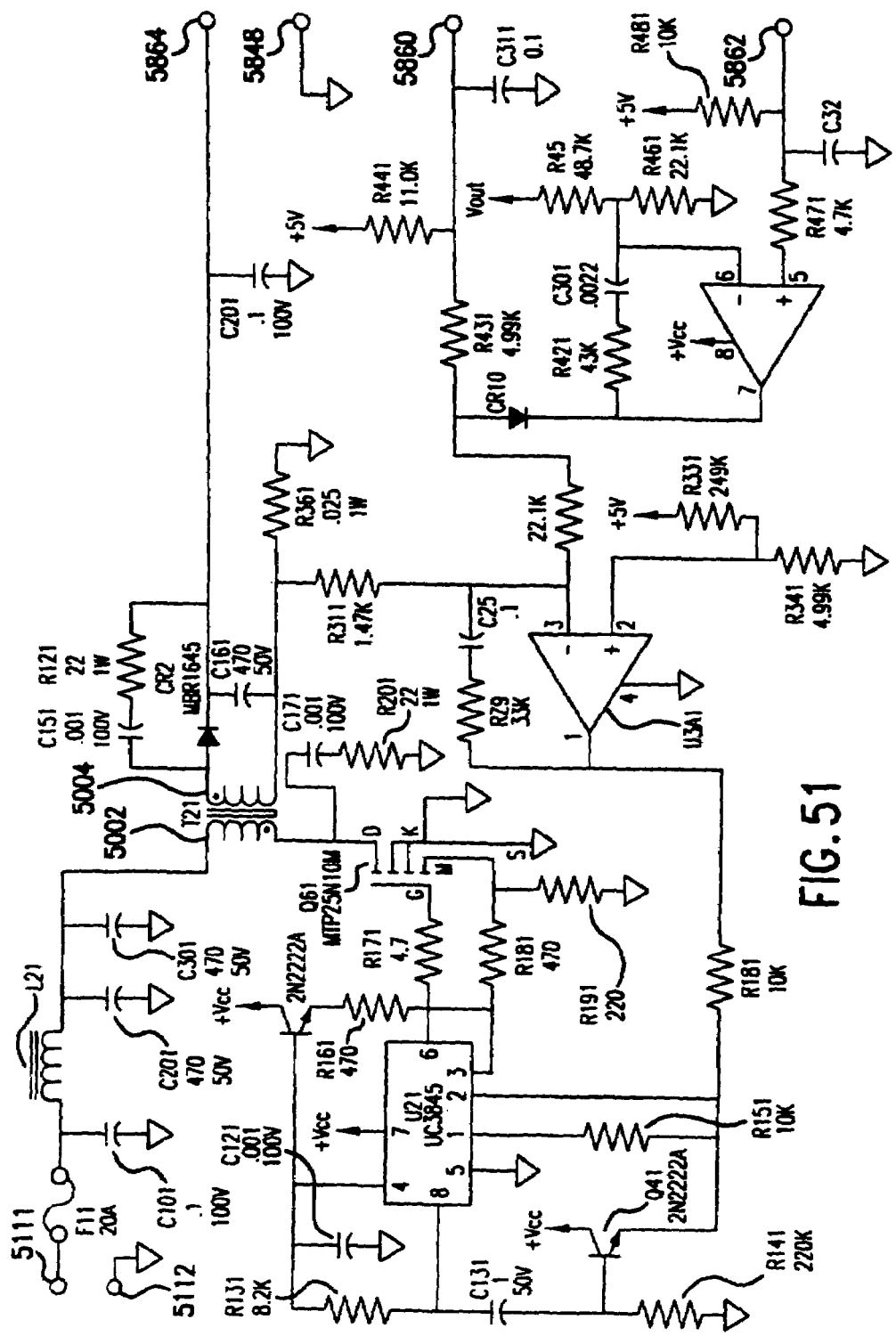
FIG. 51 shows a schematic diagram of an alternative embodiment of a power supply which receives input power from a DC source.

FIG. 51 illustrates a schematic of an alternative embodiment of a programmable power supply 5000 which receives input power from a DC power source and controls the output power using a pulse width modulation technique. Resistances are expressed in ohms and capacitances are expressed in micro farads unless noted otherwise. A DC input source such as a 12 volt automobile cigarette lighter is provided across terminals 5011 and 5012. Other embodiments may be adapted to receive power from other DC sources such as, for example, a DC power source in the passenger compartment of an airplane at different voltages such as 15 volts. The input circuitry of the embodiment shown in FIG. 51 differs from the embodiment shown in FIGS. 7A and 7B by, among other things, replacing the input transformer and full bridge rectifier circuit with a single inductor L21 in a Buck regulator topology.

A transformer T21 includes a primary coil 5002 and a secondary coil 5004. The primary coil 5002 receives current from the inductor L21. This current through the primary coil 5002 induces an output current through the secondary coil 5004 to an output terminal 5864. A switch transistor Q61 controls the current through the primary coil 5002 to affect the output current induced in the secondary coil 5004. An integrated circuit U21 opens and closes the switch transistor Q61 to pulse width modulate the current through the primary coil 5002. The integrated circuit U21 may be an integrated circuit number UC3845 sold by Unitrode. The integrated circuit U21 is preferably configured to provide fixed width pulses at an output pin 6 during which the switch transistor Q61 is closed to provide a pulse of current through the primary coil 5002. The integrated circuit U21 then receives an input signal at a terminal 2 to control the duty cycle of the pulse signal provided at the output pin 6. Accordingly, by increasing or decreasing the duty cycle of the pulse signal provided at the output pin 6, the output current induced in the secondary winding 5004 may be increased or decreased to maintain the output power at terminal 5864 at an appropriate operational voltage or current level. The output current of the secondary coil 5004 is then smoothed by capacitors C161 and C201 to provide a DC power output to the output terminal 5864.

Terminals 5848, 5860, 5862 and 5864 are preferably provided to a connector coupling the power supply 5000 to the electronic device to be powered. In a manner similar to the embodiment discussed above with reference to FIGS. 7A and 7B, the terminal 5860 provides a current control input and the terminal 5862 provides a voltage control input. Connectors, such as those discussed above with reference to FIGS. 23 through 41, may then provide a programming signal to the current control input 5860 or the voltage control input 5862. In response to these inputs, a voltage is applied to a terminal 2 of the integrated circuit U21 to control the duty cycle of the pulse signal output transmitted at output pin 6. The current through the secondary coil 5004 is therefore controlled to provide an operational voltage or operational current at the power output pin 5864.

While the embodiment shown at FIG. 1 is configured to receive a DC power input, this embodiment could be modified to accept an AC power input by, for example, replacing the input circuit having the inductor L21 with an input transformer followed by a full bridge rectifier as illustrated in FIGS. 7A and 7B. Also, the aforementioned small form factor design illustrated with reference to FIGS. 7A through 41 may be modified to accept a DC input by, for example, replacing the input transformer and full bridge rectifier circuit with a single inductor as shown in the embodiment of FIG. 51.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A power supply comprising:
   a terminal for receiving a DC voltage;
   a transformer having a primary winding and a secondary winding;
   a switching circuit coupled between the terminal and the primary winding for providing alternating current to the primary winding;
   a rectifier circuit coupled to the secondary winding to provide a DC output voltage;
   a controller circuit for controlling the switching circuit to modulate the alternating current provided to the primary winding; and
   a circuit which generates an output signal having a magnitude which is a function of the DC output voltage and a selected position of a switch, the switch being operable to selectively couple a component, from among a plurality of components, to an input of the circuit, and the output signal being provided as a feedback signal to the controller circuit to control a magnitude of the DC output voltage.

2. The power supply according to claim 1, wherein the input of the circuit is coupled to a reference voltage via the switch and the component, and a second input of the circuit is coupled to the DC output voltage.

3. The power supply according to claim 1, wherein the switch is settable to one of a plurality of selectable positions and has a connection point corresponding to each of the selectable positions, each connection point being coupled to a corresponding component.

4. The power supply according to claim 3, wherein each of the connection points is coupled to the corresponding component at a first end of the corresponding component, and second ends of the components are coupled to a reference voltage.

5. The power supply according to claim 1, wherein the component is a resistor.

6. The power supply according to claim 1, wherein the DC voltage is provided to the terminal from a DC power source external to the power supply.

7. The power supply according to claim 1, wherein the DC voltage is provided to the terminal from an input circuit internal to the power supply, the input circuit including a rectifier and being coupled to an AC power source external to the power supply.

8. The power supply according to claim 1, wherein the switch is a mechanical switch.

9. The power supply according to claim 1, wherein the switch is an electronic switch.

10. The power supply according to claim 1, including a driver circuit coupled between the controller circuit and the switching circuit, and wherein the circuit is an amplifier.

11. A power supply comprising:
    a .terminal for receiving a DC voltage;
    a transformer having a primary winding and a secondary winding;
    a switching circuit coupled between the terminal and the primary winding for providing alternating current to the primary winding;
    ectifier circuit coupled to the secondary winding to provide a DC output voltage;
    a controller circuit for controlling the switching circuit to modulate the alternating current provided to the primary winding; and
    a circuit which generates an output signal having a magnitude which is a function of the DC output voltage and a selected position of a switch, wherein the switch is not utilized to couple the DC output voltage to a device to be powered by the power supply, and the output signal is provided as a feedback signal to the controller circuit to control a magnitude of the DC output voltage.

12. The power supply of claim 11, wherein the switch is operable to selectively couple a component, from among a plurality of components, to an input of the circuit.

13. The power supply of claim 12, wherein the input of the circuit is coupled to a reference voltage via the switch and a selected component, and a second input of the circuit is coupled to the DC output voltage.

14. The power supply of claim 12, wherein the switch is settable to one of a plurality of selectable positions and has a connection point corresponding to each of the selectable positions, each connection point being coupled to a corresponding component.

15. The power supply of claim 14, wherein each connection point is coupled to the corresponding component at a first end of the corresponding component, and second ends of the components are coupled to a reference voltage.

16. The power supply of claim 12, wherein the component is a resistor.

17. The power supply of claim 11, wherein the DC voltage is provided to the terminal from a DC power source external to the power supply.

18. The power supply according to claim 11, wherein the DC voltage is provided to the terminal from an input circuit internal to power supply, the input circuit including a rectifier and being coupled to an AC power source external to the power supply.

19. The power supply according to claim 11, wherein the switch is a mechanical switch.

20. The power supply according to claim 11, wherein the switch is an electronic switch.

21. The power supply according to claim 11, including a driver circuit coupled between the controller and the switching circuit, and wherein the circuit is an amplifier.

* * * * *

UNITED STATES PATENT AND TRADEMARK OFFICE
CERTIFICATE OF CORRECTION

PATENT NO. : 7,450,403 B2  Page 1 of 1
APPLICATION NO. : 11/891187
DATED : November 11, 2008
INVENTOR(S) : Thomas W. Lanni It is certified that error appears in the above-identified patent and that said Letters Patent is hereby corrected as shown below:

Column 26, line 23
  replace "ectifier"
  with --a rectifier--.

Signed and Sealed this

Third Day of March, 2009

JOHN DOLL
*Acting Director of the United States Patent and Trademark Office*